(12) United States Patent
Woods et al.

(10) Patent No.: US 12,619,937 B1
(45) Date of Patent: May 5, 2026

(54) APPARATUS AND METHOD FOR DIRECTED GRAPH MODIFICATION AND SIMULATION BASED ON EXTERNAL DATA

(71) Applicant: AI Leadership Labs, LLC, Austin, TX (US)

(72) Inventors: Geoff Woods, Austin, TX (US); Randall Joseph Ottinger, Bellevue, WA (US)

(73) Assignee: AI Leadership Labs, LLC, Austin, TX (US)

(*) Notice: Subject to any disclaimer, the term of this patent is extended or adjusted under 35 U.S.C. 154(b) by 0 days.

(21) Appl. No.: 19/305,941

(22) Filed: Aug. 21, 2025

(51) Int. Cl.
*G06Q 10/0637* (2023.01)
*G06F 30/20* (2020.01)
*G06N 3/044* (2023.01)

(52) U.S. Cl.
CPC ......... *G06Q 10/0637* (2013.01); *G06N 3/044* (2023.01); *G06F 30/20* (2020.01)

(58) Field of Classification Search
CPC ..... G06Q 10/0637; G06N 3/044; G06F 30/20
See application file for complete search history.

(56) References Cited

U.S. PATENT DOCUMENTS

| | | | | |
|---|---|---|---|---|
| 11,334,947 | B1* | 5/2022 | Fellowes | .......... G06Q 10/06312 |
| 2023/0196235 | A1 | 6/2023 | Turan et al. | |
| 2023/0402136 | A1* | 12/2023 | Zheng | ....................... G06N 5/04 |
| 2024/0257021 | A1* | 8/2024 | Todd | .................. G06Q 10/0639 |
| 2024/0346339 | A1* | 10/2024 | Shtok | ..................... G06N 5/022 |
| 2025/0077670 | A1* | 3/2025 | Wang | .................... G06F 21/566 |
| 2025/0111157 | A1* | 4/2025 | Tennenholtz | ........ G06N 3/0455 |
| 2025/0285012 | A1* | 9/2025 | Blair | ...................... G06N 20/00 |
| 2025/0315720 | A1* | 10/2025 | Dande | .................... G06N 20/00 |

FOREIGN PATENT DOCUMENTS

| | | |
|---|---|---|
| IN | 202411104184 A | 1/2025 |
| IN | 202541013540 A | 2/2025 |
| IN | 202511028315 A | 4/2025 |

OTHER PUBLICATIONS

Thost, V. & Chen, J. "Directed Acyclic Graph Neural Networks" arXiv:2101.07965v3, ICLR (2021) (Year: 2021).*
Zhang, M., et al. "D-VAE: A Variational Autoencoder for Directed Acyclic Graphs" 33rd Conf. on Neural Information Processing Sys., NeurIPS (2019) (Year: 2019).*
Luo, Y., et al. "Transformers over Directed Acyclic Graphs" 37th Conf. on Neural Information Processing Sys., NeurIPS (2023) (Year: 2023).*

* cited by examiner

*Primary Examiner* — Jay Hann
(74) *Attorney, Agent, or Firm* — Caldwell LLC

(57) ABSTRACT

An apparatus and method for directed graph modification and simulation based on external data are disclosed. The apparatus includes at least a processor, and a memory communicatively connected to the at least a processor, wherein the memory contains instructions configuring the at least a processor to receive external data from one or more external data sources, retrieve a directed graph including at least two internal nodes and at least one internal directed edge, wherein each internal node represents internal data and the at least one internal directed edge represents a relationship between the at least two internal nodes, generate a data extrapolation of the external data as a function of at least a part of the at least two internal nodes and the at least one internal directed edge, and modify the directed graph as a function of the data extrapolation.

20 Claims, 9 Drawing Sheets

APPARATUS AND METHOD FOR DIRECTED GRAPH MODIFICATION AND SIMULATION BASED ON EXTERNAL DATA

FIELD OF THE INVENTION

The present invention generally relates to the field of directed graph modification and simulation. In particular, the present invention is directed to an apparatus and method for directed graph modification and simulation based on external data.

BACKGROUND

Directed graphs are widely used data structures for modeling relationships between entities. While traditional directed graphs are typically constructed from static datasets, there is growing interest in systems that allow directed graphs to evolve over time in response to new data. However, existing systems lack technical mechanisms for dynamically modifying directed graphs in real time based on continuous inflows of heterogeneous data, specifically structured and unstructured data originating from multiple, independent, and often inconsistent external sources. Traditional directed graph systems are typically constructed from curated, static datasets in which the relationships between nodes are predefined and infrequently altered. These systems do not support automatic incorporation of external signals in a way that maintains coherence, semantic relevance, and data fidelity across a continuously evolving graph structure. Furthermore, existing systems do not provide mechanisms for deduplication that operate in real time while preserving relevance. Deduplication of streaming data is technically complex due to the need for fast, in-memory comparison of incoming data elements against a dynamically updating repository of recently processed signals. This must be done without introducing latency or false positives that could lead to incorrect suppression of valid but novel data. Accordingly, there exists a need for a technical improvement of dynamically modifying directed graph data structures in real time using heterogeneous external data sources.

SUMMARY OF THE DISCLOSURE

In some aspects, the techniques described herein relate to an apparatus for directed graph modification and simulation based on external data, the apparatus including at least a processor, and a memory communicatively connected to the at least a processor, wherein the memory contains instructions configuring the at least a processor to receive external data from one or more external data sources, wherein the external data includes structured and unstructured data, retrieve a directed graph including at least two internal nodes and at least one internal directed edge, wherein each internal node represents internal data and the at least one internal directed edge represents a relationship between the at least two internal nodes, generate a data extrapolation of the external data as a function of at least a part of the at least two internal nodes and the at least one internal directed edge, modify the directed graph as a function of the data extrapolation, wherein modifying the directed graph includes generating at least one external node representing the external data, and generating at least one external directed edge connecting the at least one external node and at least one of the at least two internal nodes as a function of the data extrapolation, simulate a plurality of sequential actions as a function of the modified directed graph, wherein simulating the plurality of sequential actions includes identifying an action among the plurality of sequential actions that has a highest function score within the modified directed graph based on a simulated outcome of the plurality of sequential actions, and generate a user interface including the modified directed graph and the action that has the highest function score.

In some aspects, the techniques described herein relate to a method for directed graph modification and simulation based on external data, the method including receiving, using at least a processor, external data from one or more external data sources, wherein the external data includes structured and unstructured data, retrieving, using the at least a processor, a directed graph including at least two internal nodes and at least one internal directed edge, wherein each internal node represents internal data and the at least one internal directed edge represents a relationship between the at least two internal nodes, generating, using the at least a processor, a data extrapolation of the external data as a function of at least a part of the at least two internal nodes and the at least one internal directed edge, modifying, using the at least a processor, the directed graph as a function of the data extrapolation, wherein modifying the directed graph includes generating at least one external node representing the external data, and generating at least one external directed edge connecting the at least one external node and at least one of the at least two internal nodes as a function of the data extrapolation, simulating, using the at least a processor, a plurality of sequential actions as a function of the data extrapolation and the modified directed graph, wherein simulating the plurality of sequential actions includes identifying an action among the plurality of sequential actions that has a highest function score on the directed graph based on a simulated outcome of the plurality of sequential actions, and generating, using the at least a processor, a user interface including the action that has the highest function score.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

Figure 1:
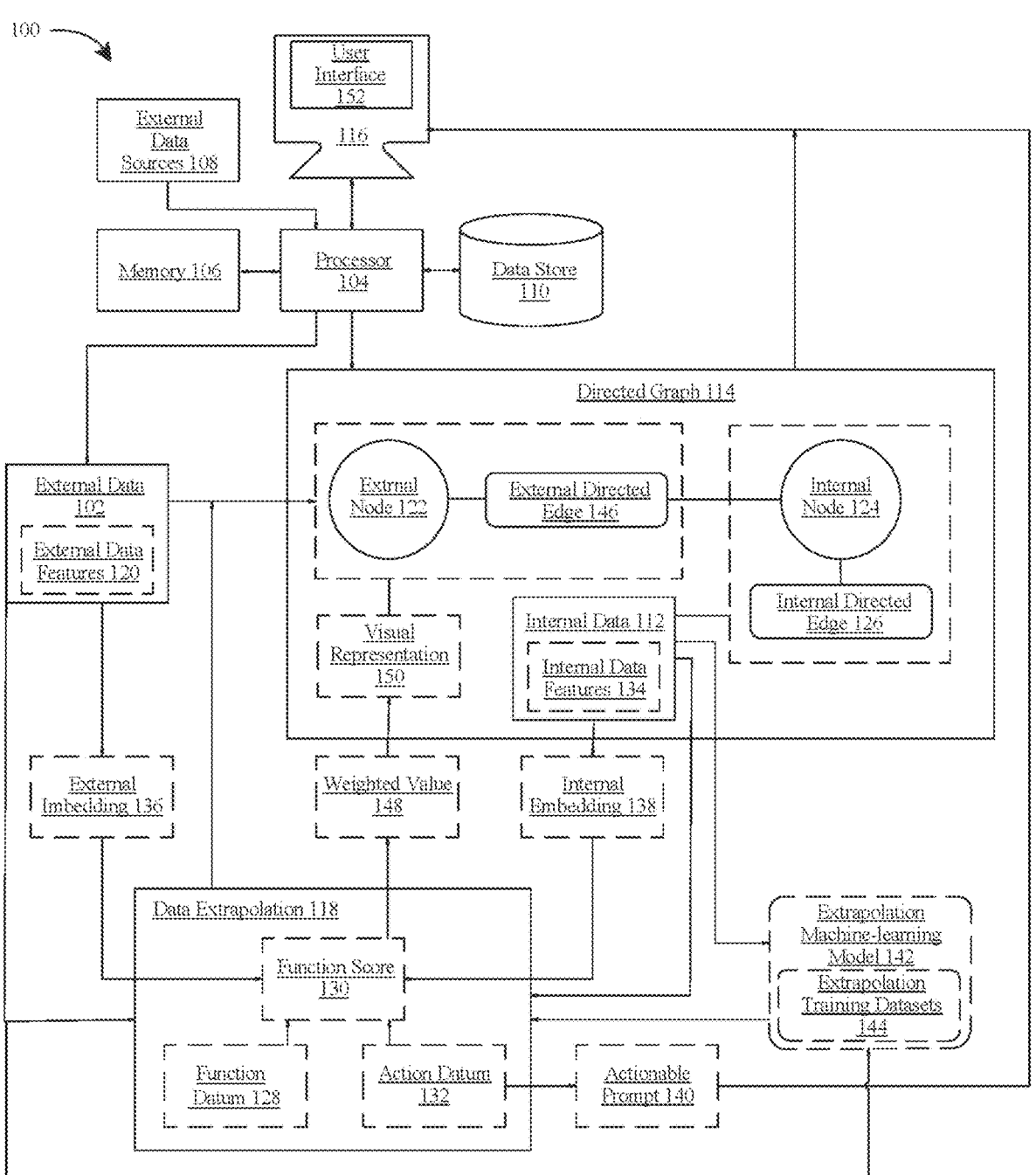
FIG. 1 illustrates a block diagram of an exemplary apparatus for directed graph modification and simulation based on external data.

The drawings are not necessarily to scale and may be illustrated by phantom lines, diagrammatic representations and fragmentary views. In certain instances, details that are not necessary for an understanding of the embodiments or that render other details difficult to perceive may have been omitted.

DETAILED DESCRIPTION

At a high level, aspects of the present disclosure are directed to apparatuses and methods for directed graph modification and simulation based on external data. The apparatus includes at least a processor, and a memory communicatively connected to the at least a processor, wherein the memory contains instructions configuring the at least a processor to receive external data from one or more external data sources, wherein the external data includes structured and unstructured data, retrieve a directed graph including at least two internal nodes and at least one internal directed edge, wherein each internal node represents internal data and the at least one internal directed edge represents a relationship between the at least two internal nodes, generate a data extrapolation of the external data as a function of at least a part of the at least two internal nodes and the at least one internal directed edge, modify the directed graph as a function of the data extrapolation, wherein modifying the directed graph includes generating at least one external node representing the external data, and generating at least one external directed edge connecting the at least one external node and at least one of the at least two internal nodes as a function of the data extrapolation, simulate a plurality of sequential actions as a function of the modified directed graph, wherein simulating the plurality of sequential actions includes identifying an action among the plurality of sequential actions that has a highest function score within the modified directed graph based on a simulated outcome of the plurality of sequential actions, and generate a user interface including the modified directed graph and the action that has the highest function score.

The disclosed apparatus provides real-time, actionable insights that are contextually aligned with a company's internal strategy by continuously analyzing and integrating external data into a dynamically maintained directed graph. Through proprietary signal mapping, scoring mechanisms, and impact evaluation models, the system reduces informational noise and false positives, ensuring that only the most relevant signals influence strategic awareness. By surfacing high-leverage actions and generating context-aware questions, the apparatus supports executive-level decision-making and facilitates rapid, data-driven responses to external developments. Furthermore, the integration of scenario simulation capabilities enables forward-looking strategy planning, allowing users to model hypothetical conditions and assess the potential outcomes of strategic decisions before execution. This combination of targeted insight generation and interactive forecasting allows for proactive and intelligent management of evolving competitive and market environments.

Aspects of the present disclosure can be used to provide real-time, actionable insights aligned with company strategy, reduce noise and false positives through proprietary signal mapping and scoring and surface high-leverage actions and questions for executives.

Aspects of the present disclosure allow for proactive, data-driven strategic decision-making and scenario simulation for forward-looking strategy planning.

Exemplary embodiments illustrating aspects of the present disclosure are described below in the context of several specific examples.

Referring now to FIG. 1, an exemplary embodiment of apparatus 100 for directed graph modification and simulation based on external data 102 is illustrated. The external data 102 is described in detail below. Apparatus 100 may include circuitry such as without limitation a processor 104 communicatively connected to a memory 106; for instance, circuitry may include and/or be included in a computing device. Processor 104 may include any computing device as described in this disclosure, including without limitation a microcontroller, microprocessor, digital signal processor (DSP) and/or system on a chip (SoC) as described in this disclosure. Processor 104 may include, be included in, and/or communicate with a mobile device such as a mobile telephone or smartphone. Processor 104 may include a single computing device operating independently, or may include two or more computing device operating in concert, in parallel, sequentially or the like; two or more computing devices may be included together in a single computing device or in two or more computing devices. Processor 104 may interface or communicate with one or more additional devices as described below in further detail via a network interface device. Network interface device may be utilized for connecting processor 104 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Processor 104 may include but is not limited to, for example, a computing device or cluster of computing devices in a first location and a second computing device or cluster of computing devices in a second location. Processor 104 may include one or more computing devices dedicated to data storage, security, distribution of traffic for load balancing, and the like. Processor 104 may distribute one or more computing tasks as described below across a plurality of computing devices of computing device, which may operate in parallel, in series, redundantly, or in any other manner used for distribution of tasks or memory between computing devices. Processor 104 may be implemented, as a non-limiting example, using a "shared nothing" architecture.

With continued reference to FIG. 1, as used in this disclosure, "communicatively connected" means connected by way of a connection, attachment, or linkage between two or more relata such as without limitation electronic components, modules, and/or devices which allows for reception and/or transmittance of information therebetween. For example, and without limitation, this connection may be wired or wireless, direct or indirect, and between two or more components, circuits, devices, systems, and the like, which allows for reception and/or transmittance of data and/or signal(s) therebetween. Data and/or signals there between may include, without limitation, electrical, electromagnetic, magnetic, video, audio, radio and microwave data and/or signals, combinations thereof, and the like, among others. A communicative connection may be achieved, for example and without limitation, through wired or wireless electronic, digital or analog, communication, either directly or by way of one or more intervening devices or components. Further, communicative connection may include electrically coupling or connecting at least an output of one device, component, or circuit to at least an input of another device, component, or circuit. For example, and without limitation, via a bus or other facility for intercommunication between elements of a computing device. Communicative connecting may also include indirect connections via, for example and without limitation, wireless connection, radio communication, low power wide area network, optical communication, magnetic, capacitive, or optical coupling, and the like. In some instances, the terminology "communicatively coupled" may be used in place of communicatively connected in this disclosure.

With continued reference to FIG. 1, circuitry may alternatively or additionally be implemented by configuring a hardware device such as a combinatorial or sequential logic circuit, an application-specific integrated circuit (ASIC), a field-programmable gate array (FPGA), or other hardware unit; memory may be attached thereto to further configure the hardware unit using read-only memory (ROM) or any other static or writable memory as described in this disclosure. Alternatively or additionally, hardware units and/or modules may be combined with and/or in communication with a processor, such as without limitation in a system-on-chip architecture wherein some functions are configured by modification or design of hardware circuitry, such as without limitation FPGA circuitry, while others are configured in the form of instructions in memory for one or more processors. As a non-limiting example, any step or combination of steps described herein may be performed entirely using hardware circuit configured to perform such steps either with static memory or rewritable memory. Such steps or combinations of steps may include signing with a digital signature, cryptographically hashing, evaluation of zero-knowledge proofs, or any other specific process described in this disclosure.

With continued reference to FIG. 1, processor 104 may be designed and/or configured to perform any method, method step, or sequence of method steps in any embodiment described in this disclosure, in any order and with any degree of repetition. For instance, processor 104 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Processor 104 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

With continued reference to FIG. 1, memory 106 contains instructions configuring processor 104 to receive external data 102 from one or more external data sources 108. For the purposes of this disclosure, "external data" is any information originating from external data sources. In some cases, external data 102 may include structured or unstructured content. In some cases, external data 102 may include text, image, audio, video, and the like. As a non-limiting example, external data 102 may include facts, events, statements, or metadata associated with entities, behaviors, or changes in external environment that are potentially relevant to a strategic context of a user or user's company. In some cases, external data 102 may include a specific fact, event, attribute, or semantic concept associated with an entity, activity, or trend occurring outside a user's organization. As a non-limiting example, external data 102 may include a competitor's product launch date, a change in regulatory policy, a market entry announcement, a pricing adjustment, an executive leadership change, or a reported financial metric. As another non-limiting example, external data 102 may include information about a competitor, such as press releases, financial filings, news articles, patent publications, job postings, product announcements, customer reviews, or analyst reports. For the purposes of this disclosure, a "competitor" is any external entity, organization, business, or individual operating in a market, domain, or sector that overlaps with a user or user's company. For example, and without limitation, external data 102 may include a press release issued by a competitor announcing the launch of a new product line in a market segment that overlaps with a user company's strategic focus.

With continued reference to FIG. 1, external data 102 includes structured and unstructured data. For the purposes of this disclosure, "structured data" is information that is organized in a predefined schema or tabular format. In some cases, structured data may include information that is organized in relational database entries, spreadsheets, CSV files, application processing interface (API) responses with fixed fields, or machine-readable formats where attributes and values are explicitly defined. As a non-limiting example, structured data may include financial filings, industry benchmarks, or structured competitor product specifications retrieved via APIs. For the purposes of this disclosure, "unstructured data" is data that does not follow a pre-defined data model or structure. In some cases, unstructured data may include natural language text, images, audio recordings, video streams, or freeform documents such as news articles, social media posts, analyst commentary, and public transcripts. In some cases, unstructured data may require pre-processing to extract meaningful content or features before it can be integrated with structured datasets. In some embodiments, processor 104 may be configured to apply one or more data processing modules, such as a language processing module, computer vision module, or speech recognition module, to identify relevant content within the unstructured data and convert that content into a structured form as described in detail below. In some embodiments, processor 104 may be configured to combine structured and pre-processed or processed unstructured data into a unified dataset. In some cases, processor 104 may be configured to map unstructured data features to structured schemas, align extracted text entities to known internal data categories, or associating time-stamped unstructured events with structured timeline datasets. In some cases, processor 104 may further normalize the integrated dataset to ensure consistency of terminology, data types, and categorical labels.

With continued reference to FIG. 1, for the purposes of this disclosure, a "user" is an individual, group, or organizational entity that interacts with an apparatus 100. As a non-limiting example, a user may include executives, analysts, decision-makers, product managers, strategists, or automated systems operating on behalf of such individuals or entities.

With continued reference to FIG. 1, for the purposes of this disclosure, "external data sources" are any systems, platforms, services, or repositories that reside outside the core architecture of an apparatus 100. As a non-limiting example, external data sources 108 may include publicly available platforms such as financial news websites, regulatory and government databases, industry reports, third-party market intelligence platforms, competitor websites, patent publication services, social media channels, news feeds, and subscription-based data services.

With continued reference to FIG. 1, in some embodiments, processor 104 may receive external data 102 from a data store 110. In some cases, external data source 108 may include data store 110. As used in this disclosure, a "data store" is a data structure configured to store data associated with a directed graph. As a non-limiting example, data store 110 may store external data 102, internal data 112, directed graph 114, and the like. In one or more embodiments, data store 110 may include inputted or calculated information and datum related to a directed graph 114. In some embodiments, a datum history may be stored in data store 110. As a non-limiting example, the datum history may include real-time and/or previous inputted data related to a directed graph 114. As a non-limiting example, data store 110 may include instructions from a user, who may be an expert user, a past user in embodiments disclosed herein, or the like, where the instructions may include examples of the data related to directed graph 114.

With continued reference to FIG. 1, in some embodiments, processor 104 may be communicatively connected with data store 110. For example, and without limitation, in some cases, data store 110 may be local to processor 104. In another example, and without limitation, data store 110 may be remote to processor 104 and communicative with processor 104 by way of one or more networks. The network may include, but is not limited to, a cloud network, a mesh network, and the like. By way of example, a "cloud-based" system can refer to a system which includes software and/or data which is stored, managed, and/or processed on a network of remote servers hosted in the "cloud," e.g., via the Internet, rather than on local severs or personal computers. A "mesh network" as used in this disclosure is a local network topology in which the infrastructure processor 104 connects directly, dynamically, and non-hierarchically to as many other computing devices as possible. A "network topology" as used in this disclosure is an arrangement of elements of a communication network.

With continued reference to FIG. 1, in some embodiments, data store 110 may be implemented, without limitation, as a relational database, a key-value retrieval database such as a NOSQL database, or any other format or structure for use as a database that a person skilled in the art would recognize as suitable upon review of the entirety of this disclosure. Database may alternatively or additionally be implemented using a distributed data storage protocol and/or data structure, such as a distributed hash table or the like. Database may include a plurality of data entries and/or records as described above. Data entries in a database may be flagged with or linked to one or more additional elements of information, which may be reflected in data entry cells and/or in linked tables such as tables related by one or more indices in a relational database. Persons skilled in the art, upon reviewing the entirety of this disclosure, will be aware of various ways in which data entries in a database may store, retrieve, organize, and/or reflect data and/or records as used herein, as well as categories and/or populations of data consistently with this disclosure.

With continued reference to FIG. 1, in some embodiments, external data 102 may be derived from a web crawler. A "web crawler," as used herein, is a program that systematically browses the internet for the purpose of Web indexing. The web crawler may be seeded with platform URLs, wherein the crawler may then visit the next related URL, retrieve the content, index the content, and/or measures the relevance of the content to the topic of interest. In some embodiments, processor 104 may generate web crawler to scrape external data 102 from a competitor's website. The web crawler may be seeded and/or trained with a reputable website to begin the search. Web crawler may be generated by processor 104. In some embodiments, web crawler may be trained with information received from user through a user interface. In some embodiments, web crawler may be configured to generate a web query. A web query may include search criteria received from user. For example, user may submit a plurality of websites for web crawler to search to external data 102. Additionally, web crawler function may be configured to search for and/or detect one or more data patterns. A "data pattern" as used in this disclosure is any repeating forms of information. In some embodiments, web crawler may be configured to determine the relevancy of a data pattern. Relevancy may be determined by a relevancy score. A relevancy score may be automatically generated by processor 104, received from a machine learning model, and/or received from user. In some embodiments, a relevancy score may include a range of numerical values that may correspond to a relevancy strength of data received from a web crawler function. As a non-limiting example, a web crawler function may search the Internet for external data 102. In some embodiments, processor 104 may generate web crawler to scrape external data 102 from web sources (external data source 108). For the purposes of this disclosure, a "web source" is any internet-based location or online resource that hosts or provides access to data. A web source may include, but is not limited to, websites, web pages, online databases, public or private application programming interfaces (APIs), social media platforms, forums, blogs, and news websites. In some embodiments, processor 104 may retrieve external data 102 from web sources using a web crawler.

With continued reference to FIG. 1, in some embodiments, processor 104 may receive external data 102 from a downstream device 116. For the purposes of this disclosure, a "downstream device" is a device, system or endpoint capable of receiving data transmitted by a processor 104. As a non-limiting example, downstream device 116 may include smartphones, tablets, desktop computers, laptop computers, smartwatches, messaging clients, calendar interfaces, or any endpoint system. In some cases, downstream device 116 may include a user device. For the purposes of this disclosure, a "user device" is any device a user use to input data. As a non-limiting example, user device may include a laptop, desktop, tablet, mobile phone, smart phone, smart watch, kiosk, screen, smart headset, or things of the like. In some embodiments, user device may include an interface configured to receive inputs from a user. In some embodiments, a user may manually input any data into apparatus 100 using user device. In some embodiments, a user may have a capability to process, store or transmit any information independently.

With continued reference to FIG. 1, in some cases, receiving external data 102 and/or generating data extrapolation 118 may include identifying one or more external data features 120 of the external data 102 using a language processing module. The data extrapolation 118 is further described in detail below. For the purposes of this disclosure, "external data features" are one or more characteristics of external data. In some cases, external data features 120 may include keywords. As a non-limiting example, external data features 120 may include named entities, domain-specific terms, temporal references, geographic locations, or technical specifications. For example, and without limitation, external data feature 120 may include keywords including company names, product names, executive titles, and the like. For example, and without limitation, external data feature 120 may include keywords including "product launch," "market entry," "price reduction," "patent granted," and the like. In some cases, external data features 120 may be stored in data store 110 and processor 104 may retrieve external data features 120 from data store 110. In some cases, user may manually input external data features 120.

With continued reference to FIG. 1, in some embodiments, processor 104 may use a language processing module to find an external data feature 120. For the purposes of this disclosure, a "language processing module" is a software or system analyzes, interprets, and extracts information from textual data. The language processing module may be configured to extract, from external data 102, one or more external data features 120. One or more external data features 120 may include, without limitation, strings of one or more characters, including without limitation any sequence or sequences of letters, numbers, punctuation, diacritic marks, symbols, spaces, whitespace, and the like. Textual data may be parsed into tokens, which may include a simple word (sequence of letters separated by whitespace) or more generally a sequence of characters as described previously. The term "token," as used herein, refers to any smaller, individual groupings of text from a larger source of text; tokens may be broken up by word, pair of words, sentence, or other delimitation. These tokens may in turn be parsed in various ways. Textual data may be parsed into words or sequences of words, which may be considered words as well. Textual data may be parsed into "n-grams," where all sequences of n consecutive characters are considered. Any or all possible sequences of tokens or words may be stored as "chains," for example for use as a Markov chain or Hidden Markov Model.

With continued reference to FIG. 1, language processing module may operate to produce a language processing model. Language processing model may include a program automatically generated by processor 104 and/or language processing module to produce associations between one or more words extracted from at least a document and detect associations, including without limitation mathematical associations, between such words. Associations between language elements, where language elements include for purposes herein extracted words, relationships of such categories to other such term may include, without limitation, mathematical associations, including without limitation statistical correlations between any language element and any other language element and/or language elements. Statistical correlations and/or mathematical associations may include probabilistic formulas or relationships indicating, for instance, a likelihood that a given extracted word indicates a given category of semantic meaning. As a further example, statistical correlations and/or mathematical associations may include probabilistic formulas or relationships indicating a positive and/or negative association between at least an extracted word and/or a given semantic meaning; positive or negative indication may include an indication that a given document is or is not indicating a category semantic meaning. Whether a phrase, sentence, word, or other textual element in a document or corpus of documents constitutes a positive or negative indicator may be determined, in an embodiment, by mathematical associations between detected words, comparisons to phrases and/or words indicating positive and/or negative indicators that are stored in memory at computing device, or the like.

With continued reference to FIG. 1, language processing module may generate the language processing model by any suitable method, including without limitation a natural language processing classification algorithm; language processing model may include a natural language process classification model that enumerates and/or derives statistical relationships between input terms and output terms. Algorithm to generate language processing model may include a stochastic gradient descent algorithm, which may include a method that iteratively optimizes an objective function, such as an objective function representing a statistical estimation of relationships between terms, including relationships between input terms and output terms, in the form of a sum of relationships to be estimated. In an alternative or additional approach, sequential tokens may be modeled as chains, serving as the observations in a Hidden Markov Model (HMM). HMMs, as used herein, are statistical models with inference algorithms that that may be applied to the models. In such models, a hidden state to be estimated may include an association between an extracted words, phrases, and/or other semantic units. There may be a finite number of categories to which an extracted word may pertain; an HMM inference algorithm, such as the forward-backward algorithm or the Viterbi algorithm, may be used to estimate the most likely discrete state given a word or sequence of words. Language processing module may combine two or more approaches. For instance, and without limitation, machine-learning program may use a combination of Naive-Bayes (NB), Stochastic Gradient Descent (SGD), and parameter grid-searching classification techniques; the result may include a classification algorithm that returns ranked associations.

With continued reference to FIG. 1, generating language processing model may include generating a vector space, which may be a collection of vectors, defined as a set of mathematical objects that can be added together under an operation of addition following properties of associativity, commutativity, existence of an identity element, and existence of an inverse element for each vector, and can be multiplied by scalar values under an operation of scalar multiplication compatible with field multiplication, and that has an identity element is distributive with respect to vector addition, and is distributive with respect to field addition. Each vector in an n-dimensional vector space may be represented by an n-tuple of numerical values. Each unique extracted word and/or language element as described above may be represented by a vector of the vector space. In an embodiment, each unique extracted and/or other language element may be represented by a dimension of vector space; as a non-limiting example, each element of a vector may include a number representing an enumeration of co-occurrences of the word and/or language element represented by the vector with another word and/or language element. Vectors may be normalized, scaled according to relative frequencies of appearance and/or file sizes. In an embodiment associating language elements to one another as described above may include computing a degree of vector similarity between a vector representing each language element and a vector representing another language element; vector similarity may be measured according to any norm for proximity and/or similarity of two vectors, including without limitation cosine similarity, which measures the similarity of two vectors by evaluating the cosine of the angle between the vectors, which can be computed using a dot product of the two vectors divided by the lengths of the two vectors. Degree of similarity may include any other geometric measure of distance between vectors.

With continued reference to FIG. 1, language processing module may use a corpus of documents to generate associations between language elements in a language processing module may then use such associations to analyze words extracted from external data 102 and determine that the external data 102 indicate significance or relevance of a category. In an embodiment, language module and/or processor 104 may perform this analysis using a selected set of significant or relevant external data 102, such as external data 102 identified by one or more experts or users as representing good or relevant information; experts may identify or enter such external data 102 via graphical user interface or may communicate identities of significant or relevant external data 102 according to any other suitable method of electronic communication, or by providing such identity to other persons who may enter such identifications into processor 104. Documents may be entered into a computing device by being uploaded by an expert or other persons using, without limitation, file transfer protocol (FTP) or other suitable methods for transmission and/or upload of documents; alternatively or additionally, where a document is identified by a citation, a uniform resource identifier (URI), uniform resource locator (URL) or other datum permitting unambiguous identification of the document, processor 104 may automatically obtain the document using such an identifier, for instance by submitting a request to a database or compendium of documents such as JSTOR as provided by Ithaka Harbors, Inc. of New York.

With continued reference to FIG. 1, in some embodiments, processor 104 may obtain external data feature 120 using automatic speech recognition (ASR). As a non-limiting example, ASR may analyze audio content (external data 102) originating from sources such as earnings calls, investor presentations, conference keynotes, interviews, or publicly available corporate recordings. In some cases, ASR system may transcribe spoken language into machine-readable text, from which a processor 104 may extract relevant external data features 120 associated with external data 102. For the purposes of this disclosure, "automatic speech recognition" is a technology that converts spoken language into written text or machine-readable form. In some embodiments, ASR may include techniques employing language processing to aid speech recognition processes. In some cases, ASR may be used to decode (i.e., recognize) indeterministic phonemes or help in forming a preponderance among probabilistic candidates. In some cases, ASR may include an audio-based automatic speech recognition process and an image-based automatic speech recognition process. ASR may analysis audio according to any method described herein, for instance using a Mel frequency cepstral coefficients (MFCCs) and/or log-Mel spectrogram derived from raw audio samples. In some cases, feature recognition may include any feature recognition process described in this disclosure, for example a variant of a convolutional neural network.

Still referring to FIG. 1, in some embodiments, automatic speech recognition may require training (i.e., enrollment). In some cases, training an automatic speech recognition model may require an individual speaker to read text or isolated vocabulary. In some cases, a solicitation video may include an audio component having an audible verbal content, the contents of which are known a priori by processor 104. Processor 104 may then train an automatic speech recognition model according to training data which includes audible verbal content correlated to known content. In this way, processor 104 may analyze a person's specific voice and train an automatic speech recognition model to the person's speech, resulting in increased accuracy. Alternatively or additionally, in some cases, processor 104 may include an automatic speech recognition model that is speaker-independent. As used in this disclosure, a "speaker independent" automatic speech recognition process does not require training for each individual speaker. Conversely, as used in this disclosure, automatic speech recognition processes that employ individual speaker specific training are "speaker dependent."

Still referring to FIG. 1, in some embodiments, an automatic speech recognition process may perform voice recognition or speaker identification. As used in this disclosure, "voice recognition" refers to identifying a speaker, from audio content, rather than what the speaker is saying. In some cases, processor 104 may first recognize a speaker of verbal audio content and then automatically recognize speech of the speaker, for example by way of a speaker dependent automatic speech recognition model or process. In some embodiments, an automatic speech recognition process can be used to authenticate or verify an identity of a speaker. In some cases, a speaker may or may not include subject. For example, subject may speak within solicitation video, but others may speak as well.

Still referring to FIG. 1, in some embodiments, an automatic speech recognition process may include one or all of acoustic modeling, language modeling, and statistically-based speech recognition algorithms. In some cases, an automatic speech recognition process may employ hidden Markov models (HMMs). As discussed in greater detail below, language modeling such as that employed in natural language processing applications like document classification or statistical machine translation, may also be employed by an automatic speech recognition process.

Still referring to FIG. 1, an exemplary algorithm employed in automatic speech recognition may include or even be based upon hidden Markov models. Hidden Markov models (HMMs) may include statistical models that output a sequence of symbols or quantities. HMMs can be used in speech recognition because a speech signal can be viewed as a piecewise stationary signal or a short-time stationary signal. For example, over a short time scale (e.g., 10 milliseconds), speech can be approximated as a stationary process. Speech (i.e., audible verbal content) can be understood as a Markov model for many stochastic purposes.

Still referring to FIG. 1, in some embodiments, HMMs can be trained automatically and may be relatively simple and computationally feasible to use. In an exemplary automatic speech recognition process, a hidden Markov model may output a sequence of n-dimensional real-valued vectors (with n being a small integer, such as 10), at a rate of about one vector every 10 milliseconds. Vectors may consist of cepstral coefficients. A cepstral coefficient requires using a spectral domain. Cepstral coefficients may be obtained by taking a Fourier transform of a short time window of speech yielding a spectrum, decorrelating the spectrum using a cosine transform, and taking first (i.e., most significant) coefficients. In some cases, an HMM may have in each state a statistical distribution that is a mixture of diagonal covariance Gaussians, yielding a likelihood for each observed vector. In some cases, each word, or phoneme, may have a different output distribution; an HMM for a sequence of words or phonemes may be made by concatenating an HMMs for separate words and phonemes.

Still referring to FIG. 1, in some embodiments, an automatic speech recognition process may use various combinations of a number of techniques in order to improve results. In some cases, a large-vocabulary automatic speech recognition process may include context dependency for phonemes. For example, in some cases, phonemes with different left and right context may have different realizations as HMM states. In some cases, an automatic speech recognition process may use cepstral normalization to normalize for different speakers and recording conditions. In some cases, an automatic speech recognition process may use vocal tract length normalization (VTLN) for male-female normalization and maximum likelihood linear regression (MLLR) for more general speaker adaptation. In some cases, an automatic speech recognition process may determine so-called delta and delta-delta coefficients to capture speech dynamics and might use heteroscedastic linear discriminant analysis (HLDA). In some cases, an automatic speech recognition process may use splicing and a linear discriminate analysis (LDA)-based projection, which may include heteroscedastic linear discriminant analysis or a global semi-tied covariance transform (also known as maximum likelihood linear transform [MLLT]). In some cases, an automatic speech recognition process may use discriminative training techniques, which may dispense with a purely statistical approach to HMM parameter estimation and instead optimize some classification-related measure of training data; examples may include maximum mutual information (MMI), minimum classification error (MCE), and minimum phone error (MPE).

Still referring to FIG. 1, in some embodiments, an automatic speech recognition process may be said to decode speech (i.e., audible verbal content). Decoding of speech may occur when an automatic speech recognition system is presented with a new utterance and must compute a most likely sentence. In some cases, speech decoding may include a Viterbi algorithm. A Viterbi algorithm may include a dynamic programming algorithm for obtaining a maximum a posteriori probability estimate of a most likely sequence of hidden states (i.e., Viterbi path) that results in a sequence of observed events. Viterbi algorithms may be employed in context of Markov information sources and hidden Markov models. A Viterbi algorithm may be used to find a best path, for example using a dynamically created combination hidden Markov model, having both acoustic and language model information, using a statically created combination hidden Markov model (e.g., finite state transducer [FST] approach).

Still referring to FIG. 1, in some embodiments, speech (i.e., audible verbal content) decoding may include considering a set of good candidates and not only a best candidate, when presented with a new utterance. In some cases, a better scoring function (i.e., re-scoring) may be used to rate each of a set of good candidates, allowing selection of a best candidate according to this refined score. In some cases, a set of candidates can be kept either as a list (i.e., N-best list approach) or as a subset of models (i.e., a lattice). In some cases, re-scoring may be performed by optimizing Bayes risk (or an approximation thereof). In some cases, re-scoring may include optimizing for sentence (including keywords) that minimizes an expectancy of a given loss function with regards to all possible transcriptions. For example, re-scoring may allow selection of a sentence that minimizes an average distance to other possible sentences weighted by their estimated probability. In some cases, an employed loss function may include Levenshtein distance, although different distance calculations may be performed, for instance for specific tasks. In some cases, a set of candidates may be pruned to maintain tractability.

Still referring to FIG. 1, in some embodiments, an automatic speech recognition process may employ dynamic time warping (DTW)-based approaches. Dynamic time warping may include algorithms for measuring similarity between two sequences, which may vary in time or speed. For instance, similarities in walking patterns would be detected, even if in one video the person was walking slowly and if in another he or she were walking more quickly, or even if there were accelerations and deceleration during the course of one observation. DTW has been applied to video, audio, and graphics, any data that can be turned into a linear representation can be analyzed with DTW. In some cases, DTW may be used by an automatic speech recognition process to cope with different speaking (i.e., audible verbal content) speeds. In some cases, DTW may allow processor 104 to find an optimal match between two given sequences (e.g., time series) with certain restrictions. That is, in some cases, sequences can be "warped" non-linearly to match each other. In some cases, a DTW-based sequence alignment method may be used in context of hidden Markov models.

Still referring to FIG. 1, in some embodiments, an automatic speech recognition process may include a neural network. Neural network may include any neural network, for example those disclosed with reference to FIGS. 4-6. In some cases, neural networks may be used for automatic speech recognition, including phoneme classification, phoneme classification through multi-objective evolutionary algorithms, isolated word recognition, audiovisual speech recognition, audiovisual speaker recognition and speaker adaptation. In some cases. neural networks employed in automatic speech recognition may make fewer explicit assumptions about feature statistical properties than HMMs and therefore may have several qualities making them attractive recognition models for speech recognition. When used to estimate the probabilities of a speech feature segment, neural networks may allow discriminative training in a natural and efficient manner. In some cases, neural networks may be used to effectively classify audible verbal content over short-time interval, for instance such as individual phonemes and isolated words. In some embodiments, a neural network may be employed by automatic speech recognition processes for pre-processing, feature transformation and/or dimensionality reduction, for example prior to HMM-based recognition. In some embodiments, long short-term memory (LSTM) and related recurrent neural networks (RNNs) and Time Delay Neural Networks (TDNN's) may be used for automatic speech recognition, for example over longer time intervals for continuous speech recognition.

With continued reference to FIG. 1, in some cases, processor 104 may be configured to identify external data feature 120 from external data 102 using an image processing module. As a non-limiting example, external data 102 may include visual content such as infographics, presentation slides, product images, advertisements, or screenshots from competitor websites or public reports. In some cases, image processing module may analyze visual content of external data 102 to detect and extract one or more external data features 120, which may include textual elements, logos, product configurations, charts, diagrams, or identifiable visual patterns relevant to user or competitor. As used in this disclosure, an "image processing module" is one or more distinct image processing technique designed to perform specific processing tasks and or operations to a digital image. For example, and without limitation, image processing module may be configured to compile plurality of digital images to create an integrated image. In an embodiment, image processing module may include a plurality of software algorithms that can analyze, manipulate, or otherwise enhance an image, such as, without limitation, a plurality of image processing techniques as described below. Image processing module may include, without limitation, modules that perform modifications such as random rotation, color jitter, Gaussian blur, perspective transform, shear transform, shadow casting, reflected light, ink color swap, moire, noise texturization, Gaussian noise, salt and pepper noise, folding and creasing, crumpled paper effect, and the like, and described in detail above. In a non-limiting example, image processing module may include any combination of image processing module. In some cases, image processing module may be implemented with one or more image processing libraries such as, without limitation, OpenCV, PIL/Pillow, ImageMagick, and the like. Image processing module may include, be included in, or be communicatively connected to processor 104, and/or memory 106.

With continued reference to FIG. 1, in an embodiment, image processing module may be configured to compress and/or encode images to reduce the file size and storage requirements while maintaining the essential visual information needed for further processing steps as described below. In an embodiment, compression and/or encoding of plurality of images may facilitate faster transmission of images. In some cases, image processing modules may be configured to perform a lossless compression on images, wherein the lossless compression may maintain the original image quality of images. In a nonlimiting example, image processing module may utilize one or more lossless compression algorithms, such as, without limitation, Huffman coding, Lempel-Ziv-Welch (LZW), Run-Length Encoding (RLE), and/or the like to identify and remove redundancy in each image in a plurality of images without losing any information. In such embodiment, compressing and/or encoding each image of a plurality of images may include converting the file format of each image into PNG, GIF, lossless JPEG2000 or the like. In an embodiment, images compressed via lossless compression may be perfectly reconstructed to the original form (e.g., original image resolution, dimension, color representation, format, and the like) of images. In other cases, image processing module may be configured to perform a lossy compression on plurality of images, wherein the lossy compression may sacrifice some image quality of images to achieve higher compression ratios. In a non-limiting example, image processing module may utilize one or more lossy compression algorithms, such as, without limitation, Discrete Cosine Transform (DCT) in JPEG or Wavelet Transform in JPEG2000, discard some less significant information within images, resulting in a smaller file size but a slight loss of image quality of images. In such embodiment, compressing and/or encoding each image of a plurality of images may include converting the file format of each image into JPEG, WebP, lossy JPEG2000, or the like.

With continued reference to FIG. 1, in an embodiment, processing images may include determining a degree of quality of depiction of a region of interest of an image or a plurality of images. In an embodiment, image processing module may determine a degree of blurriness of images. In a non-limiting example, image processing module may perform a blur detection by taking a Fourier transform, or an approximation such as a Fast Fourier Transform (FFT) of images and analyzing a distribution of low and high frequencies in the resulting frequency-domain depiction of images; for instance, and without limitation, numbers of high-frequency values below a threshold level may indicate blurriness. In another non-limiting example, detection of blurriness may be performed by convolving images, a channel of images, or the like with a Laplacian kernel; for instance, and without limitation, this may generate a numerical score reflecting a number of rapid changes in intensity shown in each image, such that a high score indicates clarity, and a low score indicates blurriness. In some cases, blurriness detection may be performed using a Gradient-based operator, which measures operators based on the gradient or first derivative of images, based on the hypothesis that rapid changes indicate sharp edges in the image, and thus are indicative of a lower degree of blurriness. In some cases, blur detection may be performed using Wavelet-based operator, which takes advantage of the capability of coefficients of the discrete wavelet transform to describe the frequency and spatial content of images. In some cases, blur detection may be performed using statistics-based operators take advantage of several image statistics such as texture descriptors in order to compute a focus level. In other cases, blur detection may be performed by using discrete cosine transform (DCT) coefficients in order to compute a focus level of images from its frequency content. Additionally, or alternatively, image processing module may be configured to rank images according to degree of quality of depiction of a region of interest and select a highest-ranking image from a plurality of digital images.

With continued reference to FIG. 1, processing images may include enhancing at least a region of interest via a plurality of image processing techniques to improve the quality (or degree of quality of depiction) of an image for better processing and analysis as described further in this disclosure. In an embodiment, image processing module may be configured to perform a noise reduction operation on an image, wherein the noise reduction operation may remove or minimize noise (arises from various sources, such as sensor limitations, poor lighting conditions, image compression, and/or the like), resulting in a cleaner and more visually coherent image. In some cases, noise reduction operation may be performed using one or more image filters; for instance, and without limitation, noise reduction operation may include Gaussian filtering, median filtering, bilateral filtering, and/or the like. Noise reduction operation may be done by image processing module, by averaging or filtering out pixel values in neighborhood of each pixel of an image to reduce random variations.

With continued reference to FIG. 1, in another embodiment, image processing module may be configured to perform a contrast enhancement operation on an image. In some cases, an image may exhibit low contrast, which may, for example, make a feature difficult to distinguish from the background. Contrast enhancement operation may improve the contrast of an image by stretching the intensity range of the image and/or redistributing the intensity values (i.e., degree of brightness or darkness of a pixel in the image). In a non-limiting example, intensity value may represent the gray level or color of each pixel, scale from 0 to 255 in intensity range for an 8-bit image, and scale from 0 to 16,777,215 in a 24-bit color image. In some cases, contrast enhancement operation may include, without limitation, histogram equalization, adaptive histogram equalization (CLAHE), contrast stretching, and/or the like. Image processing module may be configured to adjust the brightness and darkness levels within an image to make a feature more distinguishable (i.e., increase degree of quality of depiction). Additionally, or alternatively, image processing module may be configured to perform a brightness normalization operation to correct variations in lighting conditions (i.e., uneven brightness levels). In some cases, an image may include a consistent brightness level across a region after brightness normalization operation performed by image processing module. In a non-limiting example, image processing module may perform a global or local mean normalization, where the average intensity value of an entire image or region of an image may be calculated and used to adjust the brightness levels.

With continued reference to FIG. 1, in other embodiments, image processing module may be configured to perform a color space conversion operation to increase degree of quality of depiction. In a non-limiting example, in case of a color image (i.e., RGB image), image processing module may be configured to convert RGB image to grayscale or HSV color space. Such conversion may emphasize the differences in intensity values between a region or feature of interest and the background. Image processing module may further be configured to perform an image sharpening operation such as, without limitation, unsharp masking, Laplacian sharpening, high-pass filtering, and/or the like. Image processing module may use image sharpening operation to enhance the edges and fine details related to a region or feature of interest within an image by emphasizing high-frequency components within an image.

With continued reference to FIG. 1, processing images may include isolating a region or feature of interest from the rest of an image as a function of plurality of image processing techniques. Images may include highest-ranking image selected by image processing module as described above. In an embodiment, plurality of image processing techniques may include one or more morphological operations, wherein the morphological operations are techniques developed based on set theory, lattice theory, topology, and random functions used for processing geometrical structures using a structuring element. A "structuring element," for the purpose of this disclosure, is a small matrix or kernel that defines a shape and size of a morphological operation. In some cases, structing element may be centered at each pixel of an image and used to determine an output pixel value for that location. In a non-limiting example, isolating a region or feature of interest from an image may include applying a dilation operation, wherein the dilation operation is a basic morphological operation configured to expand or grow the boundaries of objects (e.g., a cell, a dust particle, and the like) in an image. In another non-limiting example, isolating a region or feature of interest from an image may include applying an erosion operation, wherein the erosion operation is a basic morphological operation configured to shrink or erode the boundaries of objects in an image. In another non-limiting example, isolating a region or feature of interest from an image may include applying an opening operation, wherein the opening operation is a basic morphological operation configured to remove small objects or thin structures from an image while preserving larger structures. In a further non-limiting example, isolating a region or feature of interest from an image may include applying a closing operation, wherein the closing operation is a basic morphological operation configured to fill in small gaps or holes in objects in an image while preserving the overall shape and size of the objects. These morphological operations may be performed by image processing module to enhance the edges of objects, remove noise, or fill gaps in a region or feature of interest before further processing.

With continued reference to FIG. 1, in an embodiment, isolating a region or feature of interest from an image may include utilizing an edge detection technique, which may detect one or more shapes defined by edges. An "edge detection technique," as used in this disclosure, includes a mathematical method that identifies points in a digital image, at which the image brightness changes sharply and/or has a discontinuity. In an embodiment, such points may be organized into straight and/or curved line segments, which may be referred to as "edges." Edge detection technique may be performed by image processing module, using any suitable edge detection algorithm, including without limitation Canny edge detection, Sobel operator edge detection, Prewitt operator edge detection, Laplacian operator edge detection, and/or Differential edge detection. Edge detection technique may include phase congruency-based edge detection, which finds all locations of an image where all sinusoids in the frequency domain, for instance as generated using a Fourier decomposition, may have matching phases which may indicate a location of an edge. Edge detection technique may be used to detect a shape of a feature of interest such as a cell, indicating a cell membrane or wall; in an embodiment, edge detection technique may be used to find closed figures formed by edges.

Referring to FIG. 1, in a non-limiting example, identifying one or more external data features 120 from external data 102 may include isolating one or more areas of interests using one or more edge detection techniques. An area of interest may include a specific area within a digital image that contains information relevant to further processing, such as one or more image features. In a non-limiting example, image data located outside an area of interest may include irrelevant or extraneous information. Such portion of external data 102 containing irrelevant or extraneous information may be disregarded by image processing module, thereby allowing resources to be concentrated at a targeted area of interest. In some cases, the area of interest may vary in size, shape, and/or location within external data 102. In a non-limiting example the area of interest may be a product, logo, and the like. In some cases, the area of interest may specify one or more coordinates, distances, and the like. Image processing module may then be configured to isolate the area of interest from external data 102 based on the particular feature.

With continued reference to FIG. 1, image processing module may be configured to perform a connected component analysis (CCA) on an image for feature of interest isolation. As used in this disclosure, a "connected component analysis (CCA)," also known as connected component labeling, is an image processing technique used to identify and label connected regions within a binary image (i.e., an image which each pixel having only two possible values: 0 or 1, black or white, or foreground and background). "Connected regions," as described herein, is a group of adjacent pixels that share the same value and are connected based on a predefined neighborhood system such as, without limitation, 4-connected or 8-connected neighborhoods. In some cases, image processing module may convert an image into a binary image via a thresholding process, wherein the thresholding process may involve setting a threshold value that separates the pixels of an image corresponding to feature of interest (foreground) from those corresponding to the background. Pixels with intensity values above the threshold may be set to 1 (white) and those below the threshold may be set to 0 (black). In an embodiment, CCA may be employed to detect and extract feature of interest by identifying a plurality of connected regions that exhibit specific properties or characteristics of the feature of interest. Image processing module may then filter plurality of connected regions by analyzing plurality of connected regions properties such as, without limitation, area, aspect ratio, height, width, perimeter, and/or the like. In a non-limiting example, connected components that closely resemble the dimensions and aspect ratio of feature of interest may be retained, by image processing module as feature of interest, while other components may be discarded. Image processing module may be further configured to extract feature of interest from an image for further processing. One or more external data 102 may be transmitted from processor 104 to image processing module via any suitable electronic communication protocol, including without limitation packet-based protocols such as transfer control protocol internet protocol (TCP-IP), file transfer protocol (FTP) or the like. Receiving images may include retrieval of external data 102 from a data store 110 containing images; for instance, and without limitation, images may be retrieved using a query that specifies a timestamp that images may be required to match.

With continued reference to FIG. 1, in some cases, receiving external data 102 may include identifying a duplication of external data 102 by comparing at least one external data 102 to previously received external data and removing the external data 102 as a function of the duplication. For the purposes of this disclosure, "previously received external data" is external data that have been received, extracted, and stored by an apparatus. In some cases, previously received external data may be stored in data store 110 and processor 104 may retrieve previously received external data from the data store 110. For the purposes of this disclosure, "duplication" is a condition in which data is substantially equivalent or redundant with respect to other data. In a non-limiting example, duplication may be identified when new data does not contribute additional semantic, contextual, or strategic value beyond what has already been incorporated into a system, and its inclusion would result in unnecessary repetition within a data processing pipeline or directed graph 114. For example, and without limitation, two news articles from different data sources describing the same competitor event with highly similar content may be treated as duplication. In some embodiments, processor 104 may identify duplication by comparing textual content, embeddings, metadata, or other external data features 120 of external data 102 using similarity measures such as cosine similarity, hash-based matching, or semantic distance thresholds. As a non-limiting example, duplication may be detected by computing a similarity distance between embeddings of external data 102 and/or external data features 120, where a similarity score above a predefined threshold indicates duplication.

With continued reference to FIG. 1, memory 106 contains instructions configuring processor 104 to retrieve a directed graph 114. For the purposes of this disclosure, a "directed graph" is a data structure that models a set of objects and the relationships between them. Directed graph 114 may include nodes or also called vertices. For the purposes of this "nodes of a directed graph" are units in the directed graph, representing distinct entities or points in the system. Each node can have zero or more directed edges emanating from it. As a non-limiting example, nodes may include external nodes 122 and internal nodes 124. For the purposes of this disclosure, "directed edges" are connections between nodes of a directed graph. As a non-limiting example, an edge from node A to node B indicates that there is a relationship from A to B. In some cases, directed graph 114 may include a heat map, decision tree, and the like. In some cases, directed edges or nodes may include data extrapolation 118 disclosed herein. In some cases, processor 104 may retrieve directed graph 114 from a data store 110.

With continued reference to FIG. 1, directed graph 114 includes at least two internal nodes 124, wherein each internal node 124 represents internal data 112. For the purposes of this disclosure, an "internal node" is a discrete element within a directed graph that represents at least one unit of internal data. In a non-limiting example, internal nodes 124 may function as structured representations of key strategic, operational, or informational elements relevant to a company's internal knowledge framework. For example, and without limitation, each internal node 124 may correspond to a specific business objective, capability, asset, process, initiative, product attribute, key performance indicator (KPI), or any other organizational construct that reflects at least one unit of internal data 112. In some embodiments, internal nodes 124 may include metadata such as node type, creation timestamp, domain classification, priority level, or confidence score. For the purposes of this disclosure, "internal data" is information, knowledge, or structured content of a user or user's organization. In some cases, internal data 112 may describe or support strategic objectives, operational structures, business capabilities, performance indicators, or the like a user or user's organization. As a non-limiting example, internal data 112 may include corporate strategies, product roadmaps, internal metrics, team structures, technology assets, market segments, financial targets, internal reports, and proprietary models.

With continued reference to FIG. 1, directed graph 114 includes at least one internal directed edge 126, wherein the at least one internal directed edge 126 represents a relationship between at least two internal nodes 124. For the purposes of this disclosure, an "internal directed edge" is a connection within a directed graph that links two internal nodes. In some cases, internal directed edge 126 may include unidirectional connection. In some cases, internal directed edge 126 may indicate a specific relationship, hierarchical structure, strategic alignment, temporal or procedural sequence, influence, or dependency from a source internal node to a target internal node. In some cases, internal directed edge 126 may include a strength of relationship between internal nodes, contextual information between internal nodes 124, and the like.

With continued reference to FIG. 1, in some embodiments, generating directed graph 114 may include constructing, by processor 104, a decision tree as a function of internal data 112, external data 102 and/or data extrapolations 118. In a non-limiting example, processor 104 may map one or more internal data 112, external data 102 and/or data extrapolations 118 to each node of plurality of internal nodes 124 and/or external nodes 122 within decision tree. In this case, each node of plurality of internal nodes 124 and/or external nodes 122 may include at least one internal data 112, external data 102 and/or data extrapolations 118. As used in this disclosure, a "decision tree" is a data structure that represents and combines one or more determinations or other computations based on and/or concerning data provided thereto, as well as earlier such determinations or calculations, as nodes of a tree data structure where inputs of some nodes are connected to outputs of others. Plurality of internal nodes 124 and/or external nodes 122 within decision tree may include at least a root node, or node that receives processed action data 112 to the decision tree. Plurality of internal nodes 124 and/or external nodes 122 within decision tree may include at least a terminal node, which may alternatively or additionally be referred to herein as a "leaf node," corresponding to an execution result of decision tree. In other words, decisions and/or determinations produced by decision tree may be output at the at least a terminal node. In some embodiments, plurality of internal nodes 124 and/or external nodes 122 within decision tree may include one or more internal nodes, defined as nodes connecting outputs of root nodes to inputs of terminal nodes. In a non-limiting example, internal nodes may represent conditional decision criteria (e.g., responsiveness thresholds, calendar conflicts, sentiment shifts), branches may represent evaluation outcomes (e.g., high responsiveness vs. low responsiveness), and leaf nodes may represent final decision outputs (e.g., transmit immediately, delay by 15 minutes, switch channels, or block the prompt). In some cases, processor 104 may generate two or more decision trees, which may overlap. In a non-limiting example, decision tree may establish a link to a remote decision module, device, system, or the like. Root node of one decision tree may connect to and/or receive output from one or more terminal nodes of another decision tree, intermediate nodes of one decision tree may be shared with another decision tree, or the like. In some embodiments, decision tree may incorporate plurality of internal data 112, external data 102 and/or data extrapolations 118 using an application programming interface (API). In other embodiments, decision tree may perform one or more data store lookups and/or look-up table lookups.

With continued reference to FIG. 1, in some embodiments, constructing decision tree using processor 104 may include constructing decision tree as a function of a decision metric. As used in this disclosure, a "decision metric" is a quantitative measurement for determining one or more branches within decision tree from root node to terminal node of plurality of internal nodes and/or external nodes. In a non-limiting example, plurality of internal nodes 124 and/or external nodes 122 within decision tree may be split according to decision metric, wherein resulting branches (i.e., sub-trees) between plurality of nodes may include a better decision metric than previous tree; for instance, a higher probability of one class. As used in this disclosure, a "branch" is a connection between two nodes of decision tree. Nodes may include any node described above such as, without limitation, root node, terminal node, internal node, and the like thereof. In some embodiments, branch may include a relation indicator, wherein the relation indicator is an element indicates a single relationship between connected nodes. In some cases, relation indicator may include any data type such as, without limitation, string, integer, Boolean, object, and the like thereof. In a non-limiting example, root node may be connected to a first terminal node through a first branch and a second terminal node through a second branch, wherein the first branch may include a first relation indicator of string "yes" or "satisfied" and the second branch may include a second relation indicator of string "no" or "unsatisfied." In a non-limiting example, decision metric may include an entropy, wherein the entropy is a measurement of randomness in processed internal data 112, external data 102 and/or data extrapolations 118 and measures an amount of uncertainty within processed internal data 112, external data 102 and/or data extrapolations 118. Decision tree with a high entropy as decision metric may include more nodes and branches. In a non-limiting example, decision metric may include a Gini index, wherein the Gini index is a measurement of probability (i.e., likelihood) of a given element of internal data 112, external data 102 and/or data extrapolations 118 misclassified by a particular node of decision tree. In a non-limiting example, decision metric may include an information grain (IG), wherein the information gain is a measurement of reduction in entropy or Gini index during the constructing process of decision tree. As will be appreciated by persons having ordinary skill in the art, after having read the entirety of this disclosure, the foregoing list is provided by way of example and other metrics for determining branches and/or feature split can be added as an extension or improvements of apparatus 100 disclosed herein.

With continued reference to FIG. 1, in a non-limiting example, processor 104 may be configured to specify a root node within plurality of internal nodes 124 and/or external nodes 122, wherein the root node may be a base internal data 112, external data 102 and/or data extrapolations 118. Generating directed graph 114 may further include traversing decision tree based on processed internal data 112, external data 102 and/or data extrapolations 118. Processor 104 may be configured to accept an input such as, without limitation, processed internal data 112, external data 102 and/or data extrapolations 118 and recursively performing mapping of element of processed internal data 112, external data 102 and/or data extrapolations 118 to root node of plurality of internal nodes 124 and/or external nodes 122. In some embodiments, traversing decision tree may include comparing processed internal data 112, external data 102 and/or data extrapolations 118 against at least one internal data 112, external data 102 and/or data extrapolations 118 at a first node of plurality of internal nodes 124 and/or external nodes 122 and passing processed internal data 112, external data 102 and/or data extrapolations 118 to a second node of plurality of internal nodes 124 and/or external nodes 122 as a function of the comparison, wherein the second node is connected to the first node. In a non-limiting example, comparing processed internal data 112, external data 102 and/or data extrapolations 118 against one or more internal data 112, external data 102 and/or data extrapolations 118 corresponding to the current node may include checking, by processor 104, whether at least a portion of processed internal data 112, external data 102 and/or data extrapolations 118 (i.e., one or more elements of processed internal data 112, external data 102 and/or data extrapolations 118) satisfy the internal data 112, external data 102 and/or data extrapolations 118 corresponding to the current node. Root node may be split into a plurality of internal nodes based on a decision metric, wherein the decision metric may be a satisfaction of internal data 112, external data 102 and/or data extrapolations 118; for instance, root node may be connected with a first internal node through a first branch containing a first determination of internal data 112, external data 102 and/or data extrapolations 118 satisfaction (i.e., "satisfied") to base internal data 112, external data 102 and/or data extrapolations 118 and a second internal node through a second branch containing a second determination of internal data 112, external data 102 and/or data extrapolations 118 satisfaction to base internal data 112, external data 102 and/or data extrapolations 118 (i.e., "unsatisfied").

First internal node may include a different set of internal data 112, external data 102 and/or data extrapolations 118 than second internal node. Processor 104 may connect root node and one or more matched internal nodes with matched decision metric and continue map the next element of processed internal data 112, external data 102 and/or data extrapolations 118. Processor 104 may create a plurality of terminal nodes at the end of recursive input mapping. Each terminal node may be a final internal data 112, external data 102 and/or data extrapolations 118 of plurality of internal data 112, external data 102 and/or data extrapolations 118. Processor 104 may construct decision tree by enforcing connections/branches between root node and plurality of internal nodes and connections/branches between plurality of internal nodes and plurality of terminal nodes through decision metric. Terminal node may include a final decision regarding to the generation of directed graph 114. In some cases, terminal node may include a last satisfied internal data 112, external data 102 and/or data extrapolations 118; for instance, and without limitation, processor 104 may terminate the construction of decision tree upon an unsatisfied internal data 112, external data 102 and/or data extrapolations 118 is reached.

With continued reference to FIG. 1, in some embodiments, traversing decision tree may further include generating a node score for each node of the plurality of internal nodes 124 and/or external nodes 122 as a function of each comparison between newly collected internal data 112, external data 102 and/or data extrapolations 118 and at least one of internal data 112, external data 102 and/or data extrapolations 118 occurred at each node of the plurality of nodes as described above. As used in this disclosure, a "node score" is an evaluation of the extent to which internal data, external data or data extrapolations is satisfied. In some embodiments, node score may be generated as a numeric value on a scale, percentage, or a linguistic label (e.g., "Poor," "Moderate. "Great," and the like). In some embodiments, internal data 112, external data 102 and/or data extrapolations 118 at each node may be represented as a checklist. Processor may match elements of processed internal data 112, external data 102 and/or data extrapolations 118 to each list item and mark or check the list item upon a successful match, wherein the successful match may be determined based on decision metric as described above. Processor may then generate node score as a function of marked or checked list items; for instance, processor 104 may be configured to determine node score based on number of checked list items, number of unchecked list items, and the like thereof. Additionally, or alternatively, decision tree may incorporate the use of one or more machine-learning models to form a new data structure. Machine-learning models may include any machine-learning models described in this disclosure. In a non-limiting example, each node of plurality of internal nodes 124 and/or external nodes 122 may include a utilization of a node score machine-learning model. Node score machine-leaning model may be trained using node score training data, wherein the node score training data may include a plurality of internal data 112, external data 102 and/or data extrapolations 118 pairs as input correlated to a plurality of node scores as output. Node score training data may be obtained by processor 104 in any manner and/or form as described anywhere in this disclosure, including and without limitation retrieving from data store 110. Processor 104 may generate node score at each node as a function of trained node score machine-learning model. Further, generating the node scores may include using a fuzzy set inference system to generate. A fuzzy inferencing system for determination of node scores may be employed, where any or all node scores may be represented as values and/or fuzzy sets for linguistic variables measuring the same, as described in more detail in FIG. 7. An inferencing system may use one or more fuzzy inferencing rules, as described below in FIG. 7, to output one or more linguistic variable values and/or defuzzified values indicating node scores.

With continued reference to FIG. 1, generating directed graph 114 may include aggregating plurality of node scores associated with plurality of internal nodes 124 and/or external nodes 122 of decision tree into a graph node score. As used in this disclosure, a "graph node score" is the aggregation of a plurality of node scores generated or determined based on a plurality of internal data, external data and/or data extrapolations. In a non-limiting example, graph node score may include an overall score of plurality of node scores generated at each node during decision tree traversal; for instance, and without limitation, graph node score may include an average score of plurality of node scores. In some embodiments, terminal node of decision tree may incorporate an aggregator, wherein the aggregator is a component configured to receive, collect, or otherwise combine data from a data source such as, without limitation, plurality of internal nodes 124 and/or external nodes 122 of decision tree. In a non-limiting example, aggregator may be configured to collect node scores from a decision tree traversal path, wherein the decision tree traversal path is an array of nodes visited by processor 104 in order during decision tree traversal as described above. Aggregator may then combine plurality of node scores collected from the decision tree traversal path; for instance, and without limitation, aggregator may iteratively or recursively append a first node score generated at a current node with a second node score generated at a previous node connected with the current node. Further, processor 104 may then generate directed graph 114 as a function of graph node score. In some embodiments, graph node score may represent an overall eligibility of the end-user for receiving directed graph 114 as described in further detail below. Graph node score may be used to evaluate if a nudge should or should not be sent out to the end user. In a non-limiting example, processor 104 may be configured to compare graph node score to a threshold score. Processor 104 may generate directed graph 114 if graph node score exceeds the threshold score.

With continued reference to FIG. 1, memory 106 contains instructions configuring processor 104 to generate a data extrapolation 118 of external data 102 as a function of at least a part of at least two internal nodes 124 and at least one internal directed edge 126. For the purposes of this disclosure, a "data extrapolation" is an estimated value or prediction that extend beyond the observed range of existing data. In some cases, processor 104 may estimate or infer how external data 102 might affect, relate to, or alter internal node 124, internal directed edge 126 and/or internal data 112. For example, and without limitation, if external data 102 indicates a competitor launching a new technology product, processor 104 may identify internal nodes 124 in a directed graph 114 related to product development and technology strategy and a relationship (internal directed edge 126) between them to determine whether the external data 102 presents a risk, opportunity, or area requiring action. In some cases, generating data extrapolation 118 may include estimating potential strategic, operational, or relational implications of external data 102 for internal data 112 or user. In some cases, processor 104 may generate data extrapolation 118 using techniques such as semantic similarity analysis, machine learning inference, or rule-based reasoning. For example, and without limitation, if external data 102 and/or external data feature 120 indicates a competitor entering a new market, data extrapolation 118 may infer which internal business objectives or capabilities may be impacted or activated in response. As a non-limiting example, data extrapolation 118 may include function datum 128, function score 130, action datum 132, and the like as described below. In some cases, data extrapolation 118 may be stored in data store 110 and processor 104 may retrieve data extrapolation 118 from the data store 110. In some cases, user may manually input data extrapolation 118.

With continued reference to FIG. 1, in some cases, generating data extrapolation 118 may include identifying one or more external data features 120 of external data 102, identifying one or more internal data features 134 of internal data 112 and determining or identifying at least one internal node 124 related to the external data 102 as a function of the one or more external data features 120 and the one or more internal data features 134. For the purposes of this disclosure, "internal data features" are one or more characteristics of internal data. In some cases, internal data features 134 may include keywords. As a non-limiting example, internal data features 134 may include named entities, domain-specific terms, temporal references, geographic locations, or technical specifications. For example, and without limitation, internal data feature 134 may include keywords including company names, product names, executive titles, and the like. For example, and without limitation, internal data feature 134 may include keywords including "product launch," "market entry," "price reduction," "patent granted," and the like. In some cases, internal data features 134 may be consistent external data features 120. In some cases, external data features 120 may be stored in data store 110 and processor 104 may retrieve external data features 120 from data store 110. In some cases, user may manually input external data features 120. Identifying internal data features 134 may be consistent with methods of identifying external data features 120 described above. As a non-limiting example, identifying internal data features 134 may include identifying internal data features 134 from internal data 112 using a language processing module, imaging processing module, ASR, machine-learning model, and the like.

With continued reference to FIG. 1, in some cases, identifying at least one internal node 124 related to external data 102 as a function of one or more external data features 120 and one or more internal data features 134 may include comparing or analyzing the one or more external data features 120 and the one or more internal data features 134 to determine which internal nodes 124 are most closely aligned, influenced by, or relevant to external data 102 using similarity scoring, embedding distance calculation, rule-based matching, or machine learning-based classification. In some cases, processor 104 may convert external data 102 and/or external data feature 120 to external embedding 136. For the purposes of this disclosure, an "external embedding" is a vector representation of external data or external feature. In some cases, processor 104 may convert internal data 112 and/or internal data feature 134 to internal embedding 138. For the purposes of this disclosure, an "internal embedding" is a vector representation of internal data or internal feature. In some cases, processor 104 may convert external data 102, external data feature 120, internal data 112 and/or internal data feature 134 using an embedding model. As a non-limiting example, embedding model may include BERT, RoBERTa, a domain-specific transformer model, or the like. In some cases, processor 104 may calculate a similarity score or distance metric (e.g., cosine similarity, Euclidean distance, or Manhattan distance) between external embedding 136 and each internal embedding 138. The result may include a ranked list of internal nodes 124, each assigned a relevance score indicating how closely external data 102 aligns or interacts with the internal node's subject matter.

With continued reference to FIG. 1, processor 104 may be configured to convert external data 102, external data feature 120, internal data 112 and/or internal data feature 134 using a Bidirectional Encoder Representations from Transformers (BERT). In an embodiment, BERT may implement a transformer architecture having an "attention mechanism" configured to dynamically determine and assign weight e.g., importance of different token such as keywords. Exemplary attention mechanism may include, without limitation, generalized attention self-attention, multi-head attention, additive attention, global attention, and the like. In some cases, transformer architecture may be implemented as an encoder-decoder structure having an encoder configured to map an input sequence (e.g., external data 102, external data feature 120, internal data 112 and/or internal data feature 134 to a higher dimensional space i.e., a sequence of continuous representations, and a decoder configured to transform output of the encoder into a final output sequence (e.g., external embedding 136 and/or internal embedding 138). In other cases, transformer architecture may include only an encoder stack. As a non-limiting example, an embedding model may include a plurality of layers each contains one or more sub-layers, wherein a first sub-layer may include a multi-head self-attention mechanism, and a second sub-layer may include a position-wise fully connected feed-forward network. In some cases, plurality of layers may be identical. In some cases, multi-head self-attention mechanism may configure an embedding model to focus on different parts of the input sequence when predicting external embedding 136 and/or internal embedding 138; for instance, and without limitation, self-attention mechanism may be described by an attention function:

$$\text{Attention}\,(Q,\,K,\,V) = \text{softmax}\!\left(\frac{QK^{T}}{\sqrt{d_k}}\right)\!V$$

Where Q, K, and V represent a set of queries, keys, and values matrices respectively, and $d_k$ is the dimensionality of the keys. In a non-limiting embodiment, set of queries Q may include external data 102, external data feature 120, internal data 112 and/or internal data feature 134, set of keys K may include keywords, and set of values may include a plurality of attention scores correlated to set of keys K computed using Q and T. In some cases, position-wise fully connected feed-forward network within second sub-layer of each layer may apply a linear transformation to each position separately and identically, for example, and without limitation, position-wise fully connected feed-forward network may be configured to process the output of the attention mechanism according to equation $\text{FFN}(x)=\max(0, xW_1+b_1)\,W_2+b_2$, where $W_1$, $W_2$, $b_1$, and $b_2$ are parameters of the feed-forward and x is the input to the feed-forward network. In other words, second sub-layer may include two convolutions with a kernel size 1 and a ReLu activation in between.

With continued reference to FIG. 1, in one or more embodiments, BERT's input representation may combine a plurality of embeddings of tokens, segments, and/or positions. In some cases, each token may be processed, for example and without limitation, through a WordPiece tokenization. Output of BERT may include a fixed-length vector that represents the input token's contextual relationships that are suitable for downstream tasks, such as, without limitation, generation of data extrapolation 118. In some cases, implementing BERT for converting data may include pre-training (bidirectionally) which involves one or more unsupervised tasks; for instance, and without limitation, processor 104 may be configured to execute a Masked Language Model (MLM) and a Next Sentence Prediction (NSP). In a non-limiting example, at least a portion of keywords in each data may be randomly masked, and the model may learn to predict masked keywords based on the context. NSP may train the model to predict, for example, and without limitation, whether two given keywords logically follow each other. Additionally, BERT may be fine-tuned for converting data to embedding to adapt pre-trained representations. In some cases, fine-tuning BERT may include iteratively training BERT's parameters on embedding training data with minimal adjustments required from the pre-trained model as described above; for instance, and without limitation, a loss function used for fine-turning may be represented as:

$$L = -\log\left(\frac{e^{s(correct)}}{\sum_j e^{s(j)}}\right)$$

Wherein L is the loss, s(correct) is the score of the correct label, and s(j) is the score of each possible label. Processor 104 may fine-tune BERT on task-specific data to improve the model performance. It should be noted that other exemplary downstream tasks e.g., sentiment analysis, question answering, named entity recognition (NER), among others may be adapted and optimized based on the apparatuses and methods described in this disclosure. As a person skilled in the art, upon reviewing the entirety of this disclosure, will be well versed in the model architectures, including multi-head self-attention mechanism and position-wise fully connected feed-forward network as described herein.

With continued reference to FIG. 1, in some cases, data extrapolation 118 may include a function datum 128. In some cases, generating data extrapolation 118 may include determining a function datum 128 of the data extrapolation 118 as a function of a correspondence between external data 102 and at least a part of at least two internal nodes 124 and at least one internal directed edge 126. For the purposes of this disclosure, a "function datum" is a data element that represents an inferred indication of how external data affects, influences, or relates to at least one internal node or internal directed edge within a directed graph. In some cases, function datum 128 may include a type of impact. As a non-limiting example, impact type may include negative, positive, risky, opportunity, disruptive, aligning, and the like. For example, and without limitation, if external data 102 indicates a competitor launching a lower-priced alternative to one of a user's key products, processor 104 may compare external data feature 120 and internal data feature 134 or external embedding 136 and internal embedding 138 and may classify external data 102 as "risky" or "disruptive." In some cases, function datum 128 may include how much and in what way external data 102 affects internal nodes 124 and the relationship (internal directed edge 126) between them. For example, and without limitation, if external data 102 describes a new competitor technology that could interfere with a product a user's company is developing (node A), and that product directly supports a strategic expansion goal (node B), connected using an internal directed edge, processor 104 may infer that the external data 102 has a disruptive impact on both nodes and their relationship. In some cases, user may manually determine function datum 128.

With continued reference to FIG. 1, in some cases, determining function datum 128 may include converting external data 102 to an external embedding 136, converting the internal data 112 to an internal embedding 138 and generating an function score 130 of the function datum 128 as a function of a similarity distance between the external embedding 136 and the internal embedding 138. For the purposes of this disclosure, a "similarity distance" is a quantitative measure that indicates the degree of semantic or contextual difference between two different data. In some cases, similarity distance may reflect how closely external data 102 or external embedding 136 and internal data 112 or an internal embedding 138 align in a high-dimensional vector space generated by an embedding model. In some embodiments, similarity distance may be computed using mathematical functions such as cosine distance, Euclidean distance, Manhattan distance, or other vector distance metrics. In some cases, smaller similarity distance may indicate a higher semantic similarity between external data 102 and internal data 112, meaning that the external data may be is more contextually or strategically relevant to the internal knowledge it is being compared against.

With continued reference to FIG. 1, determining function datum 128 may include generating an function score 130. In some cases, data extrapolation 118 may include an function score 130. For the purposes of this disclosure, a "function score" is a value or metric generated that quantifies the degree, magnitude, or likelihood of influence that external data may exert on at least one internal node or internal directed edge within a directed graph. In some cases, processor 104 may be configured to generate an function score 130 of function datum 128 as a function of a similarity distance between external embedding 136 and internal embedding 138. In a non-limiting example, a lower similarity distance may result in a higher function score. In a non-limiting example, function score 130 of external data 102 may be 0.87 on a scale from 0 to 1, where higher values indicate greater strategic significance. In some embodiments, function score 130 may be determined using a classification or regression model trained on historical examples of external data 102 and their observed effects on internal data 112. In some cases, function score 130 may be used to prioritize graph modifications, trigger threshold-based actions, weight visual representations, or rank importance of external data 102. In some cases, processor 104 may retrieve function score 130 from a data store 110. In some cases, user may manually determine function score 130.

With continued reference to FIG. 1, in some cases, data extrapolation 118 may include an action datum 132. In some cases, generating data extrapolation 118 may include generating an action datum 132 of the data extrapolation 118 as a function of external data 102 and internal data 112 of at least two internal nodes 124. For the purposes of this disclosure, an "action datum" is a data element of data extrapolation that represents a recommended or inferred actions to make in response to external data. In some cases, action datum 132 may indicate what action a user or system should consider taking based on external data 102, function datum 128, function score 130, and the like. As a non-limiting example, action datum 132 may include a recommended action. For example, and without limitation, action datum 132 may include a directive to initiate a product roadmap adjustment, allocate additional resources to a strategic initiative, reassess a market entry plan, monitor a specific competitor's activity, schedule a meeting, or the like. For example, and without limitation, action datum 132 may include a directive to trigger a scenario simulation within an apparatus 100. In some cases, action datum 132 may identify which internal nodes 124 or internal directed edges 126 should be modified, varied, held constant, or observed during the simulation. In some cases, action datum 132 may specify simulation parameters such as time horizon, affected domains, or assumed external conditions. In some embodiments, action datum 132 may include metadata such as a recommended timeframe for execution, a priority score, and a rationale indicating external data source 108 and relevance to internal data 112. For instance, and without limitation, if processor 104 detects that a competitor has launched a product in a market where a user's internal node 124 represents an upcoming launch initiative, action datum 132 may include a recommendation to accelerate development or increase marketing investment, accompanied by a justification derived from a similarity distance between external data 102 and internal data 112. In some cases, processor 104 may retrieve action datum 132 from a data store 110. In some cases, user may manually determine action datum 132.

With continued reference to FIG. 1, in some cases, determining action datum 132 may include generating an actionable prompt 140 as a function of action datum 132 and transmitting the actionable prompt 140 to a downstream device 116. For the purposes of this disclosure, an "actionable prompt" is a message, signal, or communication to engage, guide, inform, or elicit a response from a user or a system. In some cases, actionable prompt 140 may include a recommended or suggested action (action datum 132) to a user. As a non-limiting example, actionable prompt 140 may include a form of a question, suggestion, reflection point, reminder, notification, or directive. As a non-limiting example, actionable prompt 140 may include a summary of external data 102 that triggered action datum 132, recommended action, internal nodes 124 or internal directed edges 126 affected, explanation of an impact (function datum 128) of external data 102 on internal nodes 124 or internal directed edges 126, priority or confidence score, justification or explanation derived from function datum 128, and the like. In some cases, actionable prompt 140 may be adapted in content, tone, structure and timing based on function datum 128 and/or action datum 132. In some cases, processor 104 may retrieve actionable prompt 140 from a data store 110. In some cases, user may manually determine actionable prompt 140.

With continued reference to FIG. 1, in some cases, actionable prompt 140 may be consistent with a device prompt disclosed, U.S. patent application Ser. No. 19/305, 258, filed on Aug. 20, 2025, titled "APPARATUS AND METHOD FOR GENERATING CONTEXT-AWARE DEVICE PROMPTS," which is incorporated by reference herein in its entirety.

With continued reference to FIG. 1, in some cases, generating data extrapolation 118 may include generating the data extrapolation 118 using an extrapolation machine-learning model 142 that has been trained on extrapolation training datasets 144 including exemplary external data elements correlated to exemplary data extrapolations (e.g., function datum 128, action datum 132, function score 130, and the like). For the purposes of this disclosure, an "extrapolation machine-learning model" is a computational model that generates a data extrapolation. In some embodiments, extrapolation machine-learning model 142 may be trained using extrapolation training datasets 144 including labeled pairs of exemplary external data and exemplary internal data with exemplary data extrapolations. For the purposes of this disclosure, "extrapolation training datasets" are collections of training data used to train an extrapolation machine-learning model. In some embodiments, extrapolation machine-learning model 142 may include or operate in conjunction with neural networks, transformer-based language models, decision trees, or other supervised or unsupervised learning architectures. In some cases, extrapolation machine-learning model 142 may include a plurality of machine-learning models that generates different data extrapolation 118. As a non-limiting example, first extrapolation machine-learning model 142 may generate action datum 132, second extrapolation machine-learning model 142 may generate function datum 128, third extrapolation machine-learning model 142 may generate function score 130, and the like. Each extrapolation machine-learning model 142 may be independently trained on a respective subset of extrapolation training datasets 144, optimized for its particular output objective. As a non-limiting example, first extrapolation machine-learning model 142 may be trained with a first set of extrapolation training datasets 144 including correlations between exemplary external data, exemplary internal data and exemplary function data, second extrapolation machine-learning model 142 may be trained with a second set of extrapolation training datasets 144 including correlations between exemplary external data, exemplary internal data and exemplary function scores, and third extrapolation machine-learning model 142 may be trained with a third set of extrapolation training datasets 144 including correlations between exemplary external data, exemplary internal data and exemplary action data. In some embodiments, a plurality of extrapolation machine-learning models 142 may operate in parallel or in a cascaded configuration. For example, and without limitation, first extrapolation machine-learning model 142 may generate a candidate function datum 128, which may be used as input to a downstream model (second extrapolation machine-learning model 142) that produces an action datum 132 or function score 130. In another non-limiting example, all extrapolation machine-learning models 142 may receive the same external embedding 136 and internal embeddings 138 and produce different outputs. Once trained, extrapolation machine-learning model 142 may receive as input external data 102, external embedding 136, external data feature 120, internal data 112, internal data feature 134, internal embeddings 138, and the like and produce as output a data extrapolation 118.

With continued reference to FIG. 1, in some embodiments, processor 104 may be configured to generate extrapolation training datasets 144. In a non-limiting example, extrapolation training datasets 144 may include correlations between exemplary external data, exemplary external embedding, exemplary external feature, exemplary internal data, exemplary internal feature, exemplary internal embeddings, and exemplary data extrapolations. In some embodiments, extrapolation training datasets 144 may be stored in data store 110. In some embodiments, extrapolation training datasets 144 may be received from one or more users, data store 110, external computing devices, and/or previous iterations of processing. As a non-limiting example, extrapolation training datasets 144 may include instructions from a user, who may be an expert user, a past user in embodiments disclosed herein, or the like, which may be stored in memory and/or stored in data store 110, where the instructions may include labeling of training examples. In some embodiments, extrapolation training datasets 144 may be updated iteratively on a feedback loop. As a non-limiting example, processor 104 may update extrapolation training datasets 144 iteratively through a feedback loop as a function of an output of extrapolation machine-learning model 142, or the like. In some embodiments, processor 104 may be configured to generate a extrapolation machine-learning model 142. In a non-limiting example, generating extrapolation machine-learning model 142 may include training, retraining, or fine-tuning extrapolation machine-learning model 142 using extrapolation training datasets 144 or updated extrapolation training datasets 144. In some embodiments, extrapolation machine-learning model 142 may have been trained with extrapolation training datasets 144. In some embodiments, processor 104 may be configured to determine data extrapolation 118 using extrapolation machine-learning model 142 (i.e., trained or updated extrapolation machine-learning model 142). In some embodiments, extrapolation machine-learning model 142 may receive external data 102, external embedding 136, external data feature 120, internal data 112, internal data feature 134, internal embeddings 138, and the like as inputs and may output data extrapolation 118 in response to the inputs.

With continued reference to FIG. 1, in some embodiments, input data of extrapolation machine-learning model 142 may be classified to a user cohort using a cohort classifier. Cohort classifier may be consistent with any classifier discussed in this disclosure. Cohort classifier may be trained on cohort training data, wherein the cohort training data may include exemplary external data, exemplary external embedding, exemplary external feature, exemplary internal data, exemplary internal feature, or exemplary internal embeddings correlated to user cohorts. In some embodiments, input data of extrapolation machine-learning model 142 may be classified to a user cohort and processor 104 may determine data extrapolation 118 based on the user cohort using a machine-learning module as described in detail with respect to FIG. 4 and the resulting output may be used to update extrapolation training datasets 144. In some embodiments, generating training data and training extrapolation machine-learning models 142 may be simultaneous. In some embodiments, processor 104 may generate data extrapolation 118 without the use of extrapolation machine-learning model 142.

With continued reference to FIG. 1, in some embodiments, extrapolation machine-learning model 142 may function differently between training time and inference time. In a non-limiting example, at training time, processor 104 may be configured to train, retrain, or fine-tune extrapolation machine-learning model 142 using extrapolation training datasets 144. During the training time, extrapolation machine-learning model 142 may learn to associate patterns within external data 102, external embedding 136, external data feature 120, internal data 112, internal data feature 134, internal embeddings 138, and the like with data extrapolations. In a non-limiting example, at inference time, trained extrapolation machine-learning model 142 may be configured to receive previously unseen external data 102, external embedding 136, external data feature 120, internal data 112, internal data feature 134, internal embeddings 138, and the like and, based on the representations learned during training time, automatically output a selection of data extrapolation 118 corresponding to external data 102, external embedding 136, external data feature 120, internal data 112, internal data feature 134, internal embeddings 138, and the like. Inference may be triggered in response to a user request, system event, or automated workflow operation.

With continued reference to FIG. 1, in some cases, extrapolation machine-learning model 142 may include a large language model (LLM). A "large language model," as used herein, is a deep learning algorithm that can recognize, summarize, translate, predict and/or generate text and other content. In some cases, processor 104 may generate actionable prompt 140 using LLM. LLM may be a type of generative artificial intelligence (AI). LLMs may be trained on large sets of data; for example, training sets may include greater than 1 million words. Training sets may be drawn from diverse sets of data such as, as non-limiting examples, novels, blog posts, articles, emails, and the like. Training sets may include a variety of subject matters, such as, as nonlimiting examples, emails, advertising documents, newspaper articles, and the like. LLMs, in some embodiments, may include GPT, GPT-2, GPT-3, and other language processing models. LLM may be used to augment the text in an article based on a prompt. Training data may correlate elements of a dictionary related to linguistics, as described above, to a prompt. LLM may include a text prediction based algorithm configured to receive an article and apply a probability distribution to the words already typed in a sentence to work out the most likely word to come next in augmented articles. For example, if the words already typed are "Nice to meet," then it is highly likely that the word "you" will come next. LLM may output such predictions by ranking words by likelihood or a prompt parameter. For the example given above, the LLM may score "you" as the most likely, "your" as the next most likely, "his" or "her" next, and the like.

Still referring to FIG. 1, LLM may include an attention mechanism, utilizing a transformer as described further below. An "attention mechanism," as used herein, is a part of a neural architecture that enables a system to dynamically highlight relevant features of the input data. In natural language processing this may be a sequence of textual elements. It may be applied directly to the raw input or to its higher-level representation. An attention mechanism may be an improvement to the limitation of the Encoder-Decoder model which encodes the input sequence to one fixed length vector from which to decode the output at each time step. This issue may be seen as a problem when decoding long sequences because it may make it difficult for the neural network to cope with long sentences, such as those that are longer than the sentences in the training corpus. Applying an attention mechanism, LLM may predict the next word by searching for a set of position in a source sentence where the most relevant information is concentrated. LLM may then predict the next word based on context vectors associated with these source positions and all the previous generated target words, such as textual data of a dictionary correlated to a prompt in a training data set. A "context vector," as used herein, are fixed-length vector representations useful for document retrieval and word sense disambiguation. In some embodiments, LLM may include encoder-decoder model incorporating an attention mechanism.

Still referring to FIG. 1, LLM may include a transformer architecture. In some embodiments, encoder component of LLM may include transformer architecture. A "transformer architecture," for the purposes of this disclosure is a neural network architecture that uses self-attention and positional encoding. Transformer architecture may be designed to process sequential input data, such as natural language, with applications towards tasks such as translation and text summarization. Transformer architecture may process the entire input all at once. "Positional encoding," for the purposes of this disclosure, refers to a data processing technique that encodes the location or position of an entity in a sequence. In some embodiments, each position in the sequence may be assigned a unique representation. In some embodiments, positional encoding may include mapping each position in the sequence to a position vector. In some embodiments, trigonometric functions, such as sine and cosine, may be used to determine the values in the position vector. In some embodiments, position vectors for a plurality of positions in a sequence may be assembled into a position matrix, wherein each row of position matrix may represent a position in the sequence.

With continued reference to FIG. 1, an attention mechanism may represent an improvement over a limitation of the Encoder-Decoder model. The encoder-decider model encodes the input sequence to one fixed length vector from which the output is decoded at each time step. This issue may be seen as a problem when decoding long sequences because it may make it difficult for the neural network to cope with long sentences, such as those that are longer than the sentences in the training corpus. Applying an attention mechanism, LLM may predict the next word by searching for a set of position in a source sentence where the most relevant information is concentrated. LLM may then predict the next word based on context vectors associated with these source positions and all the previous generated target words, such as textual data of a dictionary correlated to a prompt in a training data set. A "context vector," as used herein, are fixed-length vector representations useful for document retrieval and word sense disambiguation.

Still referring to FIG. 1, an attention mechanism may include generalized attention self-attention, multi-head attention, additive attention, global attention, and the like. In generalized attention, when a sequence of words or an image is fed to LLM, it may verify each element of the input sequence and compare it against the output sequence. Each iteration may involve the mechanism's encoder capturing the input sequence and comparing it with each element of the decoder's sequence. From the comparison scores, the mechanism may then select the words or parts of the image that it needs to pay attention to. In self-attention, LLM may pick up particular parts at different positions in the input sequence and over time compute an initial composition of the output sequence. In multi-head attention, LLM may include a transformer model of an attention mechanism. Attention mechanisms, as described above, may provide context for any position in the input sequence. For example, if the input data is a natural language sentence, the transformer does not have to process one word at a time. In multi-head attention, computations by LLM may be repeated over several iterations, each computation may form parallel layers known as attention heads. Each separate head may independently pass the input sequence and corresponding output sequence element through a separate head. A final attention score may be produced by combining attention scores at each head so that every nuance of the input sequence is taken into consideration. In additive attention (Bahdanau attention mechanism), LLM may make use of attention alignment scores based on a number of factors. These alignment scores may be calculated at different points in a neural network. Source or input sequence words are correlated with target or output sequence words but not to an exact degree. This correlation may take into account all hidden states and the final alignment score is the summation of the matrix of alignment scores. In global attention (Luong mechanism), in situations where neural machine translations are required, LLM may either attend to all source words or predict the target sentence, thereby attending to a smaller subset of words.

With continued reference to FIG. 1, multi-headed attention in encoder may apply a specific attention mechanism called self-attention. Self-attention allows the models to associate each word in the input, to other words. So, as a non-limiting example, the LLM may learn to associate the word "you," with "how" and "are." It is also possible that LLM learns that words structured in this pattern are typically a question and to respond appropriately. In some embodiments, to achieve self-attention, input may be fed into three distinct fully connected layers to create query, key, and value vectors. The query, key, and value vectors may be fed through a linear layer; then, the query and key vectors may multiply using dot product matrix multiplication in order to produce a score matrix. The score matrix may determine the amount of focus for a word should be put on other words (thus, each word may be a score that corresponds to other words in the time-step). The values in score matrix may be scaled down. As a non-limiting example, score matrix may be divided by the square root of the dimension of the query and key vectors. In some embodiments, the softmax of the scaled scores in score matrix may be taken. The output of this softmax function may be called the attention weights. Attention weights may be multiplied by your value vector to obtain an output vector. The output vector may then be fed through a final linear layer.

With continued reference to FIG. 1, in order to use self-attention in a multi-headed attention computation, query, key, and value may be split into N vectors before applying self-attention. Each self-attention process may be called a "head." Each head may produce an output vector and each output vector from each head may be concatenated into a single vector. This single vector may then be fed through the final linear layer discussed above. In theory, each head can learn something different from the input, therefore giving the encoder model more representation power.

With continued reference to FIG. 1, encoder of transformer may include a residual connection. Residual connection may include adding the output from multi-headed attention to the positional input embedding. In some embodiments, the output from residual connection may go through a layer normalization. In some embodiments, the normalized residual output may be projected through a pointwise feed-forward network for further processing. The pointwise feed-forward network may include a couple of linear layers with a ReLU activation in between. The output may then be added to the input of the pointwise feed-forward network and further normalized.

With continued reference to FIG. 1, transformer architecture may include a decoder. Decoder may be a multi-headed attention layer, a pointwise feed-forward layer, one or more residual connections, and layer normalization (particularly after each sub-layer), as discussed in more detail above. In some embodiments, decoder may include two multi-headed attention layers. In some embodiments, decoder may be autoregressive. For the purposes of this disclosure, "autoregressive" means that the decoder takes in a list of previous outputs as inputs along with encoder outputs containing attention information from the input.

With continued reference to FIG. 1, in some embodiments, input to decoder may go through an embedding layer and positional encoding layer in order to obtain positional embeddings. Decoder may include a fist multi-headed attention layer, wherein the first multi-headed attention layer may receive positional embeddings.

With continued reference to FIG. 1, first multi-headed attention layer may be configured to not condition to future tokens. As a non-limiting example, when computing attention scores on the word "am," decoder should not have access to the word "fine" in "I am fine," because that word is a future word that was generated after. The word "am" should only have access to itself and the words before it. In some embodiments, this may be accomplished by implementing a look-ahead mask. Look ahead mask is a matrix of the same dimensions as the scaled attention score matrix that is filled with "0s" and negative infinities. For example, the top right triangle portion of look-ahead mask may be filed with negative infinities. Look-ahead mask may be added to scaled attention score matrix to obtain a masked score matrix. Masked score matrix may include scaled attention scores in the lower-left triangle of the matrix and negative infinities in the upper-right triangle of the matrix. Then, when the SoftMax of this matrix is taken, the negative infinities will be zeroed out; this leaves "zero" attention scores for "future tokens."

With continued reference to FIG. 1, second multi-headed attention layer may use encoder outputs as queries and keys and the outputs from the first multi-headed attention layer as values. This process matches the encoder's input to the decoder's input, allowing the decoder to decide which encoder input is relevant to put a focus on. The output from second multi-headed attention layer may be fed through a pointwise feedforward layer for further processing.

With continued reference to FIG. 1, the output of the pointwise feedforward layer may be fed through a final linear layer. This final linear layer may act as a classifier. This classifier may be as big as the number of classes that you have. For example, if you have 10,000 classes for 10,000 words, the output of that classes will be of size 10,000. The output of this classifier may be fed into a SoftMax layer which may serve to produce probability scores between zero and one. The index may be taken of the highest probability score in order to determine a predicted word.

With continued reference to FIG. 1, decoder may take this output and add it to the decoder inputs. Decoder may continue decoding until a token is predicted. Decoder may stop decoding once it predicts an end token. In some embodiment, decoder may be stacked N layers high, with each layer taking in inputs from the encoder and layers before it. Stacking layers may allow LLM to learn to extract and focus on different combinations of attention from its attention heads.

With continued reference to FIG. 1, in some embodiments, LLM may be specifically trained using large language model (LLM) training data. In some cases, extrapolation training datasets 144 may include LLM training data. In some embodiments, LLM training data may include correlations between exemplary action data, exemplary function data, and/or exemplary actionable prompts. In some embodiments, LLM training data may include a set of data that is in user's voice, email, or the like to mimic them. In some embodiments, LLM training data may be consistent with any training data described in the entirety of this disclosure. In some embodiments, LLM training data may be received from one or more users, data store 110, external computing devices, and/or previous iterations of processing. As a non-limiting example, LLM training data may include instructions from a user, who may be an expert user, a past user in embodiments disclosed herein, or the like, which may be stored in memory and/or stored in data store 110, where the instructions may include labeling of training examples. In some embodiments, LLM training data may be updated iteratively through a feedback loop. As a non-limiting example, LLM training data may be updated iteratively through a feedback loop as a function of newly collected external data 102, internal data 112, action datum 132, function datum 128, output of machine-learning models described herein, or the like. In some embodiments, processor 104 may be configured to generate LLM. In a non-limiting example, generating LLM may include training, retraining, or fine-tuning LLM using LLM training data or updated LLM training data. In some embodiments, processor 104 may be configured to generate actionable prompt 140 using LLM (i.e., trained or updated LLM).

With continued reference to FIG. 1, in some embodiments, processor 104 may incorporate retrieval augmented generation (RAG) into LLM. For the purposes of this disclosure, "retrieval-augmented generation" is a method that enhances a response generation capability of a large language model by integrating external, relevant information retrieved from a structured database or unstructured corpus. In some embodiments, by leveraging RAG, LLM can reduce a risk of generating incorrect or hallucinated information, instead relying on curated and contextually relevant data. For the purposes of this disclosure, "hallucination" of information refers to where a language model fabricates plausible-sounding but incorrect information. In some embodiments, processor 104 may retrieve relevant information from internal or external medical database and the retrieved data may be input into LLM to generate responses (actionable prompt 140) grounded in authoritative sources. In some embodiments, processor 104 may identify keywords or semantic elements in the query and using these elements to search a database for information.

With continued reference to FIG. 1, in some embodiments, processor 104 may utilize similarity-based fetching techniques to identify most relevant data for input to LLM. For the purposes of this disclosure, "similarity-based fetching" is a process by which a query is converted into a high-dimensional vector embedding, representing its semantic meaning, and compared with pre-computed embeddings of documents or data in a database. In some embodiments, retrieved documents with high similarity scores may be integrated into an input for LLM. In some embodiments, processor 104 may select an appropriate database for a given query based on context and sensitivity of information. In some embodiments, LLM may generate an initial response based on an input query, and this response may be then analyzed to identify additional relevant keywords or concepts. In some embodiments, these elements may subsequently be used to perform a second round of data retrieval. In a non-limiting example, additional retrieved data may then be input into LLM alongside the original query and first response to generate an output (e.g., actionable prompt 140).

With continued reference to FIG. 1, in some embodiments, processor 104 may generate hypothetical document embeddings. For the purposes of this disclosure, a "hypothetical document embedding" refers to an embedding created by LLM that represents its semantic understanding of a query or preliminary response. In some embodiments, the embeddings may be compared against database embeddings to identify documents or data closely aligned with the system's understanding of a query. In some embodiments, the retrieved information may then be incorporated into an input of LLM.

With continued reference to FIG. 1, memory 106 contains instructions configuring processor 104 to modify directed graph 114 as a function of data extrapolation 118. Modifying directed graph 114 includes generating at least one external node 122 representing external data 102. For the purposes of this disclosure, an "external node" is a discrete element within a directed graph that represents at least one unit of external data. In some embodiments, processor 104 may modify external node 122 as a function of a data extrapolation process in which external data 102 is analyzed and determined to have potential impact on internal node 124 and/or internal directed edge 126. In some cases, external node 122 may include metadata such as the external data source, timestamp, confidence score, type classification, or topic tag. Modifying directed graph 114 includes generating at least one external directed edge 146 connecting at least one external node 122 and at least one of at least two internal nodes 124 as a function of data extrapolation 118. For the purposes of this disclosure, an "external directed edge" is a connection within a directed graph that links an external node to at least one internal node or vice versa. In some cases, external directed edge 146 may represent a determined relationship, influence, or effect of external data 102 on internal data 112. As a non-limiting example, external directed edge 146 may encode how an external data 102, such as a competitor event, market shift, or regulatory change, relates to or impacts specific elements of a user's internal knowledge structure. In some embodiments, processor 104 may generate external directed edge 146 as a function of a data extrapolation 118, function datum 128, or action datum 132, wherein the processor 104 may determine that external node 122 has a relevant effect on one or more internal nodes 124. In some cases, external directed edge 146 may include associated metadata such as, direction of influence, type of relationship (e.g., risk, opportunity, alignment, disruption), timestamp, or source provenance. In a non-limiting example, processor 104 may add external node 122 into directed graph 114 upon determining that external data 102 bears contextual or semantic relevance to at least one internal node 124 or internal directed edge 126. For example, and without limitation, processor 104 may extract external data features 120 from external data 102, generate an external embedding 136, and evaluate its similarity to internal embeddings 138 representing internal data 112. Upon identifying a sufficient degree of relevance, such as surpassing a predefined similarity threshold or triggering a recognized pattern, processor 104 may instantiate an external node 122 within directed graph 114. In some cases, external node 122 may be labeled or classified according to metadata. For example, and without limitation, external node 122 may be labeled or classified according to a type of external entity or event it represents, such as a competitor, regulatory development, customer signal, or emerging trend. For example, and without limitation, metadata associated with external node 122 may include the timestamp of the data acquisition, external data source, an identifier, domain tags, function score 130, and the like. This newly added external node 122 may serve as the origin or destination of one or more external directed edges 146 linking it to internal nodes 124 or another external nodes 122, thereby updating the structure of directed graph 114 to reflect newly observed external-contextual relationships.

With continue reference to FIG. 1, in some embodiments, modifying directed graph 114 may include modifying at least one internal directed edge 126 between at least two internal nodes 124 as a function of at least one external node 122 and at least one external directed edge 146. In a non-limiting example, processor 104 may determine that external node 122, which represents a competitor's strategic alliance announcement, is connected using an external directed edge 146 to an internal node 124 representing a user's planned market entry initiative. In a non-limiting example, processor 104 may analyze the nature of external data 102 and its function score 130, and based on this assessment, may alter internal directed edge 126 linking a user's first internal node to a second internal node to link a third internal node or remove the internal directed edge 126. In some cases, processor 104 may be configured to generate at least one external directed edge 146 as a function of function datum 128. As a non-limiting example, if function datum 128 indicates that external data 102 describing a competitor's entry into a previously uncontested market poses a high risk to a user's internal node 124 representing a "New Market Launch" initiative, processor 104 may generate an external directed edge 146 from an external node 122 representing the competitor's market activity to the internal node 124 representing the user's strategic initiative. In some cases, processor 104 may be configured to generate at least one external node 122 as a function of action datum 132. As a non-limiting example, if processor 104 determines, based on data extrapolation 118 and associated function datum 128, that a new strategic consideration should be introduced in response to emerging external data 102, processor 104 may generate an external node 122 representing a suggested external opportunity or threat that does not directly correspond to a discrete event but is instead inferred as a recommended strategic focus area (e.g., action datum 132). For instance, and without limitation, if action datum 132 includes a recommendation to evaluate potential expansion into a newly developing geographic market in response to multiple weak external signals, processor 104 may instantiate an external node 122 labeled with the inferred strategic opportunity.

With continued reference to FIG. 1, memory 106 contains instructions configuring processor 104 to simulate a plurality of sequential actions as a function of modified directed graph 114, wherein simulating the plurality of sequential actions includes identifying an action among the plurality of sequential actions that has a highest function score within the modified directed graph 114 based on a simulated outcome of the plurality of sequential actions. For the purposes of this disclosure, "sequential actions" are a plurality of discrete, temporally ordered operations or decision steps on a modified directed graph. In some cases, each action within sequential actions may represent a theoretical or candidate modification to modified directed graph 114, such as altering a node's attribute, introducing a new node or edge, updating a relationship between nodes, or initiating a system-level change inferred from data extrapolation 118. In some cases, simulation may allow processor 104 to model compound influence of a chain of sequential actions over time within modified directed graph 114. For example, and without limitation, a first action may simulate the introduction of a new external node 122, while a second and third action may evaluate subsequent structural shifts or functional consequences resulting from that initial change. In some cases, simulating the plurality of sequential actions may include applying one or more decision-tree algorithms or reinforcement learning models to determine which sequence of actions produces the most favorable simulated outcome, as quantified by a computed function score 130. In some cases, function score 130 may reflect criteria such as strategic alignment, structural efficiency, predicted stability, or optimal resource allocation within directed graph 114.

Processor 104 may identify a highest-value action or sequence among a plurality of simulated sequential actions.

With continue reference to FIG. 1, in some embodiments, processor 104 may be configured to model and evaluate downstream effects of potential actions on a directed graph 114 using a decision-tree-based simulation engine. In some cases, processor 104 may be configured to select an initial set of possible actions, such as internal decisions, strategic pivots, or resource reallocations, and simulate their sequential application within the context of the current state of the directed graph 114, which includes internal nodes 124, internal directed edges 126, external nodes 122, and external directed edges 146. In a non-limiting example, each node in the decision tree may represent a decision point or state transition, while each edge may represent an action taken or a consequence observed. In some cases, processor 104 may execute a recursive or iterative traversal of the decision tree, simulating the execution of various action data 132 in sequence. At each node of the decision tree, processor 104 may evaluate the predicted or calculated change in one or more graph-related metrics, such as node weight, edge strength, updated function score 130 or estimated future signal alignment. Once the decision tree has been explored, processor 104 may identify a path (or action node) that resulted in the highest net benefit, strategic alignment, or system stability. In some cases, this action may be surfaced to a user as a "lead domino" action, representing the most strategically significant move based on predicted downstream impact.

With continue reference to FIG. 1, in addition to or in combination with decision-tree-based evaluation, processor 104 may utilize reinforcement learning (RL) models to improve an identification and recommendation of optimal actions. For the purposes of this disclosure, "reinforcement learning" is a machine learning paradigm in which a model learns to make a sequence of decisions by interacting with an environment and receiving feedback in the form of rewards or penalties. In some cases, processor 104 may be configured to treat a directed graph 114 and associated signals as an evolving environment, wherein the model (i.e., processor 104 executing RL algorithms) learns which actions lead to desirable long-term outcomes, such as improved alignment between external signals and internal strategy, reduced risk, or maximized opportunity impact. During training, an RL model may learn a "policy," which is a mapping from the current state of a directed graph (including active external nodes 122, existing impact data, and past actions) to a recommended action. This policy may be optimized using standard RL algorithms such as Q-learning, Deep Q-Networks (DQNs), or policy gradient methods. The learned policy can then be deployed in real-time by processor 104 to recommend high-value actions when new external data 102 is received. When combined with decision-tree simulations, the reinforcement learning policy may be used to prune low-value branches or prioritize exploration of action paths that have historically resulted in high-reward states. In some embodiments, the policy may be continually refined through online learning as new data arrives, enabling processor 104 to adapt its action recommendations based on changing market conditions and updated graph structures.

With continue reference to FIG. 1, in some embodiments, modifying directed graph 114 may include determining a weighted value 148 of at least one external node 122 as a function of function score 130 and generating a visual representation 150 of at least one external node 122 as a function of the weighted value 148. In some cases, decision metric and/or node score described above may include function score 130, weighted value 148, and the like. For the purposes of this disclosure, a "weighted value" is a numerical value assigned to at least one node or directed edge representing a relative significance, influence, priority, or confidence associated with that element in a directed graph. In some cases, weighted value 148 may reflect the strength of an impact, the priority of an action, the confidence in a data extrapolation, or the urgency of external data 102. In some cases, processor 104 may determine weighted value 148 as a function of function score 130, action datum 132, function datum 128, source reliability, temporal relevance, or frequency of occurrence. In some embodiments, a weighted value 148 may be assigned to an external node 122, an internal node 124, an external directed edge 146, or an internal directed edge 126. For example, and without limitation, processor 104 may determine that an external node 122 representing a competitor's newly launched product has a high function score with respect to a user's internal node representing a product development initiative. In response, the processor 104 may assign a higher weighted value to that external node 122. In some cases, processor 104 may retrieve weighted value 148 from data store 110. In some cases, user may manually input weighted value 148.

With continue reference to FIG. 1, in some embodiments, processor 104 may determine weighted value 148 using rule-based logic, statistical functions, or machine learning models, computing a numerical value that quantifies the strategic or operational relevance of a graph element within a directed graph 114. For example, and without limitation, processor 104 may first convert external data 102 into an external embedding 136 and compare it with an internal embedding 138 derived from internal data 112 to calculate a similarity distance. Based on this similarity distance, processor 104 may generate an function score 130 indicating the degree of influence or alignment between the external data 102 and internal node 124. In some cases, function score 130 may be weighted by additional attributes such as a data source credibility of external data 102, a recency of the event of external data, known historical sensitivity of internal node 124, or a user-defined importance parameter. In some cases, resulting value may be normalized or scaled to produce a final weighted value 148, which may be then assigned to the corresponding external node 122, internal node 124, internal directed edge 126 or external directed edge 146. In some cases, processor 104 may update weighted value 148 dynamically as additional external data 102 are received or as the relationships within a directed graph 114 change.

With continued reference to FIG. 1, for the purposes of this disclosure, a "visual representation" is a graphical depiction of at least a portion of a directed graph. In some cases, visual representation 150 may include internal nodes 124, external nodes 122, internal directed edges 126, and external directed edges 146, along with associated metadata such as node labels, edge weights, timestamps, confidence indicators, or function scores. In some embodiments, visual representation 150 may display a structure and state of a directed graph 114 in real time. In some embodiments, visual representation 150 may reflect ongoing modifications made in response to incoming external data 102 and the results of data extrapolation 118. In some cases, visual representation 150 may be displayed using a user interface 152. In some embodiments, visual representation 150 may include graphical components such as icons, shapes, edges, directional arrows, text labels, node clustering, or color-coding, where each component reflects specific attributes or values. For example, and without limitation, thickness or color of a directed edge may correspond to an function score 130 or weighted value 148, while the size or shape of a node may indicate its strategic priority or type (e.g., external node 122 vs. internal node 124). In some cases, visual representation 150 may include dynamic features, such as interactive filtering, zooming, temporal sliders, or hover-based tooltips, allowing users to explore how external data affect internal node 124. In some cases, visual representation 150 may be modified in real time as new external data 102 are processed and corresponding changes to a graph structure or metadata occur. In some cases, a node may be displayed with a larger size, bolder outline, or more prominent color intensity if weighted value 148 exceeds a defined threshold. In some cases, animated effects or labels such as icons or tooltips may be added to external node 122 to indicate its relevance, urgency, or associated metadata, including source, timestamp, or classification. In some cases, visual representation 150 of directed graph 114 may include a heat map.

With continued reference to FIG. 1, memory 106 contains instructions configuring processor 104 to generate a user interface 152 including modified directed graph 114 and an action that has a highest function score. In some cases, a user interface 152 may include external data 102, internal data 112, external data feature 120, internal data feature 134, internal embedding 138, external embedding 136, weighted value 148, function score 130, function datum 128, action datum 132, data extrapolation 118, actionable prompt 140, directed graph 114, and the like. For the purposes of this disclosure, a "user interface" is a means by which a user and a computer system interact. For example through the use of input devices and software. A user interface 152 may include a graphical user interface (GUI), command line interface (CLI), menu-driven user interface, touch user interface, voice user interface (VUI), form-based user interface, any combination thereof and the like. In some embodiments, user interface 152 may operate on and/or be communicatively connected to a decentralized platform, metaverse, and/or a decentralized exchange platform associated with the user. For example, a user may interact with user interface 152 in virtual reality. In some embodiments, a user may interact with the user interface 152 using a computing device distinct from and communicatively connected to at least a processor 104. For example, a smart phone, smart, tablet, or laptop operated by a user. In an embodiment, user interface 152 may include a graphical user interface. A "graphical user interface," as used herein, is a graphical form of user interface that allows users to interact with electronic devices. In some embodiments, GUI may include icons, menus, other visual indicators or representations (graphics), audio indicators such as primary notation, and display information and related user controls. A menu may contain a list of choices and may allow users to select one from them. A menu bar may be displayed horizontally across the screen such as pull-down menu. When any option is clicked in this menu, then the pull-down menu may appear. A menu may include a context menu that appears only when the user performs a specific action. An example of this is pressing the right mouse button. When this is done, a menu may appear under the cursor. Files, programs, web pages and the like may be represented using a small picture in a graphical user interface. For example, links to decentralized platforms as described in this disclosure may be incorporated using icons. Using an icon may be a fast way to open documents, run programs etc. because clicking on them yields instant access.

With continue reference to FIG. 1, in some embodiments, generating a user interface 152 may include generating the user interface 152 including a function heatmap including a visual representation of modified directed graph 114, wherein each node of the modified directed graph 114 may be rendered with a visual intensity based on function score 130. For the purposes of this disclosure, a "function heatmap" is a graphical visualization that visually encodes one or more function scores associated with nodes of a modified directed graph. In some cases, function heatmap may provide a visual representation of how each node within a modified directed graph 114 contributes to, or is affected by, a simulated or computed function, such as relevance, priority, strategic value, or influence. In some embodiments, each node of the modified directed graph 114 may be rendered with a corresponding visual intensity, color gradient, or graphical attribute that reflects a node's associated function score 130. For example, and without limitation, nodes (e.g., external node 122) with higher function scores 130 may appear with brighter colors, larger size, or increased opacity, while nodes with lower function scores 130 may be rendered in muted tones or with reduced emphasis. In some cases, function heatmap may dynamically update in real time as new external data 102 is received, new data extrapolations 118 are computed, or additional graph modifications are applied.

With continue reference to FIG. 1, in some embodiments, apparatus 100 may include a user interface 152 configured with one or more interactive features that allow a user to engage directly with components of a directed graph 114 to simulate "what if" scenarios. In some cases, user interface 152 may display visual representations 150 of directed graph 114 including internal nodes 124, external nodes 122, and directed edges. In some cases, user interface 152 may enable a user to select, modify, reposition, or apply hypothetical actions to components of directed graph 114. As a non-limiting example, user interactions may include dragging nodes, activating or deactivating external nodes 122 to model the addition or removal of the nodes, or adjusting weighted value to reflect hypothetical changes in relationship strength. In some cases, interactivity of GUI may allow users to manipulate graphical elements (visual representation 150) and a plurality of event handlers that detects various changes in the graphical elements and triggers generation or changes in visual representation 150 in directed graph 114. In some embodiments, users may manipulate graphical elements, such as dragging or resizing visual representation 150 of external node 122, internal node 124, external directed edge 146, internal directed edge 126, and the like. Furthermore, GUI may provide an intuitive interface for comparing different scenarios. As a user modifies a directed graph 114, processor 104 may perform computations in real time to generate simulated outcomes, such as changes in function scores 130, action data 132, or weighted values 148. The results of these computations may be visually rendered as immediate feedback within a user interface 152, such as through changes in color, size, or structure of nodes and edges, or through overlays indicating areas of increased risk, opportunity, or misalignment.

With continued reference to FIG. 1, the present disclosure may also include systems and methods for generating and managing artificial intelligence (AI) personas. This may include a persona engine that simulates the thought processes, behavioral patterns, and interactive styles of distinct individuals or archetypes. The persona engine may be used to construct an AI Board, a virtual decision-making or advisory panel comprising multiple AI personas, each configured to emulate a specific role, mindset, or individual. This system enables users—such as executives, strategists, and communicators—to interact with the AI Board for the purpose of testing ideas, refining messaging, rehearsing meetings, or obtaining simulated feedback.

The persona engine may be designed to simulate the cognitive and behavioral models of a given persona. Each persona may be instantiated with a set of defined parameters, which may include core values, communication style, risk tolerance, strategic outlook, values, and other behavioral heuristics. These parameters may allow a system to emulate how a particular persona would respond to prompts, evaluate proposals, or engage in discussion. The personas may be archetypal—such as a "visionary founder" or "no-nonsense COO"—or may be trained and tuned to approximate real-world individuals, including known public figures, industry experts, or actual colleagues, subject to applicable data usage rights.

Using the persona engine, an AI Board can be assembled as a collection of distinct AI personas selected to mimic the composition and dynamics of a corporate board. This AI Board may be configurable and may be tailored to represent a range of stakeholder perspectives, such as those of investors, operators, technical experts, or legal advisors. Each AI persona within the board may operate independently, maintaining its unique profile and behavioral rules while participating in simulated group discussion or feedback sessions. The user may engage with the AI Board synchronously or asynchronously, posing strategic questions, sharing plans, or simulating hypothetical boardroom interactions. The AI Board may respond with divergent feedback based on each persona's programmed perspective, thereby enriching the user's decision-making process through multi-angle analysis.

The personas within the AI Board may be distinguished by voice, tone, and/or questioning style, as non-limiting examples. This may shape the nature of their feedback and engagement with the user. As a non-limiting example, a "growth-minded board member" may ask questions centered on scalability and financial projections, while a "challenger CEO" may critique assumptions and press for competitive differentiation. This diversity of styles may serve to stimulate critical thinking and sharpen the user's strategic communication. In one embodiment, the AI Board may be generated to mimic a real-life board, using data or known behavioral profiles of actual board members to simulate a realistic and personalized decision-making environment. This feature allows for rehearsal of high-stakes interactions with simulated fidelity to real-world dynamics.

With continued reference to FIG. 1, the apparatus may support real-time updates and modifications to the persona profiles, allowing users to evolve or refine the AI Board composition over time. Furthermore, usage data may be used (with appropriate privacy safeguards) to improve persona realism and interaction quality. In some implementations, the system may provide summary reports or diagnostics derived from AI Board sessions, offering insights into recurring themes, emotional tone, risk factors identified, or communication effectiveness.

With continued reference to FIG. 1, the persona engine and/or AI board may be used to simulate, using the at least a processor, a plurality of sequential actions as a function of the data extrapolation and the modified directed graph, wherein simulating the plurality of sequential actions comprises identifying an action among the plurality of sequential actions that has a highest function score on the directed graph based on a simulated outcome of the plurality of sequential actions. In some embodiments, the function score may be calculated based on the personas of the persona engine/AI board. For example, different personas may place different weights on different things. For example, some personas may prioritize short term return, some personas may prioritize long-term strategic decision making, some personas may prioritize external sentiment, some personas may be conservative, some personas may be aggressive, or a combination of the above. For example, different function scores may be calculated for the different personas based on their preferences and, based on the selected persona or group of personas, different actions may be suggested.

Figure 2:
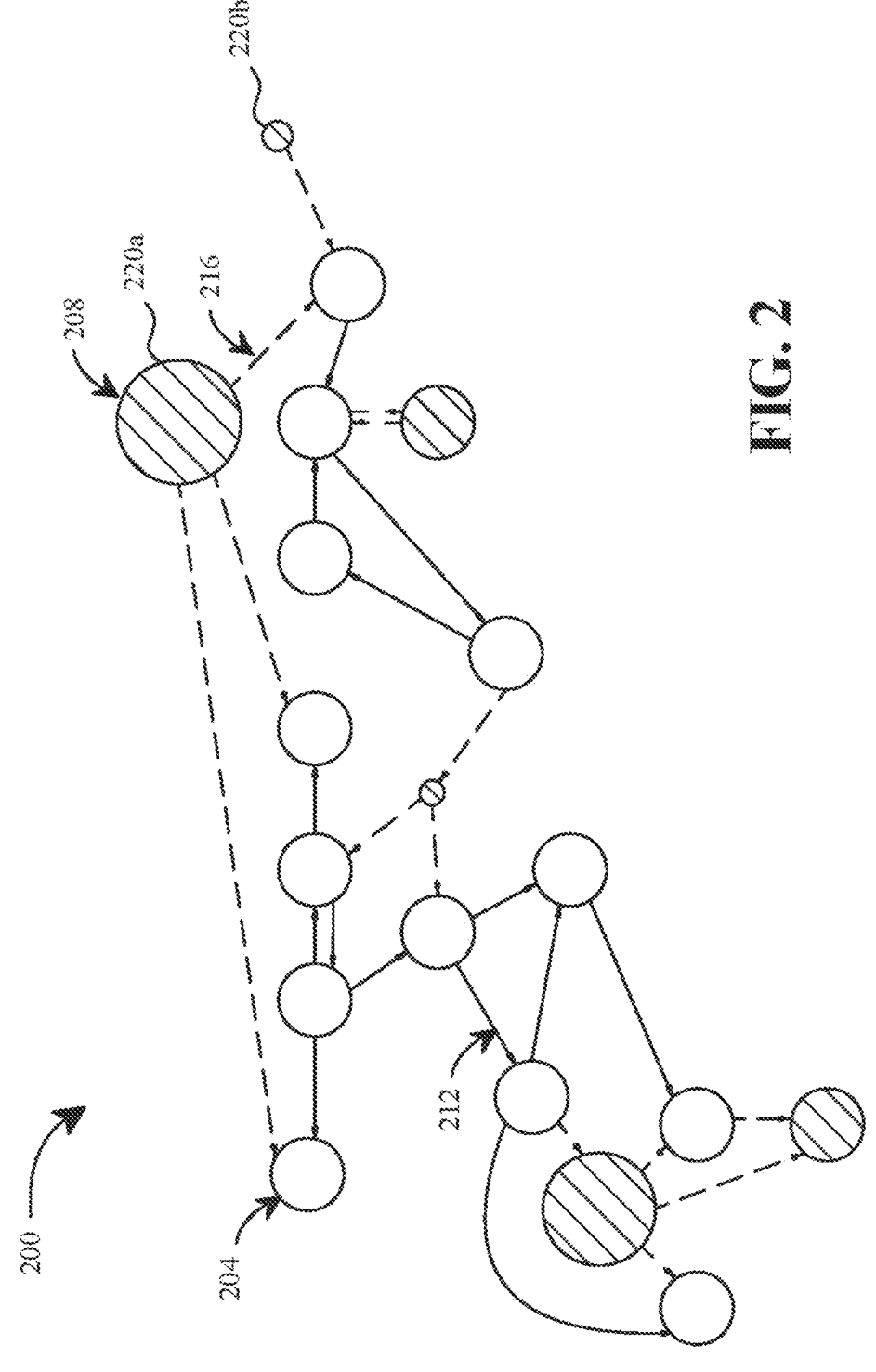
FIG. 2 illustrates an exemplary directed graph.

Referring now to FIG. 2, an exemplary directed graph 200 is illustrated. In some cases, directed graphs 200 may include visual representations of internal node 204, external node 208, internal directed edge 212, external directed edge 216, and the like. In some cases, visual representations of nodes may reflect weighted value or function score. As a non-limiting example, as shown in FIG. 2, a visual representation of a first external node 220a with higher weighted value may be bigger than a visual representation of a second external node 220b. In some cases, visual representation of internal node 204 and external node 208 may be different. As a non-limiting example, as shown in FIG. 2, visual representation of internal node 204 may be a solid circle and visual representation of external node 208 may be a colored or patterned circle. In some cases, visual representation of internal directed edge 212 and external directed edge 216 may be different. As a non-limiting example, as shown in FIG. 2, visual representation of internal directed edge 212 may be a solid line and visual representation of external directed edge 216 may be a dotted line.

Figure 3:
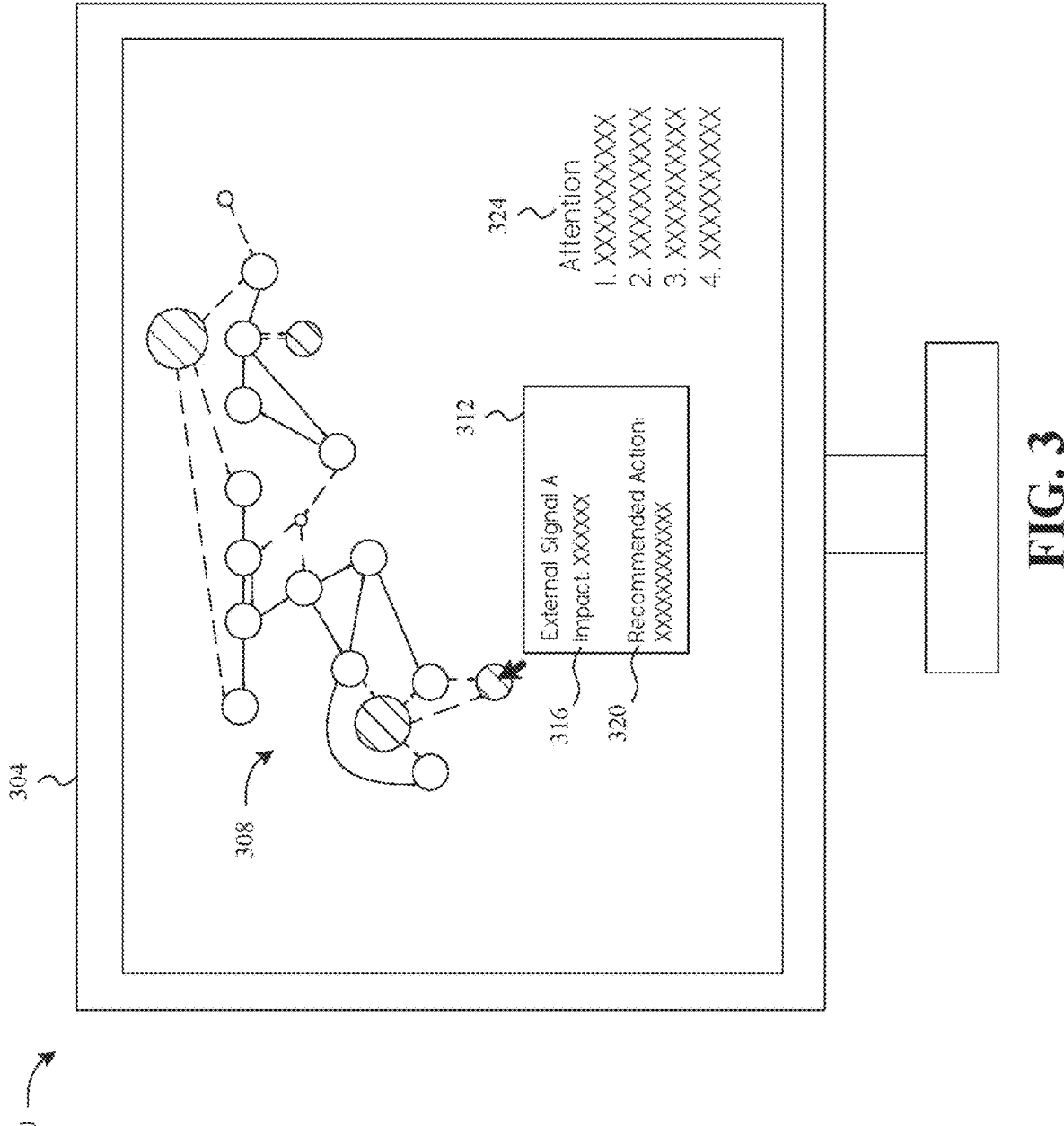
FIG. 3 illustrates an exemplary user interface.

Referring now to FIG. 3, an exemplary user interface 300 is illustrated. In some cases, user interface 300 may be displayed on a user device 304. In some cases, user interface 300 may include directed graph 308, pop-up window 312, function datum 316, action datum 320, actionable prompt 324, and the like. In some cases, pop-up window 312 may be rendered in response to user interaction with a particular node or edge within directed graph 308. As a non-limiting example, user interaction may include hovering over or clicking on a visual representation. In some cases, pop-up window 312 may display contextual information related to a selected component. In a non-limiting example, actionable prompt 324 may include a set of recommendations, questions, alerts, or summaries.

Figure 4:
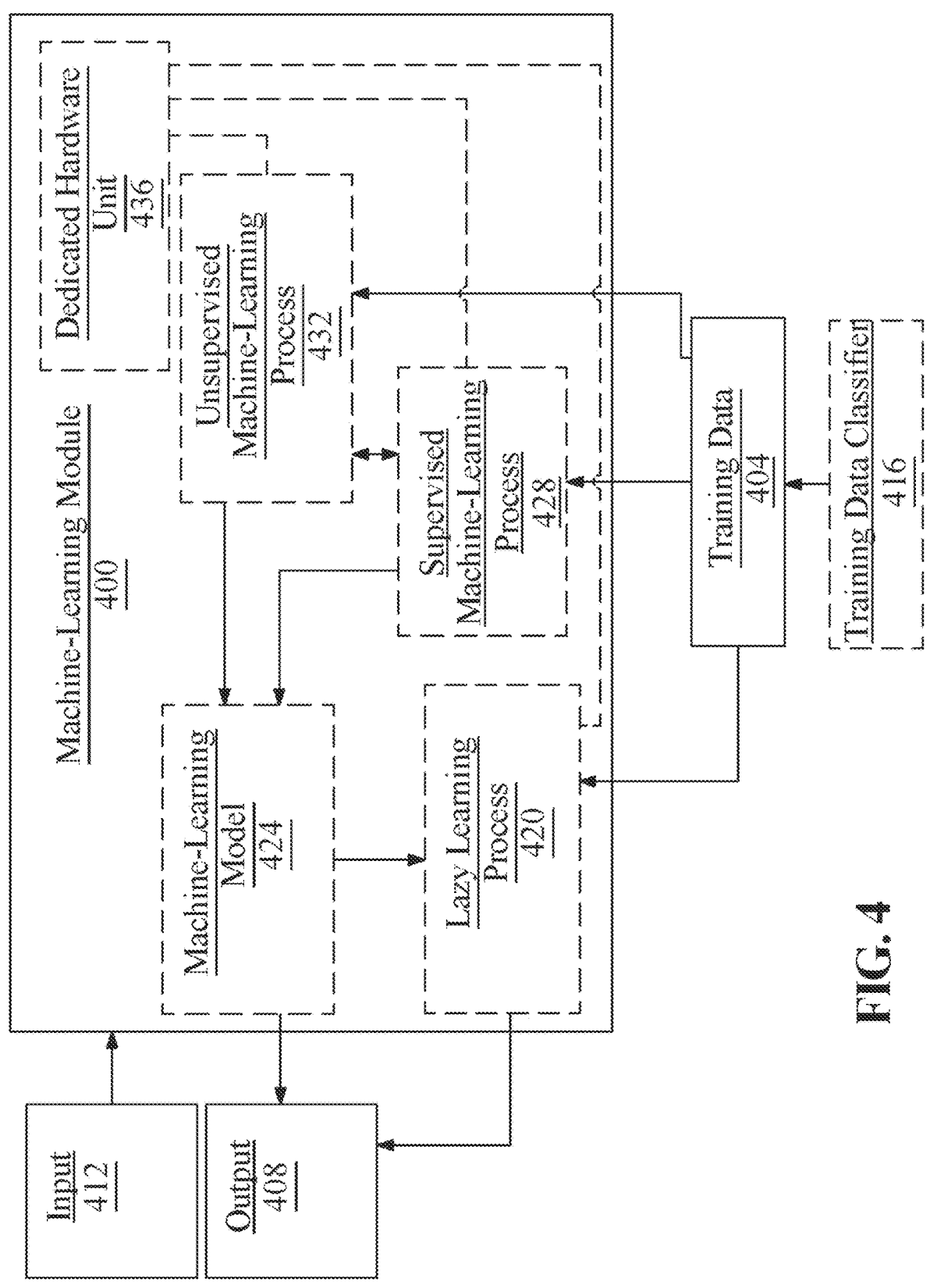
FIG. 4 illustrates a block diagram of an exemplary machine-learning module.

Referring now to FIG. 4, an exemplary embodiment of a machine-learning module 400 that may perform one or more machine-learning processes as described in this disclosure is illustrated. Machine-learning module may perform determinations, classification, and/or analysis steps, methods, processes, or the like as described in this disclosure using machine learning processes. A "machine learning process," as used in this disclosure, is a process that automatedly uses training data 404 to generate an algorithm instantiated in hardware or software logic, data structures, and/or functions that will be performed by a computing device/module to produce outputs 408 given data provided as inputs 412; this is in contrast to a non-machine learning software program where the commands to be executed are determined in advance by a user and written in a programming language.

Still referring to FIG. 4, "training data," as used herein, is data containing correlations that a machine-learning process may use to model relationships between two or more categories of data elements. For instance, and without limitation, training data 404 may include a plurality of data entries, also known as "training examples," each entry representing a set of data elements that were recorded, received, and/or generated together; data elements may be correlated by shared existence in a given data entry, by proximity in a given data entry, or the like. Multiple data entries in training data 404 may evince one or more trends in correlations between categories of data elements; for instance, and without limitation, a higher value of a first data element belonging to a first category of data element may tend to correlate to a higher value of a second data element belonging to a second category of data element, indicating a possible proportional or other mathematical relationship linking values belonging to the two categories. Multiple categories of data elements may be related in training data 404 according to various correlations; correlations may indicate causative and/or predictive links between categories of data elements, which may be modeled as relationships such as mathematical relationships by machine-learning processes as described in further detail below. Training data 404 may be formatted and/or organized by categories of data elements, for instance by associating data elements with one or more descriptors corresponding to categories of data elements. As a non-limiting example, training data 404 may include data entered in standardized forms by persons or processes, such that entry of a given data element in a given field in a form may be mapped to one or more descriptors of categories. Elements in training data 404 may be linked to descriptors of categories by tags, tokens, or other data elements; for instance, and without limitation, training data 404 may be provided in fixed-length formats, formats linking positions of data to categories such as comma-separated value (CSV) formats and/or self-describing formats such as extensible markup language (XML), JavaScript Object Notation (JSON), or the like, enabling processes or devices to detect categories of data.

Alternatively or additionally, and continuing to refer to FIG. 4, training data 404 may include one or more elements that are not categorized; that is, training data 404 may not be formatted or contain descriptors for some elements of data. Machine-learning algorithms and/or other processes may sort training data 404 according to one or more categorizations using, for instance, natural language processing algorithms, tokenization, detection of correlated values in raw data and the like; categories may be generated using correlation and/or other processing algorithms. As a non-limiting example, in a corpus of text, phrases making up a number "n" of compound words, such as nouns modified by other nouns, may be identified according to a statistically significant prevalence of n-grams containing such words in a particular order; such an n-gram may be categorized as an element of language such as a "word" to be tracked similarly to single words, generating a new category as a result of statistical analysis. Similarly, in a data entry including some textual data, a person's name may be identified by reference to a list, dictionary, or other compendium of terms, permitting ad-hoc categorization by machine-learning algorithms, and/or automated association of data in the data entry with descriptors or into a given format. The ability to categorize data entries automatedly may enable the same training data 404 to be made applicable for two or more distinct machine-learning algorithms as described in further detail below. Training data 404 used by machine-learning module 400 may correlate any input data as described in this disclosure to any output data as described in this disclosure. As a non-limiting illustrative example, input data may include external data, internal data, external feature, internal feature, internal embedding, external embedding, weighted value, function score, function datum, and the like. As a nonlimiting illustrative example, output data may include external feature, internal feature, internal embedding, external embedding, weighted value, function score, function datum, action datum, data extrapolation, actionable prompt, directed graph, and the like.

Further referring to FIG. 4, training data may be filtered, sorted, and/or selected using one or more supervised and/or unsupervised machine-learning processes and/or models as described in further detail below; such models may include without limitation a training data classifier 416. Training data classifier 416 may include a "classifier," which as used in this disclosure is a machine-learning model as defined below, such as a data structure representing and/or using a mathematical model, neural net, or program generated by a machine learning algorithm known as a "classification algorithm," as described in further detail below, that sorts inputs into categories or bins of data, outputting the categories or bins of data and/or labels associated therewith. A classifier may be configured to output at least a datum that labels or otherwise identifies a set of data that are clustered together, found to be close under a distance metric as described below, or the like. A distance metric may include any norm, such as, without limitation, a Pythagorean norm. Machine-learning module 400 may generate a classifier using a classification algorithm, defined as a process whereby a computing device and/or any module and/or component operating thereon derives a classifier from training data 404. Classification may be performed using, without limitation, linear classifiers such as without limitation logistic regression and/or naive Bayes classifiers, nearest neighbor classifiers such as k-nearest neighbors classifiers, support vector machines, least squares support vector machines, fisher's linear discriminant, quadratic classifiers, decision trees, boosted trees, random forest classifiers, learning vector quantization, and/or neural network-based classifiers. As a non-limiting example, training data classifier 416 may classify elements of training data to user cohort associated with a user's industry field, size of an organization, target or goal, and the like.

Still referring to FIG. 4, computing device may be configured to generate a classifier using a Naïve Bayes classification algorithm. Naïve Bayes classification algorithm generates classifiers by assigning class labels to problem instances, represented as vectors of element values. Class labels are drawn from a finite set. Naïve Bayes classification algorithm may include generating a family of algorithms that assume that the value of a particular element is independent of the value of any other element, given a class variable. Naïve Bayes classification algorithm may be based on Bayes Theorem expressed as $P(A/B)=P(B/A)\,P(A)\div P(B)$, where $P(A/B)$ is the probability of hypothesis A given data B also known as posterior probability; $P(B/A)$ is the probability of data B given that the hypothesis A was true; $P(A)$ is the probability of hypothesis A being true regardless of data also known as prior probability of A; and $P(B)$ is the probability of the data regardless of the hypothesis. A naïve Bayes algorithm may be generated by first transforming training data into a frequency table. Computing device may then calculate a likelihood table by calculating probabilities of different data entries and classification labels. Computing device may utilize a naïve Bayes equation to calculate a posterior probability for each class. A class containing the highest posterior probability is the outcome of prediction. Naïve Bayes classification algorithm may include a gaussian model that follows a normal distribution. Naïve Bayes classification algorithm may include a multinomial model that is used for discrete counts. Naïve Bayes classification algorithm may include a Bernoulli model that may be utilized when vectors are binary.

With continued reference to FIG. 4, computing device may be configured to generate a classifier using a K-nearest neighbors (KNN) algorithm. A "K-nearest neighbors algorithm" as used in this disclosure, includes a classification method that utilizes feature similarity to analyze how closely out-of-sample-features resemble training data to classify input data to one or more clusters and/or categories of features as represented in training data; this may be performed by representing both training data and input data in vector forms, and using one or more measures of vector similarity to identify classifications within training data, and to determine a classification of input data. K-nearest neighbors algorithm may include specifying a K-value, or a number directing the classifier to select the k most similar entries training data to a given sample, determining the most common classifier of the entries in the database, and classifying the known sample; this may be performed recursively and/or iteratively to generate a classifier that may be used to classify input data as further samples. For instance, an initial set of samples may be performed to cover an initial heuristic and/or "first guess" at an output and/or relationship, which may be seeded, without limitation, using expert input received according to any process as described herein. As a non-limiting example, an initial heuristic may include a ranking of associations between inputs and elements of training data. Heuristic may include selecting some number of highest-ranking associations and/or training data elements.

With continued reference to FIG. 4, generating k-nearest neighbors algorithm may generate a first vector output containing a data entry cluster, generating a second vector output containing an input data, and calculate the distance between the first vector output and the second vector output using any suitable norm such as cosine similarity, Euclidean distance measurement, or the like. Each vector output may be represented, without limitation, as an n-tuple of values, where n is at least two values. Each value of n-tuple of values may represent a measurement or other quantitative value associated with a given category of data, or attribute, examples of which are provided in further detail below; a vector may be represented, without limitation, in n-dimensional space using an axis per category of value represented in n-tuple of values, such that a vector has a geometric direction characterizing the relative quantities of attributes in the n-tuple as compared to each other. Two vectors may be considered equivalent where their directions, and/or the relative quantities of values within each vector as compared to each other, are the same; thus, as a non-limiting example, a vector represented as [5, 10, 15] may be treated as equivalent, for purposes of this disclosure, as a vector represented as [1, 2, 3]. Vectors may be more similar where their directions are more similar, and more different where their directions are more divergent; however, vector similarity may alternatively or additionally be determined using averages of similarities between like attributes, or any other measure of similarity suitable for any n-tuple of values, or aggregation of numerical similarity measures for the purposes of loss functions as described in further detail below. Any vectors as described herein may be scaled, such that each vector represents each attribute along an equivalent scale of values. Each vector may be "normalized," or divided by a "length" attribute, such as a length attribute l as derived using a Pythagorean norm:

$$l = \sqrt{\sum_{i=0}^{n} a_i^2},$$

where $a_i$ is attribute number i of the vector. Scaling and/or normalization may function to make vector comparison independent of absolute quantities of attributes, while preserving any dependency on similarity of attributes; this may, for instance, be advantageous where cases represented in training data are represented by different quantities of samples, which may result in proportionally equivalent vectors with divergent values.

With further reference to FIG. 4, training examples for use as training data may be selected from a population of potential examples according to cohorts relevant to an analytical problem to be solved, a classification task, or the like. Alternatively or additionally, training data may be selected to span a set of likely circumstances or inputs for a machine-learning model and/or process to encounter when deployed. For instance, and without limitation, for each category of input data to a machine-learning process or model that may exist in a range of values in a population of phenomena such as images, user data, process data, physical data, or the like, a computing device, processor, and/or machine-learning model may select training examples representing each possible value on such a range and/or a representative sample of values on such a range. Selection of a representative sample may include selection of training examples in proportions matching a statistically determined and/or predicted distribution of such values according to relative frequency, such that, for instance, values encountered more frequently in a population of data so analyzed are represented by more training examples than values that are encountered less frequently. Alternatively or additionally, a set of training examples may be compared to a collection of representative values in a database and/or presented to a user, so that a process can detect, automatically or via user input, one or more values that are not included in the set of training examples. Computing device, processor, and/or module may automatically generate a missing training example; this may be done by receiving and/or retrieving a missing input and/or output value and correlating the missing input and/or output value with a corresponding output and/or input value collocated in a data record with the retrieved value, provided by a user and/or other device, or the like.

Continuing to refer to FIG. 4, computer, processor, and/or module may be configured to preprocess training data. "Preprocessing" training data, as used in this disclosure, is transforming training data from raw form to a format that can be used for training a machine learning model. Preprocessing may include sanitizing, feature selection, feature scaling, data augmentation and the like.

Still referring to FIG. 4, computer, processor, and/or module may be configured to sanitize training data. "Sanitizing" training data, as used in this disclosure, is a process whereby training examples are removed that interfere with convergence of a machine-learning model and/or process to a useful result. For instance, and without limitation, a training example may include an input and/or output value that is an outlier from typically encountered values, such that a machine-learning algorithm using the training example will be adapted to an unlikely amount as an input and/or output; a value that is more than a threshold number of standard deviations away from an average, mean, or expected value, for instance, may be eliminated. Alternatively or additionally, one or more training examples may be identified as having poor quality data, where "poor quality" is defined as having a signal to noise ratio below a threshold value. Sanitizing may include steps such as removing duplicative or otherwise redundant data, interpolating missing data, correcting data errors, standardizing data, identifying outliers, and the like. In a nonlimiting example, sanitization may include utilizing algorithms for identifying duplicate entries or spell-check algorithms.

As a non-limiting example, and with further reference to FIG. 4, images used to train an image classifier or other machine-learning model and/or process that takes images as inputs or generates images as outputs may be rejected if image quality is below a threshold value. For instance, and without limitation, computing device, processor, and/or module may perform blur detection, and eliminate one or more Blur detection may be performed, as a non-limiting example, by taking Fourier transform, or an approximation such as a Fast Fourier Transform (FFT) of the image and analyzing a distribution of low and high frequencies in the resulting frequency-domain depiction of the image; numbers of high-frequency values below a threshold level may indicate blurriness. As a further non-limiting example, detection of blurriness may be performed by convolving an image, a channel of an image, or the like with a Laplacian kernel; this may generate a numerical score reflecting a number of rapid changes in intensity shown in the image, such that a high score indicates clarity and a low score indicates blurriness. Blurriness detection may be performed using a gradient-based operator, which measures operators based on the gradient or first derivative of an image, based on the hypothesis that rapid changes indicate sharp edges in the image, and thus are indicative of a lower degree of blurriness. Blur detection may be performed using Wavelet-based operator, which takes advantage of the capability of coefficients of the discrete wavelet transform to describe the frequency and spatial content of images. Blur detection may be performed using statistics-based operators take advantage of several image statistics as texture descriptors in order to compute a focus level. Blur detection may be performed by using discrete cosine transform (DCT) coefficients in order to compute a focus level of an image from its frequency content.

Continuing to refer to FIG. 4, computing device, processor, and/or module may be configured to precondition one or more training examples. For instance, and without limitation, where a machine learning model and/or process has one or more inputs and/or outputs requiring, transmitting, or receiving a certain number of bits, samples, or other units of data, one or more training examples' elements to be used as or compared to inputs and/or outputs may be modified to have such a number of units of data. For instance, a computing device, processor, and/or module may convert a smaller number of units, such as in a low pixel count image, into a desired number of units, for instance by upsampling and interpolating. As a non-limiting example, a low pixel count image may have 100 pixels, however a desired number of pixels may be 128. Processor may interpolate the low pixel count image to convert the 100 pixels into 128 pixels. It should also be noted that one of ordinary skill in the art, upon reading this disclosure, would know the various methods to interpolate a smaller number of data units such as samples, pixels, bits, or the like to a desired number of such units. In some instances, a set of interpolation rules may be trained by sets of highly detailed inputs and/or outputs and corresponding inputs and/or outputs downsampled to smaller numbers of units, and a neural network or other machine learning model that is trained to predict interpolated pixel values using the training data. As a non-limiting example, a sample input and/or output, such as a sample picture, with sample-expanded data units (e.g., pixels added between the original pixels) may be input to a neural network or machine-learning model and output a pseudo replica sample-picture with dummy values assigned to pixels between the original pixels based on a set of interpolation rules. As a non-limiting example, in the context of an image classifier, a machine-learning model may have a set of interpolation rules trained by sets of highly detailed images and images that have been downsampled to smaller numbers of pixels, and a neural network or other machine learning model that is trained using those examples to predict interpolated pixel values in a facial picture context. As a result, an input with sample-expanded data units (the ones added between the original data units, with dummy values) may be run through a trained neural network and/or model, which may fill in values to replace the dummy values. Alternatively or additionally, processor, computing device, and/or module may utilize sample expander methods, a low-pass filter, or both. As used in this disclosure, a "low-pass filter" is a filter that passes signals with a frequency lower than a selected cutoff frequency and attenuates signals with frequencies higher than the cutoff frequency. The exact frequency response of the filter depends on the filter design. Computing device, processor, and/or module may use averaging, such as luma or chroma averaging in images, to fill in data units in between original data units.

In some embodiments, and with continued reference to FIG. 4, computing device, processor, and/or module may down-sample elements of a training example to a desired lower number of data elements. As a non-limiting example, a high pixel count image may have 256 pixels, however a desired number of pixels may be 128. Processor may down-sample the high pixel count image to convert the 256 pixels into 128 pixels. In some embodiments, processor may be configured to perform downsampling on data. Downsampling, also known as decimation, may include removing every Nth entry in a sequence of samples, all but every Nth entry, or the like, which is a process known as "compression," and may be performed, for instance by an N-sample compressor implemented using hardware or software. Anti-aliasing and/or anti-imaging filters, and/or low-pass filters, may be used to clean up side-effects of compression.

Further referring to FIG. 4, feature selection includes narrowing and/or filtering training data to exclude features and/or elements, or training data including such elements, that are not relevant to a purpose for which a trained machine-learning model and/or algorithm is being trained, and/or collection of features and/or elements, or training data including such elements, on the basis of relevance or utility for an intended task or purpose for a trained machine-learning model and/or algorithm is being trained. Feature selection may be implemented, without limitation, using any process described in this disclosure, including without limitation using training data classifiers, exclusion of outliers, or the like.

With continued reference to FIG. 4, feature scaling may include, without limitation, normalization of data entries, which may be accomplished by dividing numerical fields by norms thereof, for instance as performed for vector normalization. Feature scaling may include absolute maximum scaling, wherein each quantitative datum is divided by the maximum absolute value of all quantitative data of a set or subset of quantitative data. Feature scaling may include min-max scaling, in which each value X has a minimum value $X_{min}$ in a set or subset of values subtracted therefrom, with the result divided by the range of the values, give maximum value in the set or subset $$X_{max}: X_{new} = \frac{X - X_{min}}{X_{max} - X_{min}}.$$

Feature scaling may include mean normalization, which involves use of a mean value of a set and/or subset of values, $X_{mean}$ with maximum and minimum values:

$$X_{new} = \frac{X - X_{mean}}{X_{max} - X_{min}}.$$

Feature scaling may include standardization, where a difference between X and $X_{mean}$ is divided by a standard deviation $\sigma$ of a set or subset of values:

$$X_{new} = \frac{X - X_{mean}}{\sigma}.$$

Scaling may be performed using a median value of a a set or subset $X_{median}$ and/or interquartile range (IQR), which represents the difference between the $25^{th}$ percentile value and the $50^{th}$ percentile value (or closest values thereto by a rounding protocol), such as:

$$X_{new} = \frac{X - X_{median}}{IQR}.$$

Persons skilled in the art, upon reviewing the entirety of this disclosure, will be aware of various alternative or additional approaches that may be used for feature scaling.

Further referring to FIG. 4, computing device, processor, and/or module may be configured to perform one or more processes of data augmentation. "Data augmentation" as used in this disclosure is addition of data to a training set using elements and/or entries already in the dataset. Data augmentation may be accomplished, without limitation, using interpolation, generation of modified copies of existing entries and/or examples, and/or one or more generative AI processes, for instance using deep neural networks and/or generative adversarial networks; generative processes may be referred to alternatively in this context as "data synthesis" and as creating "synthetic data." Augmentation may include performing one or more transformations on data, such as geometric, color space, affine, brightness, cropping, and/or contrast transformations of images.

Still referring to FIG. 4, machine-learning module 400 may be configured to perform a lazy-learning process 420 and/or protocol, which may alternatively be referred to as a "lazy loading" or "call-when-needed" process and/or protocol, may be a process whereby machine learning is conducted upon receipt of an input to be converted to an output, by combining the input and training set to derive the algorithm to be used to produce the output on demand. For instance, an initial set of simulations may be performed to cover an initial heuristic and/or "first guess" at an output and/or relationship. As a non-limiting example, an initial heuristic may include a ranking of associations between inputs and elements of training data 404. Heuristic may include selecting some number of highest-ranking associations and/or training data 404 elements. Lazy learning may implement any suitable lazy learning algorithm, including without limitation a K-nearest neighbors algorithm, a lazy naïve Bayes algorithm, or the like; persons skilled in the art, upon reviewing the entirety of this disclosure, will be aware of various lazy-learning algorithms that may be applied to generate outputs as described in this disclosure, including without limitation lazy learning applications of machine-learning algorithms as described in further detail below.

Alternatively or additionally, and with continued reference to FIG. 4, machine-learning processes as described in this disclosure may be used to generate machine-learning models 424. A "machine-learning model," as used in this disclosure, is a data structure representing and/or instantiating a mathematical and/or algorithmic representation of a relationship between inputs and outputs, as generated using any machine-learning process including without limitation any process as described above, and stored in memory; an input is submitted to a machine-learning model 424 once created, which generates an output based on the relationship that was derived. For instance, and without limitation, a linear regression model, generated using a linear regression algorithm, may compute a linear combination of input data using coefficients derived during machine-learning processes to calculate an output datum. As a further non-limiting example, a machine-learning model 424 may be generated by creating an artificial neural network, such as a convolutional neural network comprising an input layer of nodes, one or more intermediate layers, and an output layer of nodes. Connections between nodes may be created via the process of "training" the network, in which elements from a training data 404 set are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning.

Still referring to FIG. 4, machine-learning algorithms may include at least a supervised machine-learning process 428. At least a supervised machine-learning process 428, as defined herein, include algorithms that receive a training set relating a number of inputs to a number of outputs, and seek to generate one or more data structures representing and/or instantiating one or more mathematical relations relating inputs to outputs, where each of the one or more mathematical relations is optimal according to some criterion specified to the algorithm using some scoring function. For instance, a supervised learning algorithm may include external data, internal data, external feature, internal feature, internal embedding, external embedding, weighted value, function score, function datum, and the like as described above as inputs, external feature, internal feature, internal embedding, external embedding, weighted value, function score, function datum, action datum, data extrapolation, actionable prompt, directed graph, and the like as outputs, and a scoring function representing a desired form of relationship to be detected between inputs and outputs; scoring function may, for instance, seek to maximize the probability that a given input and/or combination of elements inputs is associated with a given output to minimize the probability that a given input is not associated with a given output. Scoring function may be expressed as a risk function representing an "expected loss" of an algorithm relating inputs to outputs, where loss is computed as an error function representing a degree to which a prediction generated by the relation is incorrect when compared to a given input-output pair provided in training data 404. Persons skilled in the art, upon reviewing the entirety of this disclosure, will be aware of various possible variations of at least a supervised machine-learning process 428 that may be used to determine relation between inputs and outputs. Supervised machine-learning processes may include classification algorithms as defined above.

With further reference to FIG. 4, training a supervised machine-learning process may include, without limitation, iteratively updating coefficients, biases, weights based on an error function, expected loss, and/or risk function. For instance, an output generated by a supervised machine-learning model using an input example in a training example may be compared to an output example from the training example; an error function may be generated based on the comparison, which may include any error function suitable for use with any machine-learning algorithm described in this disclosure, including a square of a difference between one or more sets of compared values or the like. Such an error function may be used in turn to update one or more weights, biases, coefficients, or other parameters of a machine-learning model through any suitable process including, without limitation, gradient descent processes, least-squares processes, and/or other processes described in this disclosure. This may be done iteratively and/or recursively to gradually tune such weights, biases, coefficients, or other parameters. Updating may be performed, in neural networks, using one or more back-propagation algorithms. Iterative and/or recursive updates to weights, biases, coefficients, or other parameters as described above may be performed until currently available training data is exhausted and/or until a convergence test is passed, where a "convergence test" is a test for a condition selected as indicating that a model and/or weights, biases, coefficients, or other parameters thereof has reached a degree of accuracy. A convergence test may, for instance, compare a difference between two or more successive errors or error function values, where differences below a threshold amount may be taken to indicate convergence. Alternatively or additionally, one or more errors and/or error function values evaluated in training iterations may be compared to a threshold.

Still referring to FIG. 4, a computing device, processor, and/or module may be configured to perform method, method step, sequence of method steps and/or algorithm described in reference to this figure, in any order and with any degree of repetition. For instance, a computing device, processor, and/or module may be configured to perform a single step, sequence and/or algorithm repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. A computing device, processor, and/or module may perform any step, sequence of steps, or algorithm in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Further referring to FIG. 4, machine learning processes may include at least an unsupervised machine-learning processes 432. An unsupervised machine-learning process, as used herein, is a process that derives inferences in datasets without regard to labels; as a result, an unsupervised machine-learning process may be free to discover any structure, relationship, and/or correlation provided in the data. Unsupervised processes 432 may not require a response variable; unsupervised processes 432 may be used to find interesting patterns and/or inferences between variables, to determine a degree of correlation between two or more variables, or the like.

Still referring to FIG. 4, machine-learning module 400 may be designed and configured to create a machine-learning model 424 using techniques for development of linear regression models. Linear regression models may include ordinary least squares regression, which aims to minimize the square of the difference between predicted outcomes and actual outcomes according to an appropriate norm for measuring such a difference (e.g., a vector-space distance norm); coefficients of the resulting linear equation may be modified to improve minimization. Linear regression models may include ridge regression methods, where the function to be minimized includes the least-squares function plus term multiplying the square of each coefficient by a scalar amount to penalize large coefficients. Linear regression models may include least absolute shrinkage and selection operator (LASSO) models, in which ridge regression is combined with multiplying the least-squares term by a factor of 1 divided by double the number of samples. Linear regression models may include a multi-task lasso model wherein the norm applied in the least-squares term of the lasso model is the Frobenius norm amounting to the square root of the sum of squares of all terms. Linear regression models may include the elastic net model, a multi-task elastic net model, a least angle regression model, a LARS lasso model, an orthogonal matching pursuit model, a Bayesian regression model, a logistic regression model, a stochastic gradient descent model, a perceptron model, a passive aggressive algorithm, a robustness regression model, a Huber regression model, or any other suitable model that may occur to persons skilled in the art upon reviewing the entirety of this disclosure. Linear regression models may be generalized in an embodiment to polynomial regression models, whereby a polynomial equation (e.g. a quadratic, cubic or higher-order equation) providing a best predicted output/actual output fit is sought; similar methods to those described above may be applied to minimize error functions, as will be apparent to persons skilled in the art upon reviewing the entirety of this disclosure.

Continuing to refer to FIG. 4, machine-learning algorithms may include, without limitation, linear discriminant analysis. Machine-learning algorithm may include quadratic discriminant analysis. Machine-learning algorithms may include kernel ridge regression. Machine-learning algorithms may include support vector machines, including, without limitation, support vector classification-based regression processes. Machine-learning algorithms may include stochastic gradient descent algorithms, including classification and regression algorithms based on stochastic gradient descent. Machine-learning algorithms may include nearest neighbors algorithms. Machine-learning algorithms may include various forms of latent space regularization such as variational regularization. Machine-learning algorithms may include Gaussian processes such as Gaussian Process Regression. Machine-learning algorithms may include cross-decomposition algorithms, including partial least squares and/or canonical correlation analysis. Machine-learning algorithms may include naïve Bayes methods. Machine-learning algorithms may include algorithms based on decision trees, such as decision tree classification or regression algorithms. Machine-learning algorithms may include ensemble methods such as bagging meta-estimator, forest of randomized trees, AdaBoost, gradient tree boosting, and/or voting classifier methods. Machine-learning algorithms may include neural net algorithms, including convolutional neural net processes.

Still referring to FIG. 4, a machine-learning model and/or process may be deployed or instantiated by incorporation into a program, apparatus, system and/or module. For instance, and without limitation, a machine-learning model, neural network, and/or some or all parameters thereof may be stored and/or deployed in any memory or circuitry. Parameters such as coefficients, weights, and/or biases may be stored as circuit-based constants, such as arrays of wires and/or binary inputs and/or outputs set at logic "1" and "0" voltage levels in a logic circuit to represent a number according to any suitable encoding system including twos complement or the like or may be stored in any volatile and/or non-volatile memory. Similarly, mathematical operations and input and/or output of data to or from models, neural network layers, or the like may be instantiated in hardware circuitry and/or in the form of instructions in firmware, machine-code such as binary operation code instructions, assembly language, or any higher-order programming language. Any technology for hardware and/or software instantiation of memory, instructions, data structures, and/or algorithms may be used to instantiate a machine-learning process and/or model, including without limitation any combination of production and/or configuration of non-reconfigurable hardware elements, circuits, and/or modules such as without limitation ASICs, production and/or configuration of reconfigurable hardware elements, circuits, and/or modules such as without limitation FPGAs, production and/or of non-reconfigurable and/or configuration non-rewritable memory elements, circuits, and/or modules such as without limitation non-rewritable ROM, production and/or configuration of reconfigurable and/or rewritable memory elements, circuits, and/or modules such as without limitation rewritable ROM or other memory technology described in this disclosure, and/or production and/or configuration of any computing device and/or component thereof as described in this disclosure. Such deployed and/or instantiated machine-learning model and/or algorithm may receive inputs from any other process, module, and/or component described in this disclosure, and produce outputs to any other process, module, and/or component described in this disclosure.

Continuing to refer to FIG. 4, any process of training, retraining, deployment, and/or instantiation of any machine-learning model and/or algorithm may be performed and/or repeated after an initial deployment and/or instantiation to correct, refine, and/or improve the machine-learning model and/or algorithm. Such retraining, deployment, and/or instantiation may be performed as a periodic or regular process, such as retraining, deployment, and/or instantiation at regular elapsed time periods, after some measure of volume such as a number of bytes or other measures of data processed, a number of uses or performances of processes described in this disclosure, or the like, and/or according to a software, firmware, or other update schedule. Alternatively or additionally, retraining, deployment, and/or instantiation may be event-based, and may be triggered, without limitation, by user inputs indicating sub-optimal or otherwise problematic performance and/or by automated field testing and/or auditing processes, which may compare outputs of machine-learning models and/or algorithms, and/or errors and/or error functions thereof, to any thresholds, convergence tests, or the like, and/or may compare outputs of processes described herein to similar thresholds, convergence tests or the like. Event-based retraining, deployment, and/or instantiation may alternatively or additionally be triggered by receipt and/or generation of one or more new training examples; a number of new training examples may be compared to a preconfigured threshold, where exceeding the preconfigured threshold may trigger retraining, deployment, and/or instantiation.

Still referring to FIG. 4, retraining and/or additional training may be performed using any process for training described above, using any currently or previously deployed version of a machine-learning model and/or algorithm as a starting point. Training data for retraining may be collected, preconditioned, sorted, classified, sanitized or otherwise processed according to any process described in this disclosure. Training data may include, without limitation, training examples including inputs and correlated outputs used, received, and/or generated from any version of any system, module, machine-learning model or algorithm, apparatus, and/or method described in this disclosure; such examples may be modified and/or labeled according to user feedback or other processes to indicate desired results, and/or may have actual or measured results from a process being modeled and/or predicted by system, module, machine-learning model or algorithm, apparatus, and/or method as "desired" results to be compared to outputs for training processes as described above.

Redeployment may be performed using any reconfiguring and/or rewriting of reconfigurable and/or rewritable circuit and/or memory elements; alternatively, redeployment may be performed by production of new hardware and/or software components, circuits, instructions, or the like, which may be added to and/or may replace existing hardware and/or software components, circuits, instructions, or the like.

Further referring to FIG. 4, one or more processes or algorithms described above may be performed by at least a dedicated hardware unit 436. A "dedicated hardware unit," for the purposes of this figure, is a hardware component, circuit, or the like, aside from a principal control circuit and/or processor performing method steps as described in this disclosure, that is specifically designated or selected to perform one or more specific tasks and/or processes described in reference to this figure, such as without limitation preconditioning and/or sanitization of training data and/or training a machine-learning algorithm and/or model. A dedicated hardware unit 436 may include, without limitation, a hardware unit that can perform iterative or massed calculations, such as matrix-based calculations to update or tune parameters, weights, coefficients, and/or biases of machine-learning models and/or neural networks, efficiently using pipelining, parallel processing, or the like; such a hardware unit may be optimized for such processes by, for instance, including dedicated circuitry for matrix and/or signal processing operations that includes, e.g., multiple arithmetic and/or logical circuit units such as multipliers and/or adders that can act simultaneously and/or in parallel or the like. Such dedicated hardware units 436 may include, without limitation, graphical processing units (GPUs), dedicated signal processing modules, FPGA or other reconfigurable hardware that has been configured to instantiate parallel processing units for one or more specific tasks, or the like, A computing device, processor, apparatus, or module may be configured to instruct one or more dedicated hardware units 436 to perform one or more operations described herein, such as evaluation of model and/or algorithm outputs, one-time or iterative updates to parameters, coefficients, weights, and/or biases, and/or any other operations such as vector and/or matrix operations as described in this disclosure.

Figure 5:
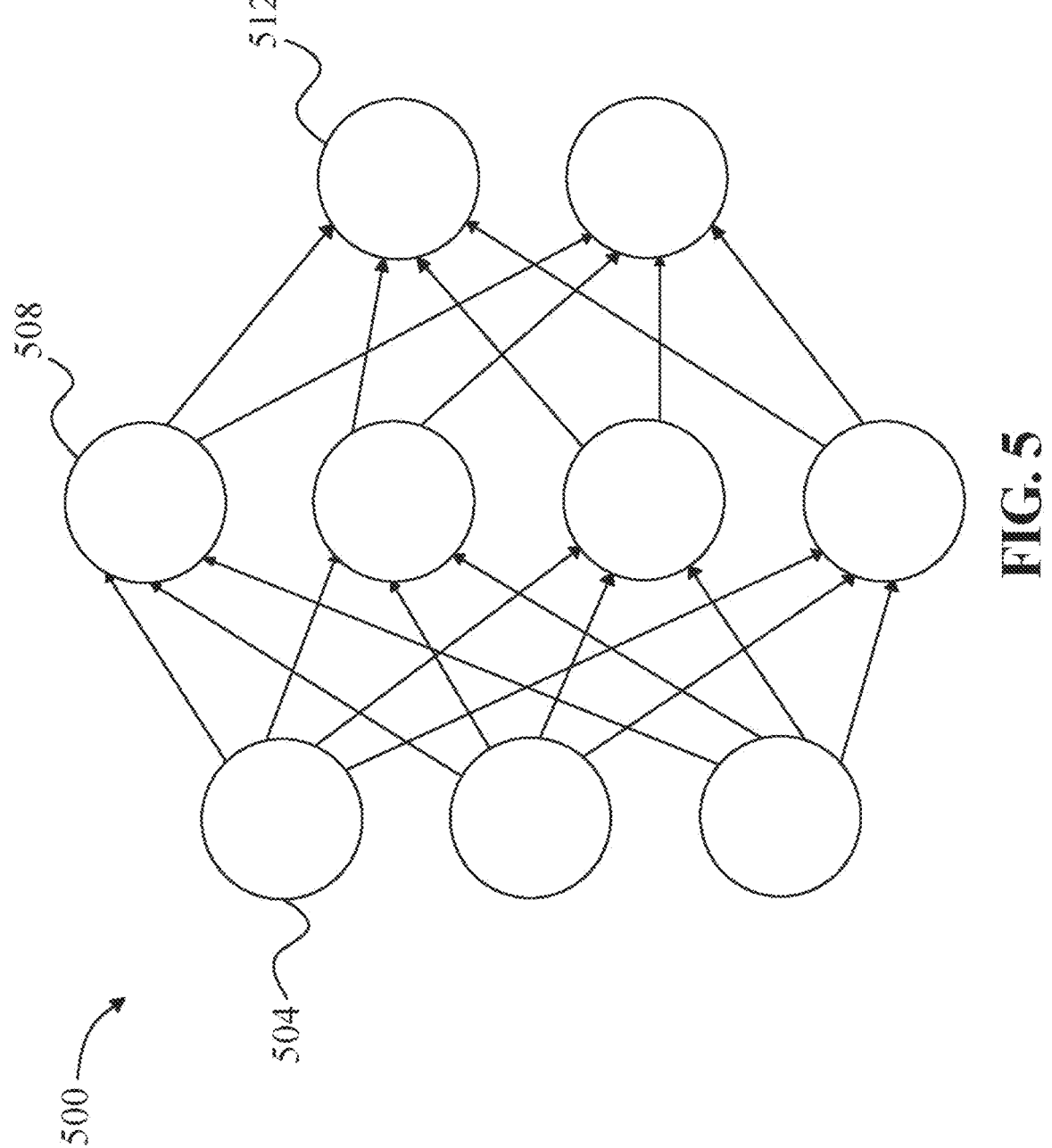
FIG. 5 illustrates a diagram of an exemplary neural network.

Referring now to FIG. 5, an exemplary embodiment of neural network 500 is illustrated. A neural network 500 also known as an artificial neural network, is a network of "nodes," or data structures having one or more inputs, one or more outputs, and a function determining outputs based on inputs. Such nodes may be organized in a network, such as without limitation a convolutional neural network, including an input layer of nodes 504, one or more intermediate layers 508, and an output layer of nodes 512. Connections between nodes may be created via the process of "training" the network, in which elements from a training dataset are applied to the input nodes, a suitable training algorithm (such as Levenberg-Marquardt, conjugate gradient, simulated annealing, or other algorithms) is then used to adjust the connections and weights between nodes in adjacent layers of the neural network to produce the desired values at the output nodes. This process is sometimes referred to as deep learning. Connections may run solely from input nodes toward output nodes in a "feed-forward" network or may feed outputs of one layer back to inputs of the same or a different layer in a "recurrent network." As a further non-limiting example, a neural network may include a convolutional neural network comprising an input layer of nodes, one or more intermediate layers, and an output layer of nodes. A "convolutional neural network," as used in this disclosure, is a neural network in which at least one hidden layer is a convolutional layer that convolves inputs to that layer with a subset of inputs known as a "kernel," along with one or more additional layers such as pooling layers, fully connected layers, and the like.

Figure 6:
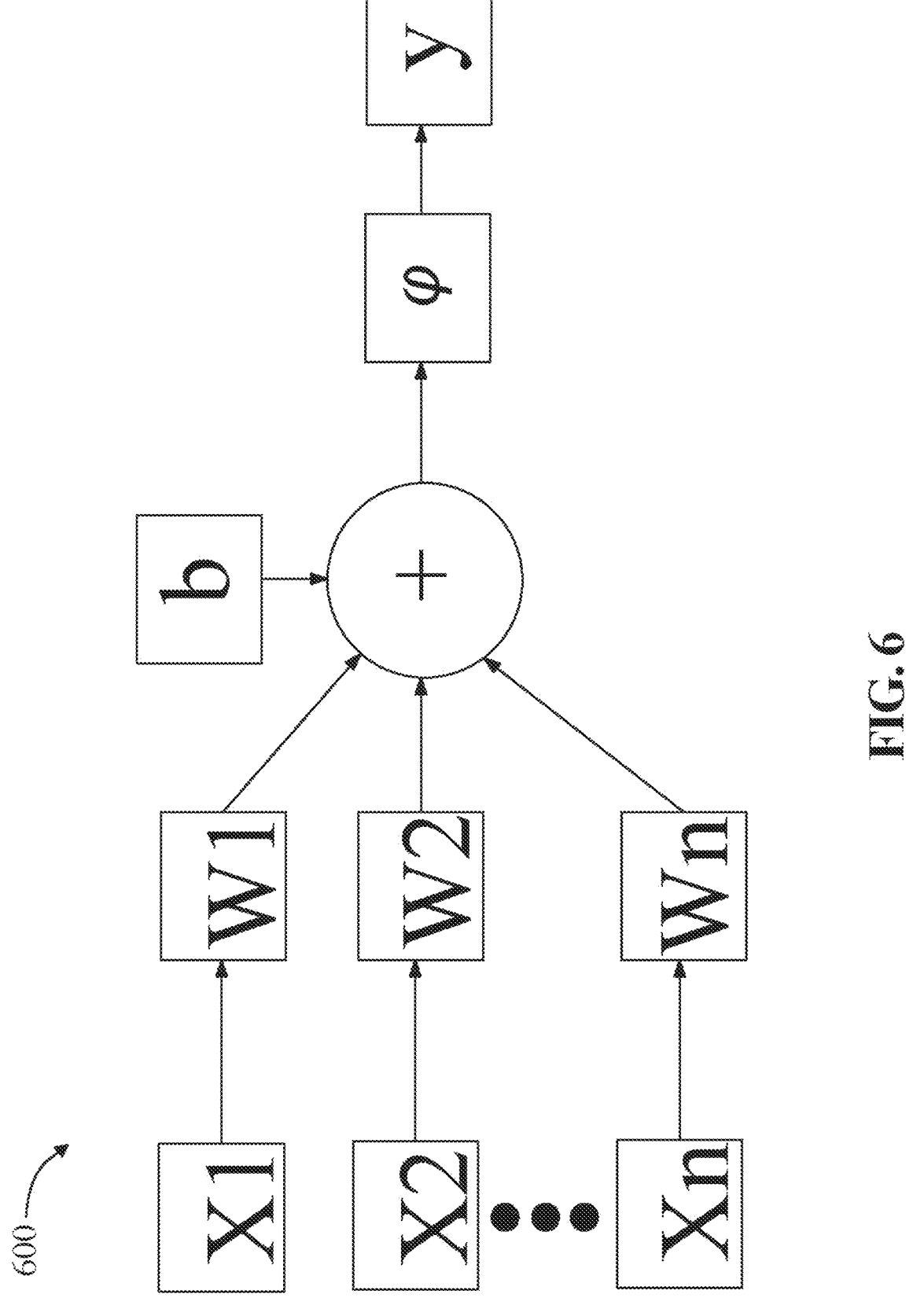
FIG. 6 illustrates a block diagram of an exemplary node in a neural network.

Referring now to FIG. 6, an exemplary embodiment of a node 600 of a neural network is illustrated. A node may include, without limitation, a plurality of inputs $x_i$ that may receive numerical values from inputs to a neural network containing the node and/or from other nodes. Node may perform one or more activation functions to produce its output given one or more inputs, such as without limitation computing a binary step function comparing an input to a threshold value and outputting either a logic 1 or logic 0 output or something equivalent, a linear activation function whereby an output is directly proportional to the input, and/or a non-linear activation function, wherein the output is not proportional to the input. Non-linear activation functions may include, without limitation, a sigmoid function of the form $$f(x) = \frac{1}{1 - e^{-x}}$$

given input x, a tanh (hyperbolic tangent) function, of the form $$\frac{e^x - e^{-x}}{e^x + e^{-x}},$$

a tanh derivative function such as $f(x)=\tanh^2(x)$, a rectified linear unit function such as $f(x)=\max(0, x)$, a "leaky" and/or "parametric" rectified linear unit function such as $f(x)=\max(ax, x)$ for some a, an exponential linear units function such as $$f(x) = \begin{cases} x \text{ for } x \geq 0 \\ \alpha(e^x - 1) \text{ for } x < 0 \end{cases}$$

for some value of $\alpha$ (this function may be replaced and/or weighted by its own derivative in some embodiments), a softmax function such as $$f(x_i) = \frac{e^x}{\sum_i x_i}$$

where the inputs to an instant layer are $x_i$, a swish function such as $f(x)=x*\text{sigmoid}(x)$, a Gaussian error linear unit function such as $f(x)=a(1+\tanh(\sqrt{2/\pi}(x+bx^r)))$ for some values of a, b, and r, and/or a scaled exponential linear unit function such as $$f(x) = \lambda \begin{cases} \alpha(e^x - 1) \text{ for } x < 0 \\ x \text{ for } x \geq 0 \end{cases}.$$

Fundamentally, there is no limit to the nature of functions of inputs $x_i$ that may be used as activation functions. As a non-limiting and illustrative example, node may perform a weighted sum of inputs using weights $w_i$ that are multiplied by respective inputs $x_i$. Additionally or alternatively, a bias b may be added to the weighted sum of the inputs such that an offset is added to each unit in the neural network layer that is independent of the input to the layer. The weighted sum may then be input into a function $\varphi$, which may generate one or more outputs y. Weight $w_i$ applied to an input $x_i$ may indicate whether the input is "excitatory," indicating that it has strong influence on the one or more outputs y, for instance by the corresponding weight having a large numerical value, and/or a "inhibitory," indicating it has a weak effect influence on the one more inputs y, for instance by the corresponding weight having a small numerical value. The values of weights $w_i$, or of other coefficients and/or parameters of an activation function, may be determined by training a neural network using training data, which may be performed using any suitable process as described above. Each weight in a neural network may, without limitation, be updated and/or tuned, based on an error function J, using a backpropagation updating method, such as:

$$w_{new} = w_{old} - \alpha \frac{dJ}{dw}$$

where $w_{new}$ is the updated weight value, $w_{old}$ is the previous weight value, $\alpha$ is a parameter to set the learning rate, and $$\frac{dJ}{dw}$$

is the partial derivative of with respect to weight w.

Figure 7:
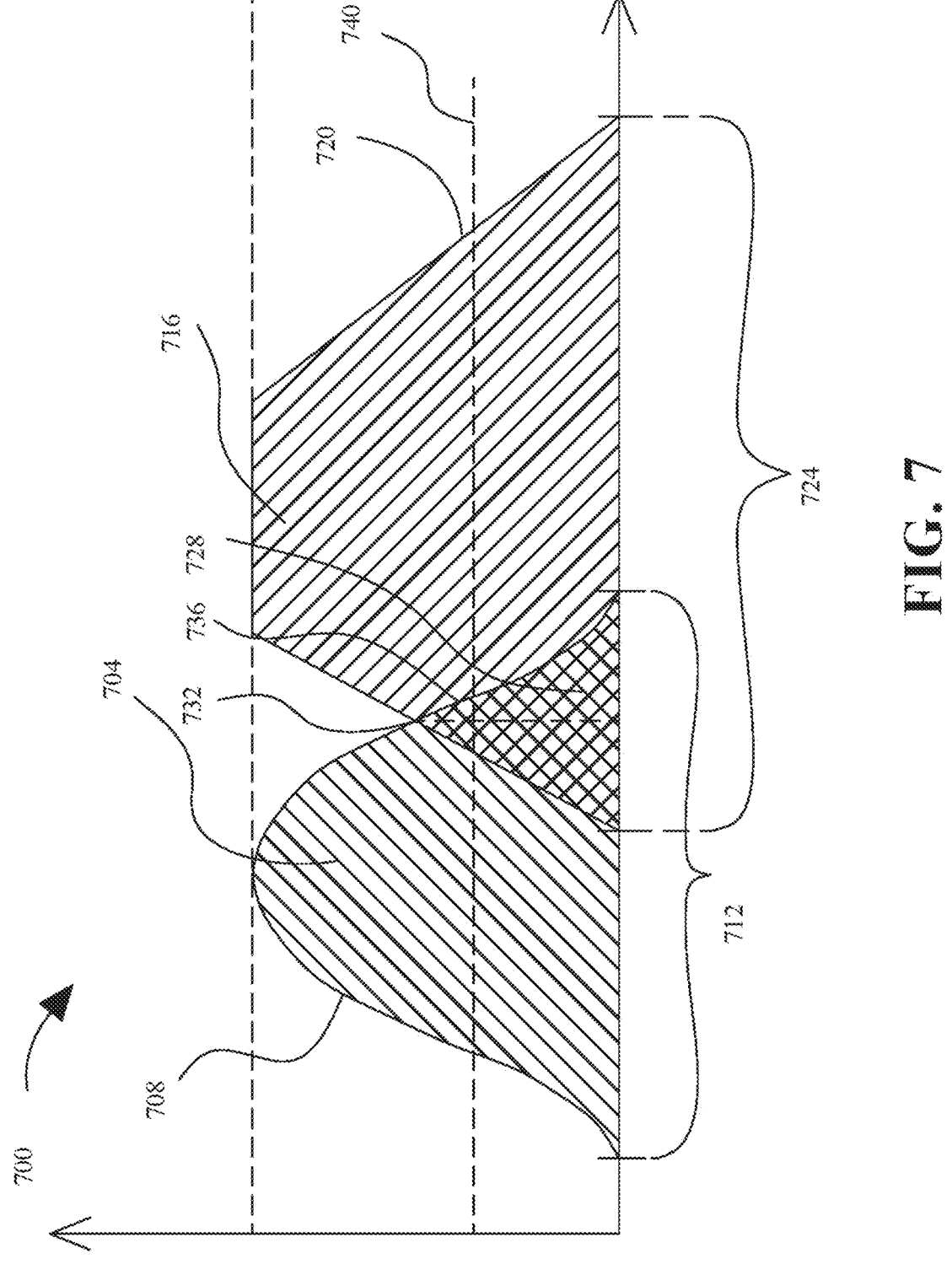
FIG. 7 illustrates an exemplary fuzzy inference system.

Referring to FIG. 7, an exemplary embodiment of fuzzy set comparison 700 is illustrated. A first fuzzy set 704 may be represented, without limitation, according to a first membership function 708 representing a probability that an input falling on a first range 712 of values is a member of the first fuzzy set 704, where the first membership function 708 has values on a range of probabilities such as without limitation the interval [0,1], and an area beneath the first membership function 708 may represent a set of values within first fuzzy set 704. Although first range 712 of values is illustrated for clarity in this exemplary depiction as a range on a single number line or axis, first range 712 of values may be defined on two or more dimensions, representing, for instance, a Cartesian product between a plurality of ranges, curves, axes, spaces, dimensions, or the like. First membership function 708 may include any suitable function mapping first range 712 to a probability interval, including without limitation a triangular function defined by two linear elements such as line segments or planes that intersect at or below the top of the probability interval. As a non-limiting example, triangular membership function may be defined as:

$$y(x, a, b, c) = \begin{cases} 0, \text{ for } x > c \text{ and } x < a \\ \frac{x-a}{b-a}, \text{ for } a \le x < b \\ \frac{c-x}{c-b}, \text{ if } b < x \le c \end{cases}$$

a trapezoidal membership function may be defined as:

$$y(x, a, b, c, d) = \max\left(\min\left(\frac{x-a}{b-a}, 1, \frac{d-x}{d-c}\right), 0\right)$$

a sigmoidal function may be defined as:

$$y(x, a, c) = \frac{1}{1 - e^{-a(x-c)}}$$

a Gaussian membership function may be defined as:

$$y(x, c, \sigma) = e^{-\frac{1}{2}\left(\frac{x-c}{\sigma}\right)^2}$$

and a bell membership function may be defined as:

$$y(x, a, b, c,) = \left[1 + \left|\frac{x-c}{a}\right|^{2b}\right]^{-1}$$

Persons skilled in the art, upon reviewing the entirety of this disclosure, will be aware of various alternative or additional membership functions that may be used consistently with this disclosure.

Still referring to FIG. 7, first fuzzy set 704 may represent any value or combination of values as described above, including output from one or more machine-learning models, internal data, external data and/or data extrapolations, and a predetermined class, such as without limitation of node score A second fuzzy set 716, which may represent any value which may be represented by first fuzzy set 704, may be defined by a second membership function 720 on a second range 724; second range 724 may be identical and/or overlap with first range 712 and/or may be combined with first range via Cartesian product or the like to generate a mapping permitting evaluation overlap of first fuzzy set 704 and second fuzzy set 716. Where first fuzzy set 704 and second fuzzy set 716 have a region 728 that overlaps, first membership function 708 and second membership function 720 may intersect at a point 732 representing a probability, as defined on probability interval, of a match between first fuzzy set 704 and second fuzzy set 716. Alternatively or additionally, a single value of first and/or second fuzzy set may be located at a locus 736 on first range 712 and/or second range 724, where a probability of membership may be taken by evaluation of first membership function 708 and/or second membership function 720 at that range point. A probability at 728 and/or 732 may be compared to a threshold 740 to determine whether a positive match is indicated. Threshold 740 may, in a non-limiting example, represent a degree of match between first fuzzy set 704 and second fuzzy set 716, and/or single values therein with each other or with either set, which is sufficient for purposes of the matching process; for instance, threshold may indicate a sufficient degree of overlap between an output from one or more machine-learning models and/or internal data, external data and/or data extrapolations and a predetermined class, such as without limitation node score categorization, for combination to occur as described above. Alternatively or additionally, each threshold may be tuned by a machine-learning and/or statistical process, for instance and without limitation as described in further detail below.

Further referring to FIG. 7, in an embodiment, a degree of match between fuzzy sets may be used to classify an internal data, external data and/or data extrapolations with node score. For instance, if a node score has a fuzzy set matching internal data, external data and/or data extrapolations fuzzy set by having a degree of overlap exceeding a threshold, processor may classify the internal data, external data and/or data extrapolations as belonging to the node score categorization. Where multiple fuzzy matches are performed, degrees of match for each respective fuzzy set may be computed and aggregated through, for instance, addition, averaging, or the like, to determine an overall degree of match.

Still referring to FIG. 7, in an embodiment, an internal data, external data and/or data extrapolations may be compared to multiple node score categorization fuzzy sets. For instance, internal data, external data and/or data extrapolations may be represented by a fuzzy set that is compared to each of the multiple node score categorization fuzzy sets; and a degree of overlap exceeding a threshold between the internal data, external data and/or data extrapolations fuzzy set and any of the multiple node score categorization fuzzy sets may cause processor to classify the internal data, external data and/or data extrapolations as belonging to node score categorization. For instance, in one embodiment there may be two node score categorization fuzzy sets, representing respectively first node score categorization and a second node score categorization. First node score categorization may have a first fuzzy set; Second node score categorization may have a second fuzzy set; and internal data, external data and/or data extrapolations may have an internal data, external data and/or data extrapolations fuzzy set. processor, for example, may compare an internal data, external data and/or data extrapolations fuzzy set with each of node score categorization fuzzy set and second node score categorization fuzzy set, as described above, and classify internal data, external data and/or data extrapolations to either, both, or neither of node score categorization or second node score categorization. Machine-learning methods as described throughout may, in a non-limiting example, generate coefficients used in fuzzy set equations as described above, such as without limitation x, c, and a of a Gaussian set as described above, as outputs of machine-learning methods. Likewise, internal data, external data and/or data extrapolations may be used indirectly to determine a fuzzy set, as internal data, external data and/or data extrapolations fuzzy set may be derived from outputs of one or more machine-learning models that take the internal data, external data and/or data extrapolations directly or indirectly as inputs.

Still referring to FIG. 7, a computing device may use a logic comparison program, such as, but not limited to, a fuzzy logic model to determine a node score response. An node score response may include, but is not limited to, Satisfied, Poor, Moderate, Great, and the like; each such node score response may be represented as a value for a linguistic variable representing node score response or in other words a fuzzy set as described above that corresponds to a degree of satisfaction as calculated using any statistical, machine-learning, or other method that may occur to a person skilled in the art upon reviewing the entirety of this disclosure. In other words, a given element of internal data, external data and/or data extrapolations may have a first non-zero value for membership in a first linguistic variable value such as "Poor" and a second non-zero value for membership in a second linguistic variable value such as "Great." In some embodiments, determining a node score categorization may include using a linear regression model. A linear regression model may include a machine learning model. A linear regression model may be configured to map data of internal data, external data and/or data extrapolations, such as degree of satisfaction to one or more node score parameters. A linear regression model may be trained using a machine learning process. A linear regression model may map statistics such as, but not limited to, quality of internal data, external data and/or data extrapolations satisfaction. In some embodiments, determining an node score of internal data, external data and/or data extrapolations may include using a node score classification model. An node score classification model may be configured to input collected data and cluster data to a centroid based on, but not limited to, frequency of appearance, linguistic indicators of quality, and the like. Centroids may include scores assigned to them such that quality of satisfaction of internal data, external data and/or data extrapolations may each be assigned a score. In some embodiments node score classification model may include a K-means clustering model. In some embodiments, node score classification model may include a particle swarm optimization model. In some embodiments, determining the node score of an internal data, external data and/or data extrapolations may include using a fuzzy inference engine. A fuzzy inference engine may be configured to map one or more internal data, external data and/or data extrapolations data elements using fuzzy logic. In some embodiments, internal data, external data and/or data extrapolations may be arranged by a logic comparison program into node score arrangement. An "node score arrangement" as used in this disclosure is any grouping of objects and/or data based on skill level and/or output score. This step may be implemented as described above in FIGS. 1-6. Membership function coefficients and/or constants as described above may be tuned according to classification and/or clustering algorithms. For instance, and without limitation, a clustering algorithm may determine a Gaussian or other distribution of questions about a centroid corresponding to a given satisfaction level, and an iterative or other method may be used to find a membership function, for any membership function type as described above, that minimizes an average error from the statistically determined distribution, such that, for instance, a triangular or Gaussian membership function about a centroid representing a center of the distribution that most closely matches the distribution. Error functions to be minimized, and/or methods of minimization, may be performed without limitation according to any error function and/or error function minimization process and/or method as described in this disclosure.

Further referring to FIG. 7, an inference engine may be implemented according to input and/or output membership functions and/or linguistic variables. For instance, a first linguistic variable may represent a first measurable value pertaining to internal data, external data and/or data extrapolations, such as a degree of satisfaction of an element, while a second membership function may indicate a degree of in node score of a subject thereof, or another measurable value pertaining to internal data, external data and/or data extrapolations. Continuing the example, an output linguistic variable may represent, without limitation, a score value. An inference engine may combine rules, such as: "if the satisfaction level is 'low' and the quality level is 'low', the question score is 'Poor'"—the degree to which a given input function membership matches a given rule may be determined by a triangular norm or "T-norm" of the rule or output membership function with the input membership function, such as min(a, b), product of a and b, drastic product of a and b, Hamacher product of a and b, or the like, satisfying the rules of commutativity ($T(a, b)=T(b, a)$), monotonicity: ($T(a, b) \leq T(c, d)$ if $a \leq c$ and $b \leq d$), (associativity: $T(a, T(b, c))=T(T(a, b), c)$), and the requirement that the number 1 acts as an identity element. Combinations of rules ("and" or "or" combination of rule membership determinations) may be performed using any T-conorm, as represented by an inverted T symbol or "$\perp$," such as max(a, b), probabilistic sum of a and b ($a+b-a*b$), bounded sum, and/or drastic T-conorm; any T-conorm may be used that satisfies the properties of commutativity: $\perp(a, b)=\perp(b, a)$, monotonicity: $\perp(a, b) \leq \perp(c, d)$ if $a \leq c$ and $b \leq d$, associativity: $\perp(a, \perp(b, c))=\perp(\perp(a, b), c)$, and identity element of 0. Alternatively or additionally T-conorm may be approximated by sum, as in a "product-sum" inference engine in which T-norm is product and T-conorm is sum. A final output score or other fuzzy inference output may be determined from an output membership function as described above using any suitable defuzzification process, including without limitation Mean of Max defuzzification, Centroid of Area/Center of Gravity defuzzification, Center Average defuzzification, Bisector of Area defuzzification, or the like. Alternatively or additionally, output rules may be replaced with functions according to the Takagi-Sugeno-King (TSK) fuzzy model.

Further referring to FIG. 7, internal data, external data and/or data extrapolations to be used may be selected by user selection, and/or by selection of a distribution of output scores, such as 70% Great, 40% Moderate, and 70% Poor levels or the like. Each node score categorization may be selected using an additional function as described above.

Figure 8:
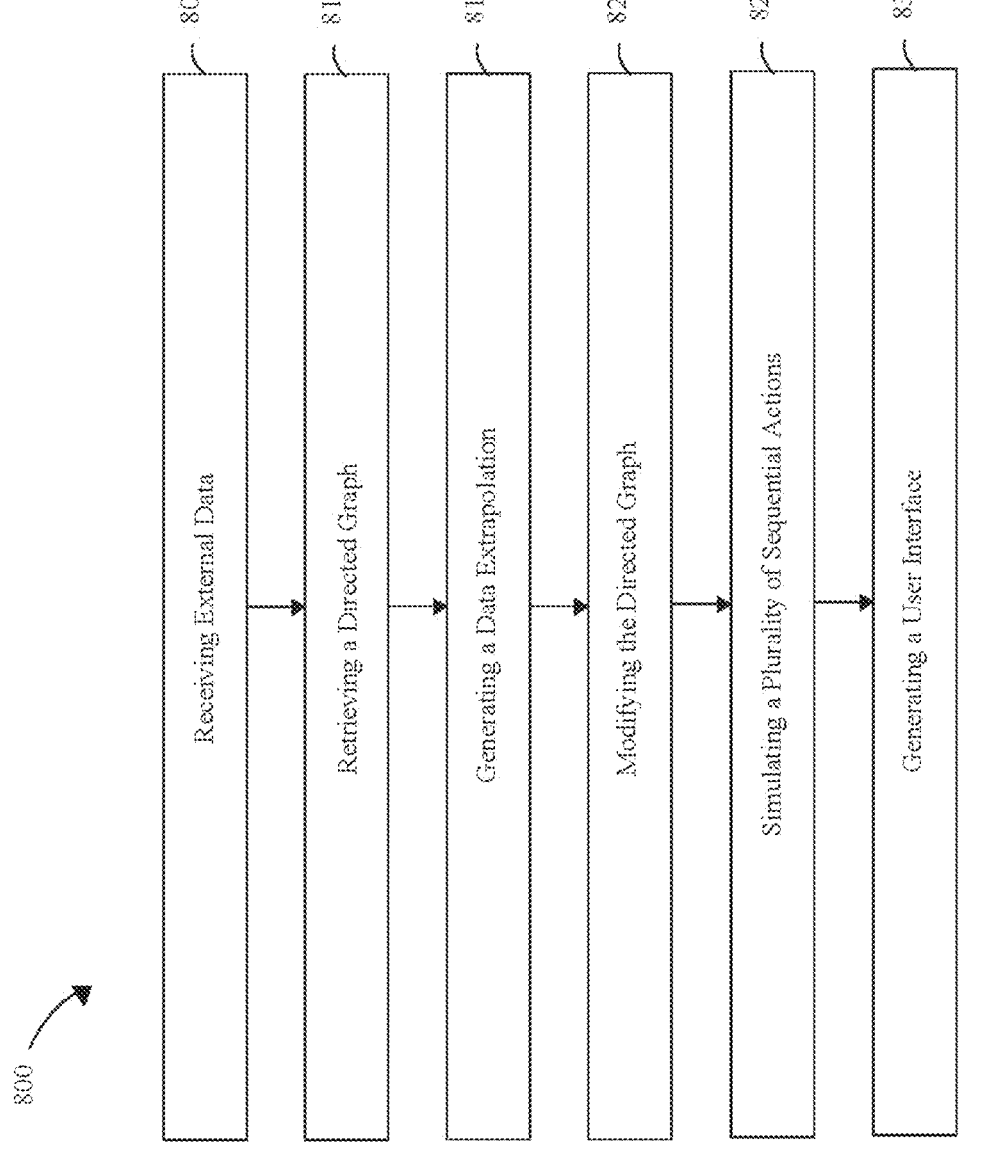
FIG. 8 illustrates a flow diagram of an exemplary method for directed graph modification and simulation based on external data.

Referring now to FIG. 8, a flow diagram of an exemplary method 800 for directed graph modification and simulation based on external data is illustrated. Method 800 contains a step 805 of receiving, using at least a processor, external data from one or more external data sources, wherein the external data includes structured and unstructured data. This may be implemented as reference to FIGS. 1-7.

With continued reference to FIG. 8, method 800 contains a step 810 of retrieving, using at least a processor, a directed graph including at least two internal nodes and at least one internal directed edge, wherein each internal node represents internal data and the at least one internal directed edge represents a relationship between the at least two internal nodes. This may be implemented as reference to FIGS. 1-7.

With continued reference to FIG. 8, method 800 contains a step 815 of generating, using at least a processor, a data extrapolation of external data as a function of at least a part of at least two internal nodes and at least one internal directed edge. In some embodiments, generating the data extrapolation may include generating the data extrapolation using an extrapolation machine-learning model that has been trained on one or more extrapolation training datasets including exemplary external data and exemplary internal data correlated to exemplary data extrapolations. In some embodiments, generating the data extrapolation may include identifying one or more external data features of the external data, identifying one or more internal data features of the internal data and determining at least one internal node related to the external data as a function of the one or more external data features and the one or more internal data features. These may be implemented as reference to FIGS. 1-7.

With continued reference to FIG. 8, method 800 contains a step 820 of modifying, using at least a processor, a directed graph as a function of a data extrapolation, wherein modifying the directed graph includes generating at least one external node representing external data and generating at least one external directed edge connecting the at least one external node and at least one of the at least two internal nodes as a function of the data extrapolation. In some embodiments, modifying the directed graph may include modifying the at least one internal directed edge between the at least two internal nodes as a function of the at least one external node and the at least one external directed edge. In some embodiments, modifying the directed graph may include determining a function datum of the data extrapolation as a function of a correspondence between the external data and at least a part of the at least two internal nodes and the at least one internal directed edge, and generating the at least one external directed edge as a function of the function datum. In some embodiments, determining the function datum may include converting the external data to an external embedding, converting the internal data to an internal embedding, and generating the function score of the function datum as a function of a similarity distance between the external embedding and the internal embedding. In some embodiments, modifying the directed graph may include determining a weighted value of the at least one external node as a function of the function score, and generating a visual representation of the at least one external node as a function of the weighted value. In some embodiments, modifying the directed graph may include generating an action datum of the data extrapolation as a function of the external data and the internal data of the at least two internal nodes, and generating the at least one external node as a function of the action datum. In some embodiments, determining the action datum may include generating an actionable prompt as a function of the action datum, and transmitting the actionable prompt to a downstream device. These may be implemented as reference to FIGS. 1-7.

With continued reference to FIG. 8, method 800 contains a step 825 of simulating, using at least a processor, a plurality of sequential actions as a function of a data extrapolation and a modified directed graph, wherein simulating the plurality of sequential actions includes identifying an action among the plurality of sequential actions that has a highest function score on the directed graph based on a simulated outcome of the plurality of sequential actions. These may be implemented as reference to FIGS. 1-7.

With continued reference to FIG. 8, method 800 contains a step 830 of generating, using at least a processor, a user interface including an action that has a highest function score. In some embodiments, generating the user interface may include generating the user interface including a function heatmap including a visual representation of the modified directed graph, wherein each node of the modified directed graph is rendered with a visual intensity based on the function score. These may be implemented as reference to FIGS. 1-7.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 9:
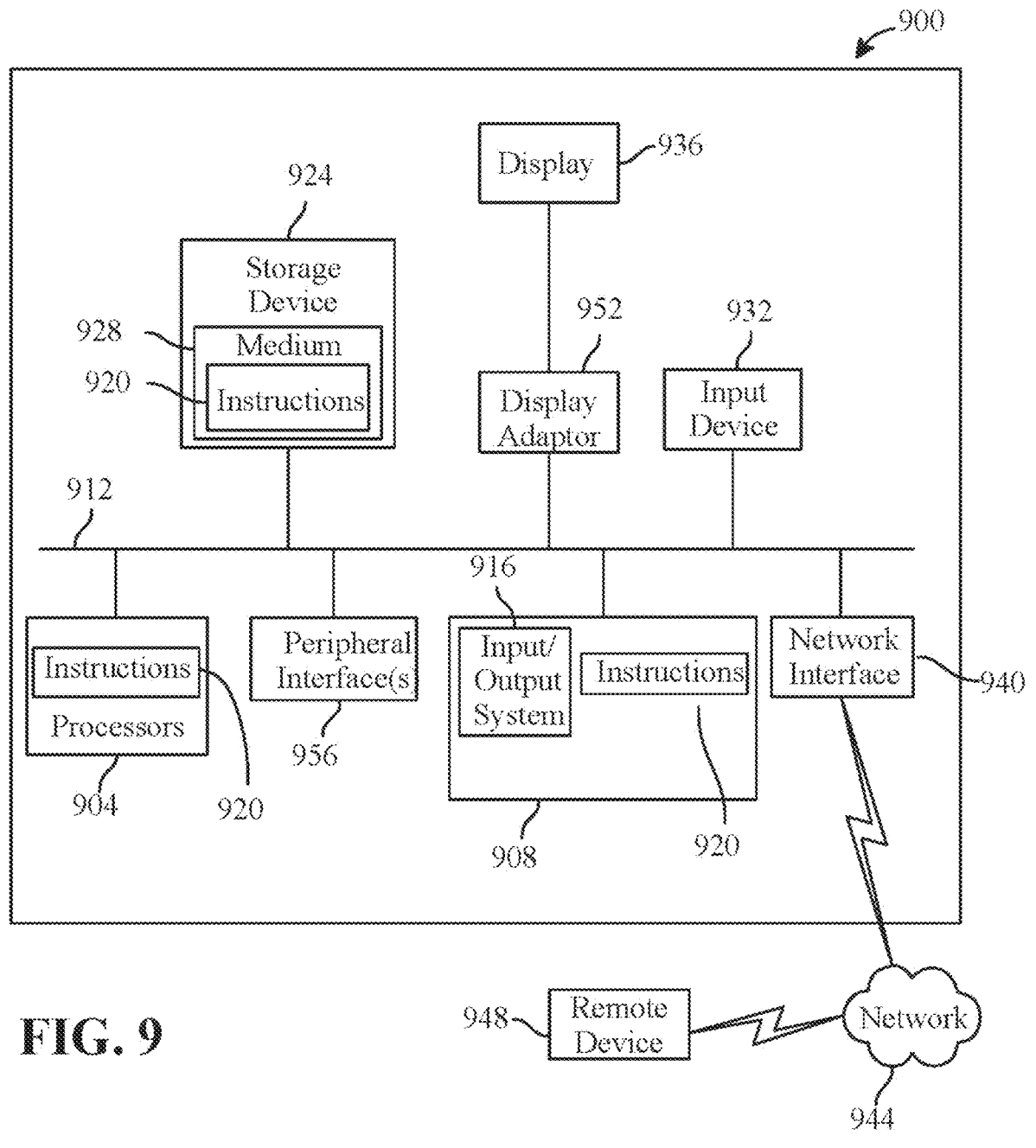
FIG. 9 illustrates a block diagram of a computing system that can be used to implement any one or more of the methodologies disclosed herein and any one or more portions thereof.

FIG. 9 shows a diagrammatic representation of one embodiment of a computing device in the exemplary form of a computer system 900 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 900 includes a processor 904 and a memory 908 that communicate with each other, and with other components, via a bus 912. Bus 912 may include any of several types of bus structures including, but not limited to, a memory bus, a memory controller, a peripheral bus, a local bus, and any combinations thereof, using any of a variety of bus architectures.

Processor 904 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 904 may be organized according to Von Neumann and/or Harvard architecture as a non-limiting example. Processor 904 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), system on module (SOM), and/or system on a chip (SoC). Each processor and/or processor core may perform a state transition, instruction, and/or instruction step during a period of a "clock," or a regular oscillator that generates periodic output waveform, such as a square wave, having a regular period; different processors and/or cores may have distinct clocks. A processor may operate as and/or include a processing unit that performs instruction inputs, arithmetic operations, logical operations, memory retrieval operations, memory allocation operations, and/or input and output operations; a control circuit or module within a processor may determine which of the above-described functions a processor and/or unit within a processor will perform on a given clock cycle. A processor may include a plurality of processing units or "cores," each of which performs the above-described actions; multiple cores may work on disparate instruction sets and/or may work in parallel. A single core may also include multiple arithmetic, logic, or other units that can work in parallel with each other. Parallel computing between and/or within processors and/or cores may include multithreading processes and/or protocols such as without limitation Tomasulpo's algorithm. As used in this disclosure, "a processor," and/or "configuring a processor," is equivalent for the purposes of this disclosure to at least a processor, a plurality of processors, and/or a plurality of processor cores, and/or programming at least a processor, a plurality of processors, and/or a plurality of processor cores, which may be configured to operate on instructions in parallel and/or sequentially according to multithreading algorithms, parallel computing, load and/or task balancing, and/or virtualization, for instance and without limitation as described below.

Memory 908 may include various components (e.g., machine-readable media) including, but not limited to, a random-access memory component, a read only component, and any combinations thereof. In one example, a basic input/output system 916 (BIOS), including basic routines that help to transfer information between elements within computer system 900, such as during start-up, may be stored in memory 908. Memory 908 may also include (e.g., stored on one or more machine-readable media) instructions (e.g., software) 920 embodying any one or more of the aspects and/or methodologies of the present disclosure. In another example, memory 908 may further include any number of program modules including, but not limited to, an operating system, one or more application programs, other program modules, program data, and any combinations thereof. Memory 908 may include a primary memory and a secondary memory. "Primary memory," which may be implemented, without limitation as "random access memory" (RAM), is memory used for temporarily storing data for active use by a processor. In one or more embodiments, during use of the computing device, instructions and/or information may be transmitted to primary memory wherein information may be processed. In one or more embodiments, information may only be populated within primary memory while a particular software is running. In one or more embodiments, information within primary memory is wiped and/or removed after the computing device has been turned off and/or use of a software has been terminated. In one or more embodiments, primary memory may be referred to as "Volatile memory" wherein the volatile memory only holds information while data is being used and/or processed. In one or more embodiments, volatile memory may lose information after a loss of power.

Computer system 900 may also include a storage device 924. Examples of a storage device (e.g., storage device 924) include, but are not limited to, a hard disk drive, a magnetic disk drive, an optical disc drive in combination with an optical medium, a solid-state memory device, and any combinations thereof. Storage device 924 may be connected to bus 912 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 924 (or one or more components thereof) may be removably interfaced with computer system 900 (e.g., via an external port connector (not shown)). Particularly, storage device 924 and an associated machine-readable medium 928 may provide nonvolatile and/or volatile storage of machine-readable instructions, data structures, program modules, and/or other data for computer system 900. In some embodiments, storage device 924 and/or devices "Secondary memory" also known as "storage," "hard disk drive" and the like for the purposes of this disclosure is a long-term storage device in which an operating system and other information is stored; operating system and/or main program instructions may alternatively or additionally be stored in hard-coded memory ROM, or the like. In one or more remote embodiments, information may be retrieved from secondary memory and copied to primary memory during use. In one or more embodiments, secondary memory may be referred to as non-volatile memory wherein information is preserved even during a loss of power. In some embodiments, data from secondary memory is transferred to primary memory before being accessed by a processor. In one or more embodiments, data is transferred from secondary to primary memory wherein circuitry may access the information from primary memory. In one example, software 920 may reside, completely or partially, within machine-readable medium 928. In another example, software 920 may reside, completely or partially, within processor 904.

Computer system 900 may also include an input device 932. In one example, a user of computer system 900 may enter commands and/or other information into computer system 900 via input device 932. Examples of an input device 932 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 932 may be interfaced to bus 912 via any of a variety of interfaces (not shown) including, but not limited to, a serial interface, a parallel interface, a game port, a USB interface, a FIRE-WIRE interface, a direct interface to bus 912, and any combinations thereof. Input device 932 may include a touch screen interface that may be a part of or separate from display 936, discussed further below. Input device 932 may be utilized as a user selection device for selecting one or more graphical representations in a graphical interface as described above.

A user may also input commands and/or other information to computer system 900 via storage device 924 (e.g., a removable disk drive, a flash drive, etc.) and/or network interface device 940. A network interface device, such as network interface device 940, may be utilized for connecting computer system 900 to one or more of a variety of networks, such as network 944, and one or more remote devices 948 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 944, may employ a wired and/or a wireless mode of communication. In general, any network topology may be used. Information (e.g., data, software 920, etc.) may be communicated to and/or from computer system 900 via network interface device 940.

Computer system 900 may further include a video display adapter 952 for communicating a displayable image to a display device, such as display 936. Examples of a display device include, but are not limited to, a liquid crystal display (LCD), a cathode ray tube (CRT), a plasma display, a light emitting diode (LED) display, and any combinations thereof. Display adapter 952 and display 936 may be utilized in combination with processor 904 to provide graphical representations of aspects of the present disclosure. In addition to a display device, computer system 900 may include one or more other peripheral output devices including, but not limited to, an audio speaker, a printer, and any combinations thereof. Such peripheral output devices may be connected to bus 912 via a peripheral interface 956. Examples of a peripheral interface include, but are not limited to, a serial port, a USB connection, a FIREWIRE connection, a parallel connection, and any combinations thereof.

Further referring to FIG. 9, a computing device may include any computing device as described in this disclosure, including without limitation a microcontroller, microprocessor, digital signal processor (DSP) and/or system on a chip (SoC) as described in this disclosure. A computing device may include, be included in, and/or communicate with a mobile device such as a mobile telephone or smartphone. A computing device may include a single device having components as described above operating independently or may include two or more such devices and/or components thereof operating in concert, in parallel, sequentially or the like; two or more devices, processors, memory elements, and the like may be included together in a single computing device or in two or more computing devices. A computing device may interface or communicate with one or more additional devices as described below in further detail via a network interface device.

In some embodiments, and still referring to FIG. 9, a computing device may be a component of a combination of at least a computing device; at least a computing device may include, as a non-limiting example, a first computing device or cluster of computing devices in a first location and a second computing device or cluster of computing devices in a second location. At least a computing device may include one or more computing devices dedicated to data storage, security, distribution of traffic for load balancing, and the like. At least a computing device may distribute one or more computing tasks as described below across a plurality of computing devices of computing device, which may operate in parallel, in series, redundantly, or in any other manner used for distribution of tasks or memory between computing devices. At least a computing device may be implemented, as a non-limiting example, using a "shared nothing" architecture.

With continued reference to FIG. 9, one or more programs or software instructions may include a principal program and/or operating system; principal program and/or operating system may be a program that runs automatically upon startup of a computing device and manages computer hardware and software resources. Principal program and/or operating system may include "startup," "loop," and/or "main" programs on a microcontroller; such programs may initialize hardware resources and subsequently iterate through a series of instructions to make function calls, read in data at input ports, output data at output ports, and process interrupts caused by asynchronous data inputs or the like. Principal program and/or operating system may include, without limitation, an operating system, which may schedule program tasks to be implemented by one or more processors, act as an intermediary between one or more programs and inputs, outputs, hardware and/or memory. Examples of operating systems include without limitation Unix, Linux, Microsoft Windows, Android, Disc Operating System (DOS) and the like. Operating systems may include, without limitation, multi-computer operating systems that run across multiple computing devices, real-time operating systems, and hypervisors. A "hypervisor," as used in this disclosure, is an operating system that runs a virtual machine and/or container, where virtual machines and/or containers create virtual interfaces for programs that mimic the behavior of hardware elements such as processors and/or memory; interactions with such virtual interfaces appear, to programs executed on virtual machines, to function as interactions with physical hardware, while in reality the hypervisor and/or programs such as containers (1) receive inputs from programs to the virtual resources and allocate such inputs to physical hardware that is not directly accessible to the programs, and (2) receive outputs from physical hardware and transmit such outputs to the programs in the form of apparent outputs from the virtual hardware. In some cases, one or more of computing system 900, processor 904, and memory 908 may be virtualized; that is, a virtual machine and/or container may interact directly with such computing system 900, processor 904, and/or memory 908, while managing communications therefrom and thereto via a virtual interface with programs. Computer virtualization may include dividing, or augmenting computing resources into a virtual machine, operating system, processor, and/or container. Virtualization of computer resources may be implemented through use of (1) multiple components, or portions thereof, working in concert, as if they were one unified (virtual) component; and/or (2) a portion of one or more components working as though it were a complete (virtual) component. For instance, where processor 904 comprises a plurality of processors and/or processor cores, virtualization may, in some cases, simulate or emulate a single (virtual) processor whose functions are allocated to one or more of the plurality of processors and/or processor cores. In this case, while processor 904 may be said to be virtualized, the processor 904, nevertheless, comprises actual hardware processor(s) or portion(s) thereof. Accordingly, in this disclosure, where a processor is said to perform instructions, such processor may comprise a virtualized processor, comprising a plurality or portion of hardware processors. Likewise, in this disclosure, where a memory is said to contain (i.e., store) instructions, such memory may comprise a virtualized memory, comprising a plurality or portion of memories. Technologies that enable such virtualization include (1) QEMU; (2) VMware by Broadcom Inc of Palo Alto, California; (3) VirtualBox by Oracle Corporation headquartered in Austin, Texas; and (4) kernel-based virtual machine (KVM).

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and apparatuses according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method for directed graph modification and simulation based on external data, the method comprising:
receiving, using at least a processor, external data from one or more external data sources, wherein the external data comprises structured and unstructured data;
retrieving, using the at least a processor, a directed graph comprising at least two internal nodes and at least one internal directed edge, wherein each internal node represents internal data and the at least one internal directed edge represents a relationship between the at least two internal nodes;
generating, using the at least a processor, a data extrapolation of the external data as a function of at least a part of the at least two internal nodes and the at least one internal directed edge;
constructing a decision tree as a function of the internal data, external data and the data extrapolation;
modifying, using the at least a processor, the directed graph as a function of the data extrapolation, wherein modifying the directed graph comprises:
generating at least one external node representing the external data; and
generating at least one external directed edge connecting the at least one external node and at least one of the at least two internal nodes as a function of the data extrapolation;
simulating, using the at least a processor, a plurality of sequential actions as a function of the data extrapolation and the modified directed graph, wherein simulating the plurality of sequential actions comprises identifying an action among the plurality of sequential actions that has a highest function score on the directed graph based on a simulated outcome of the plurality of sequential actions, wherein each node associated with the decision tree is associated with at least one of: a decision point and a state transition and each edge associated with the decision tree is associated with an action of the plurality of sequential actions and wherein the processor is further configured, using a decision-tree-based simulation engine, to:
evaluate a change in one or more graph-related metrics,
in response to the evaluate a change, identify the action that has a highest function score in order to predict a downstream impact; and
generating, using the at least a processor, a user interface comprising the action that has the highest function score.

2. The method of claim 1, wherein modifying the directed graph comprises modifying the at least one internal directed edge between the at least two internal nodes as a function of the at least one external node and the at least one external directed edge.

3. The method of claim 1, wherein modifying the directed graph comprises:
determining a function datum of the data extrapolation as a function of a correspondence between the external data and at least a part of the at least two internal nodes and the at least one internal directed edge; and
generating the at least one external directed edge as a function of the function datum.

4. The method of claim 3, wherein determining the function datum comprises:
converting the external data to an external embedding;
converting the internal data to an internal embedding; and
generating the function score of the function datum as a function of a similarity distance between the external embedding and the internal embedding.

5. The method of claim 4, wherein modifying the directed graph comprises:
determining a weighted value of the at least one external node as a function of the function score; and
generating a visual representation of the at least one external node as a function of the weighted value.

6. The method of claim 3, wherein generating the user interface comprises generating the user interface comprising a function heatmap comprising a visual representation of the modified directed graph, wherein each node of the modified directed graph is rendered with a visual intensity based on the function score.

7. The method of claim 1, wherein modifying the directed graph comprises:
   generating an action datum of the data extrapolation as a function of the external data and the internal data of the at least two internal nodes; and
   generating the at least one external node as a function of the action datum.

8. The method of claim 7, wherein determining the action datum comprises:
   generating an actionable prompt as a function of the action datum; and
   transmitting the actionable prompt to a downstream device.

9. The method of claim 1, wherein generating the data extrapolation comprises generating the data extrapolation using an extrapolation machine-learning model that has been trained on one or more extrapolation training datasets comprising exemplary external data and exemplary internal data correlated to exemplary data extrapolations.

10. The method of claim 1, wherein generating the data extrapolation comprises:
   identifying one or more external data features of the external data;
   identifying one or more internal data features of the internal data; and
   determining at least one internal node related to the external data as a function of the one or more external data features and the one or more internal data features.

11. An apparatus for directed graph modification and simulation based on external data, the apparatus comprising:
   at least a processor; and
   a memory communicatively connected to the at least a processor, wherein the memory contains instructions configuring the at least a processor to:
      receive external data from one or more external data sources, wherein the external data comprises structured and unstructured data;
      retrieve a directed graph comprising at least two internal nodes and at least one internal directed edge, wherein each internal node represents internal data and the at least one internal directed edge represents a relationship between the at least two internal nodes;
      generate a data extrapolation of the external data as a function of at least a part of the at least two internal nodes and the at least one internal directed edge;
      modify the directed graph as a function of the data extrapolation, wherein modifying the directed graph comprises:
         generating at least one external node representing the external data; and
         generating at least one external directed edge connecting the at least one external node and at least one of the at least two internal nodes as a function of the data extrapolation; and
         constructing a decision tree as a function of the internal data, external data and the data extrapolation;
      simulate a plurality of sequential actions as a function of the modified directed graph, wherein simulating the plurality of sequential actions comprises identifying an action among the plurality of sequential actions that has a highest function score within the modified directed graph based on a simulated outcome of the plurality of sequential actions, wherein each node associated with the decision tree is associated with at least one of: a decision point and a state transition and each edge associated with the decision tree is associated with an action of the plurality of sequential actions and wherein the processor is further configured, using a decision-tree-based simulation engine, to:
      evaluate a change in one or more graph-related metrics,
      in response to the evaluate a change, identify the action that has a highest function score in order to predict a downstream impact; and
   generate a user interface comprising the modified directed graph and the action that has the highest function score.

12. The apparatus of claim 11, wherein modifying the directed graph comprises modifying the at least one internal directed edge between the at least two internal nodes as a function of the at least one external node and the at least one external directed edge.

13. The apparatus of claim 11, wherein modifying the directed graph comprises:
   determining a function datum of the data extrapolation as a function of a correspondence between the external data and at least a part of the at least two internal nodes and the at least one internal directed edge; and
   generating the at least one external directed edge as a function of the function datum.

14. The apparatus of claim 13, wherein determining the function datum comprises:
   converting the external data to an external embedding;
   converting the internal data to an internal embedding; and
   generating the function score of the function datum as a function of a similarity distance between the external embedding and the internal embedding.

15. The apparatus of claim 14, wherein modifying the directed graph comprises:
   determining a weighted value of the at least one external node as a function of the function score; and
   generating a visual representation of the at least one external node as a function of the weighted value.

16. The apparatus of claim 13, wherein generating the user interface comprises generating the user interface comprising a function heatmap comprising a visual representation of the modified directed graph, wherein each node of the modified directed graph is rendered with a visual intensity based on the function score.

17. The apparatus of claim 11, wherein modifying the directed graph comprises:
   generating an action datum of the data extrapolation as a function of the external data and the internal data of the at least two internal nodes; and
   generating the at least one external node as a function of the action datum.

18. The apparatus of claim 17, wherein determining the action datum comprises:
   generating an actionable prompt as a function of the action datum; and
   transmitting the actionable prompt to a downstream device.

19. The apparatus of claim 11, wherein generating the data extrapolation comprises generating the data extrapolation using an extrapolation machine-learning model that has been trained on one or more extrapolation training datasets comprising exemplary external data and exemplary internal data correlated to exemplary data extrapolations.

20. The apparatus of claim 11, wherein generating the data extrapolation comprises:

identifying one or more external data features of the external data;

identifying one or more internal data features of the internal data; and determining at least one internal node related to the external data as a function of the one or more external data features and the one or more internal data features.

\* \* \* \* \*